(12) United States Patent
Nishimura et al.

(10) Patent No.: US 6,831,294 B1
(45) Date of Patent: Dec. 14, 2004

(54) SEMICONDUCTOR INTEGRATED CIRCUIT DEVICE HAVING BUMP ELECTRODES FOR SIGNAL OR POWER ONLY, AND TESTING PADS THAT ARE NOT COUPLED TO BUMP ELECTRODES

(75) Inventors: Asao Nishimura, Kokubunji (JP); Syouji Syukuri, Koganei (JP); Gorou Kitsukawa, Kisarazu (JP); Toshio Miyamoto, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/869,274

(22) PCT Filed: Jan. 22, 1999

(86) PCT No.: PCT/JP99/00232

§ 371 (c)(1),
(2), (4) Date: Jun. 26, 2001

(87) PCT Pub. No.: WO00/44041

PCT Pub. Date: Jul. 27, 2000

(51) Int. Cl.[7] .......................... H01L 29/04; H01L 31/36
(52) U.S. Cl. ...................... 257/48; 257/50; 257/E21.524
(58) Field of Search ...................... 257/48, 50, E21.521, 257/E21.524; 438/14, 108

(56) References Cited

U.S. PATENT DOCUMENTS

| | | | |
|---|---|---|---|
| 5,110,754 A | * | 5/1992 | Lowrey et al. ............. 438/386 |
| 5,324,681 A | * | 6/1994 | Lowrey et al. ............. 438/600 |
| 5,554,940 A | | 9/1996 | Hubacher |
| 5,719,449 A | * | 2/1998 | Strauss ......................... 257/786 |
| 5,742,555 A | * | 4/1998 | Marr et al. ............... 365/225.7 |
| 6,008,543 A | | 12/1999 | Iwabuchi |
| 6,030,890 A | | 2/2000 | Iwabuchi |
| 6,429,029 B1 | * | 8/2002 | Eldridge et al. .............. 438/14 |
| 6,445,001 B2 | * | 9/2002 | Yoshida ........................ 257/48 |

FOREIGN PATENT DOCUMENTS

| | | |
|---|---|---|
| JP | 4-26537 | 3/1992 |
| JP | 4-96343 | 3/1992 |
| JP | 5-218042 | 8/1993 |
| JP | 8-29451 | 2/1996 |
| JP | 8-64633 | 3/1996 |
| JP | 8-250498 | 9/1996 |
| JP | 8-340029 | 12/1996 |

OTHER PUBLICATIONS

IEEE/CPMT Intl Electronics Manufacturing Technology Symposium, "Impact of Wafer Probe Damage on Flip Chip Yields and Reliability", M. Varnau et al, pp. 293–297.

* cited by examiner

*Primary Examiner*—W. David Coleman
(74) *Attorney, Agent, or Firm*—Mattingly, Stanger & Malur, P.C.

(57) ABSTRACT

In a semiconductor integrated circuit device, testing pads (209b) using a conductive layer, such as relocation wiring layers (205) are provided just above or in the neighborhood of terminals like bonding pads (202b) used only for probe inspection at which bump electrodes (208) are not provided. Similar testing pads may be provided even with respect to terminals like bonding pads provided with bump electrodes. A probe test is executed by using these testing pads or under the combined use of under bump metallurgies antecedent to the formation of the bump electrodes together with the testing pads. According to the above, bump electrodes for pads dedicated for probe testing may not be added owing to the use of the testing pads. Further, the use of testing pads provided in the neighborhood of the terminals like the bonding pads and smaller in size than the under bump metallurgies enables a probe test to be executed after a relocation wiring process.

15 Claims, 38 Drawing Sheets

(FUSE PROGRAM)

(FUSE READOUT)

FIG. 30

LIST OF BONDING OPTION SPECIFICATIONS

| SPECIFICATIONS | INPUT | | | OUTPUT | | | |
|---|---|---|---|---|---|---|---|
| | BOPIN0B | BOPIN1B | BOPIN2B | BNK2B | BPX4 | BPX8 | BPX16 |
| 4Bank / x4 | Floating | VSS | Floating | 'H' | 'H' | 'L' | 'L' |
| 4Bank / x8 | Floating | Floating | Floating | 'H' | 'H' | 'H' | 'L' |
| 4Bank / x16 | Floating | Floating | VSS | 'H' | 'H' | 'H' | 'H' |
| 2Bank / x4 | VSS | VSS | Floating | 'L' | 'H' | 'L' | 'L' |
| 2Bank / x8 | VSS | Floating | Floating | 'L' | 'H' | 'H' | 'L' |
| 2Bank / x16 | VSS | Floating | VSS | 'L' | 'H' | 'H' | 'H' |

FIG. 31

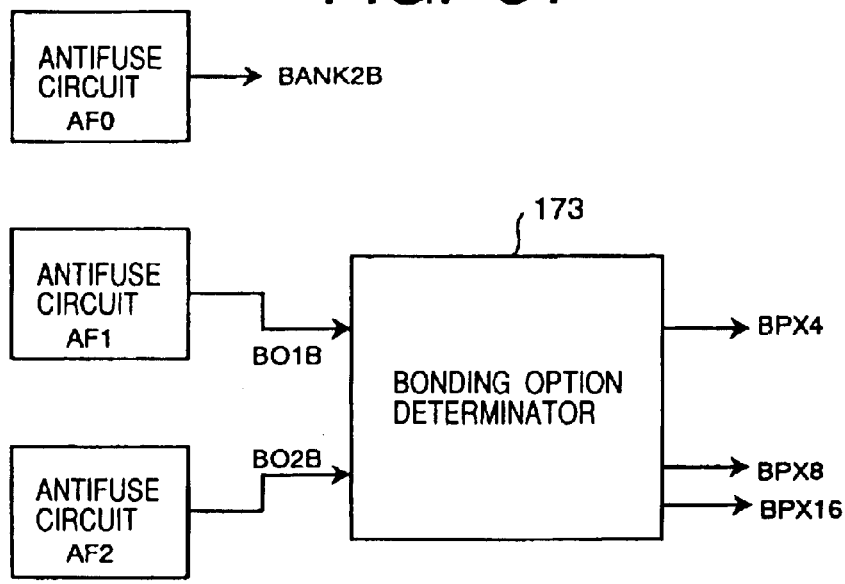

FIG. 32

LIST OF ANTIFUSE OPTION SPECIFICATIONS

| SPECIFICATIONS | STATE OF ANTIFUSE | | | OUTPUT | | | |
|---|---|---|---|---|---|---|---|
| | AF0 | AF1 | AF2 | BNK2B | BPX4 | BPX8 | BPX16 |
| 4Bank / x4 | BREAKDOWN | NON-BREAKDOWN | BREAKDOWN | 'H' | 'H' | 'L' | 'L' |
| 4Bank / x8 | BREAKDOWN | BREAKDOWN | BREAKDOWN | 'H' | 'H' | 'H' | 'L' |
| 4Bank / x16 | BREAKDOWN | BREAKDOWN | NON-BREAKDOWN | 'H' | 'H' | 'H' | 'H' |
| 2Bank / x4 | NON-BREAKDOWN | NON-BREAKDOWN | BREAKDOWN | 'L' | 'H' | 'L' | 'L' |
| 2Bank / x8 | NON-BREAKDOWN | BREAKDOWN | BREAKDOWN | 'L' | 'H' | 'H' | 'L' |
| 2Bank / x16 | NON-BREAKDOWN | BREAKDOWN | NON-BREAKDOWN | 'L' | 'H' | 'H' | 'H' |

FIG. 41
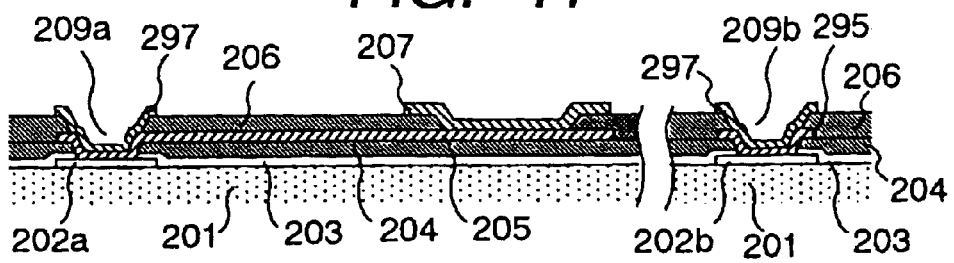
FIG. 42
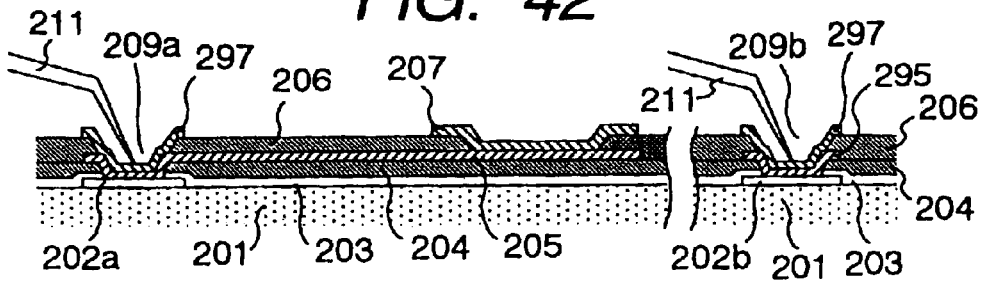
FIG. 43
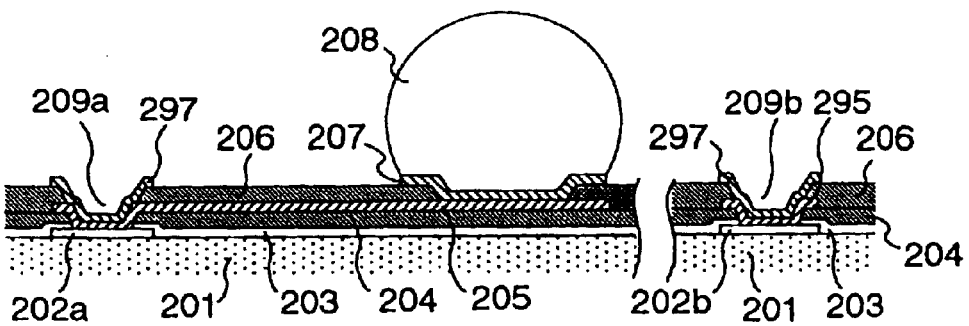
FIG. 44
| CONTENTS | NUMBER OF BONDING PADS | NUMBER OF PACKAGE EXTERNAL TERMINALS |
|---|---|---|
| SIGNAL INPUT/ OUTPUT | 39 | 39 |
| POWER | 24 | 14 |
| FUNCTION SELECTION | 3 | 0 |
| PROBE TEST | 6 | 0 |
| NON-CONNECTION | — | 1 |
| TOTAL | 72 | 54 |

FIG. 53 CONVENTIONAL COMPLETED WAFER
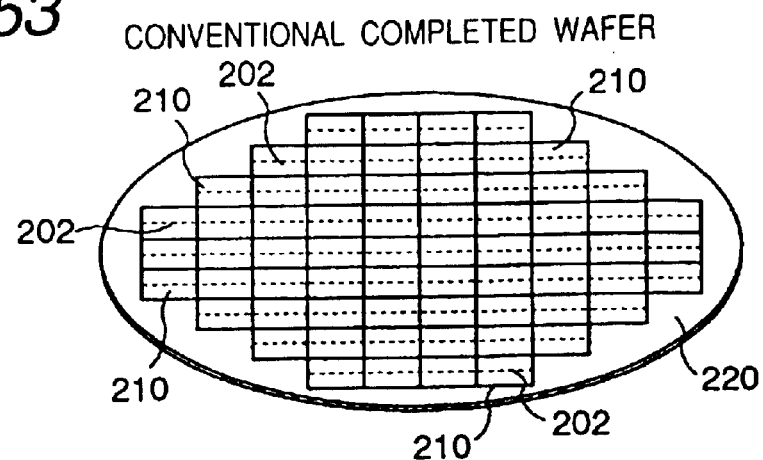
FIG. 54 FORMED STATE OF UNDER BUMP METALS
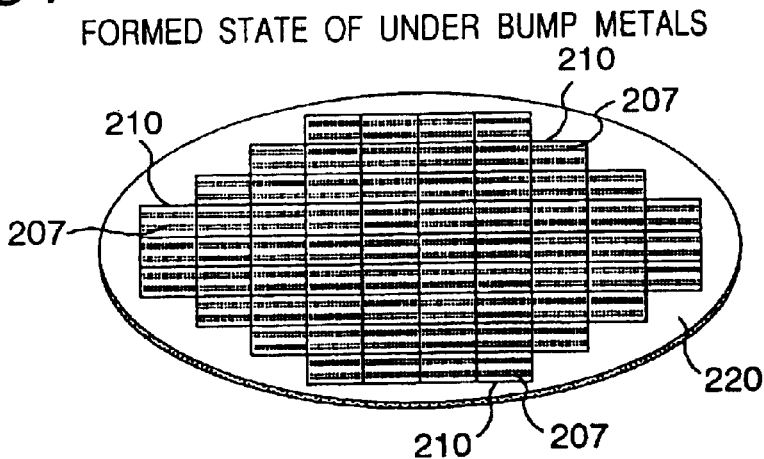
FIG. 55 PROBE INSPECTION PROCESS
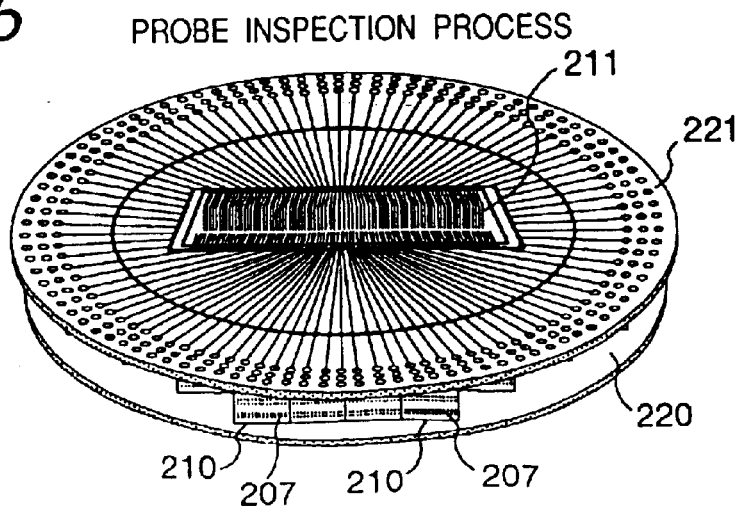

SOLDER BUMP FORMING PROCESS

PIECE CUTTING PROCESS

FIG. 59

PROBE IN RESPECTIVE TESTING PROCESSES,
CONTACT POINTS OF SOCKET OR THE LIKE

| CONTENTS OF TERMINAL | | DEDICATED FOR PROBE TEST | | | SUPPLY OF POWER AND INPUT/OUTPUT OF SIGNAL | | | CORRESPONDING PROCESS FLOW |
|---|---|---|---|---|---|---|---|---|
| CLASSIFICATION OF TEST | | PROBE TEST | BURN-IN | FINAL TEST | PROBE TEST | BURN-IN | FINAL TEST | |
| MODE | 1 | TESTING PAD | NONUSE | NONUSE | TESTING PAD | BUMP | BUMP | a, c |
| | 2 | TESTING PAD | NONUSE | NONUSE | UNDER BUMP METAL | BUMP | BUMP | a, c |
| | 3 | TESTING PAD | NONUSE | NONUSE | TESTING PAD | TESTING PAD | BUMP | a, b, c |
| | 4 | TESTING PAD | NONUSE | NONUSE | UNDER BUMP METAL | UNDER BUMP METAL | BUMP | b |

# SEMICONDUCTOR INTEGRATED CIRCUIT DEVICE HAVING BUMP ELECTRODES FOR SIGNAL OR POWER ONLY, AND TESTING PADS THAT ARE NOT COUPLED TO BUMP ELECTRODES

TECHNICAL FIELD

The present invention relates to a semiconductor integrated circuit device (hereinafter also called simply a "semiconductor integrated circuit"), and specifically to a semiconductor integrated circuit (hereinafter also called simply a "flip-chip type semiconductor integrated circuit") in which protruding electrodes (hereinafter also called simply "bump electrodes") such as solder bumps or the like used for circuit substrate mounting are formed on a semiconductor substrate. The present invention relates particularly to a structure of a flip-chip type semiconductor integrated circuit in which attention has been directed toward a probe test, and a manufacturing method thereof, and relates to, for example, a technology effective for application to a system LSI or the like mixed with a memory and a logical circuit or the like, and a manufacturing method thereof.

Further, the present invention relates to a semiconductor integrated circuit wherein protruding electrodes (hereinafter also called simply "bump electrodes") such as solder bumps or the like for circuit substrate implementation are formed on a semiconductor substrate and program elements each of which permanently or irreversibly changes the function of a predetermined portion of the semiconductor integrated circuit, are installed thereon.

BACKGROUND ART

The following references are known as examples of references each of which has described a semiconductor integrated circuit having bump electrodes used for circuit substrate implementation.

(a) Unexamined Patent Publication Hei 5(1993)-218042, (b) Unexamined Patent Publication Hei 8(1996)-250498 and (c) U.S. Pat. No. 5,547,740 respectively show one basic form of a flip-chip type semiconductor integrated circuit mentioned in the present specification. Namely, the flip-chip type semiconductor integrated circuit is configured as follows. For example, relocation wirings are routed from bonding pads of its chip, bump electrodes respectively connected to the relocation wirings are laid out on the surface of the chip in array form (in area array form), and the bump electrodes arranged in area array form are exposed from a surface protection film. It is thus possible to enlarge the interval between the bump electrodes, facilitate substrate mounting that the bump electrodes are respectively connected to wirings for a printed circuit board and utilize a low-cost printed circuit board in which wiring intervals are wide.

In the flip-chip type semiconductor integrated circuit, the bump electrodes are terminals capable of being directly mounted or implemented on a circuit substrate and are equivalent to external connecting terminals such as lead pins or the like for a package. After the bump electrodes are formed and wafer processes are all completed, only the bump electrodes are exposed and the bonding pads are finally covered with an insulating film or a protection film.

The present inventors have compared the number of the bonding pads in the semiconductor chip with the number of the external terminals (bump electrodes) typified by the lead pins for the package. According to the comparison, bonding pads used only for probe inspection and bonding pads connected to power terminals or the like by a technique for a bonding option are not assigned external terminals dedicated therefor. Thus, when the flip-chip type semiconductor integrated circuit is substituted for the semiconductor integrated circuit, a wafer probe test can be performed through the use of all bonding pads if it is antecedent to the formation of the relocation wirings and bump electrodes. However, it has been found out by the present inventors that there is a fear that when a probe is brought into direct contact with each bonding pad, the bonding pad is endamaged and a failure in connection to each relocation wiring occurs.

Techniques for probe testing are not described in the References (a) through (c) at all. The technology of forming under bump metals or metallurgies on bonding pads after having been subjected to probe testing or inspection, has been described in, for example, (d) Michael J. Varnau: "Impact of Wafer Probe Damage on Flip Chip Yields and Reliability", International Electronics and Manufacturing Technology Symposium (Oct. 23–24, 1996) as a reference in which the relation to the probe inspection has been described. As to the reference described in the paragraph (d), however, there is a possibility that when a probe is applied to one of bonding pads antecedent to a relocation wiring process, the surface of the bonding pad will damage and the reliability of connection to a relocation wiring layer will be degraded, as discussed above by the present inventors. A limitation is imposed on the selection of a relocation wiring material.

Further, the following References are known as to the probe tests performed in the flip-chip type semiconductor integrated circuit.

(e) The technology of applying a probe to each under bump metal or metallurgy (UBM) antecedent to the formation of bump electrodes to perform a probe test has been described in U.S. Pat. No. 5,597,737.

(f) A configuration wherein testing pads are provided so as to adjoin under bump metallurgies and be connected thereto, has been shown in Unexamined Patent Publication No. Hei 8(1996)-64633. The testing pads are respectively provided at the sides of bump electrodes.

(g) Unexamined Patent Publication No. Hei 8(1996)-340029 shows a description related to the invention wherein portions directly above bonding pads at which relocation wiring layers are formed, are exposed and testing pads for probe inspection are formed at their exposed portions.

(h) Unexamined Patent Publication No. Hei 8(1996)-29451 shows a description related to the invention wherein each of pads for probe testing is formed by a relocation wiring layer in the neighborhood of each bonding pad.

The present inventors could obtain the following results by further discussing the technologies described in the References referred to above.

It has been revealed by the present inventors that the technology described in the paragraph (e) also has the possibility that each under solder bump metallurgy will be endamaged at a probe tip in a manner similar to the technology described in the paragraph (d), and has led to degradation in wettability relative to solder and degradation in reliability of connections to each solder bump electrode due to the damage of a barrier metal used for the prevention of solder diffusion.

Further, the under bump metallurgies are placed in area array form in a manner similar to the bump electrodes in the technology described in the paragraph (e). In the technology described in the paragraph (f), the testing pads are also laid out in area array form together with the bump electrodes. Therefore, it has been revealed by the present inventors that each of the technologies described in the References (e) and (f) has a new problem in that it is difficult to apply a normally-used cantilever type probe to under bump metal-lurgies or testing pads arranged in a multiple row, and terminal-dedicated expensive probes disposed in area array form are additionally required.

It has been found out by the present inventors that the Reference described in the paragraph (g) has a problem in that when the size of each bonding pad and the interval between the bonding pads become narrow with high integration of a semiconductor device, the sizes of the testing pads and the interval therebetween become also narrow, and the positioning of each probe and reliable contact thereof fall into difficulties.

It has been revealed by the present inventors that the technology described in the paragraph (h) has the fear that since the area of each testing pad is added to its corresponding relocation wiring layer, the capacitance of a wiring increases and the electrical characteristic of a semiconductor integrated circuit is degraded.

It has been revealed by the present inventors that each of the References described in the paragraphs (f) through (h) is accompanied by a problem that since the testing pads are formed on an inorganic insulating layer or a metal wiring layer, the surface of each testing pad is hard to deform where a hard metal film such as chromium, nickel or the like is used for the testing pads, and hence the contactability with a probe tip is poor, and an expensive probe whose tip is given gold plating and which has adopted a structure capable of obtaining a wide contact area, is required.

Further, as described as the prior arts in the paragraphs (e) through (h), a problem has been revealed that when the probe is applied to the already-formed solder bump, the probe is applied to a curved surface covered with a thick oxide film under a strong load, whereby the bump is apt to deform and the probe per se is easy to undergo damage.

While the aforementioned References have described the flip-chip type semiconductor integrated circuit and the testing pads paired with the bump electrodes in this way, they do not show any description or suggestion that has taken into consideration the fact that the bonding pads used only for probe inspection and the bonding pads or the like connected to the power terminals or the like by the technique for the bonding option are not assigned the external terminals like the lead pins dedicated therefor as firstly discussed by the present inventors. Namely, the prior arts do not lead to the provision of the inventive concept that focused attention on the testing pads dedicated for testing, which are used only for probe testing or inspection and unnecessary at the final product stage. The testing pads always exist so as to pair with the bump electrodes. In other words, signals necessary for testing are set on the precondition that they are capable of being taken from the bump electrodes. Thus, the present inventors have revealed that if the solder bump electrodes are provided even for signal terminals necessary only for testing, then the number of the bump electrodes increases and the layout of the bump electrodes at practical intervals falls into difficulties from the meaning of mounting thereof to a circuit substrate.

An object of the present invention is to provide a semiconductor integrated circuit capable of executing a probe test without damage to pads antecedent to a relocation wiring process and without an increase in the number of bumps, and a manufacturing method thereof.

Another object of the present invention is to provide a semiconductor integrated circuit capable of reducing an increase in capacitance of each wiring, which is caused by the addition of a testing pad, and a manufacturing method thereof.

A further object of the present invention is to provide a semiconductor integrated circuit capable of enhancing contactability of a probe with each of testing pads, and a manufacturing method thereof.

A still further object of the present invention is to provide a semiconductor integrated circuit capable of improving reliability of connections to a printed circuit board and reducing substrate mounting costs because a bump-to-bump interval can be taken wide, and a manufacturing method thereof.

A still further object of the present invention is to provide a semiconductor integrated circuit capable of reducing capacitive loads developed by metallic wirings for laying out protruding electrodes in array form.

The present inventors have discussed even a program element together with the flip-chip type semiconductor integrated circuit. In a semiconductor integrated circuit, the program element is used for relief or the like for substitution of a defective or faulty circuit portion thereof with a redundant circuit. As the program element, a fuse comprised of, for example, a metal film or a polysilicon film is heavily used and programmed by the melting thereof by irradiation with laser light. A program relative to the fuse is executed after the completion of a probe test. In this stage, openings for exposing bonding pads and fuses have been defined in a passivation film on the surface of a wafer. For example, the probe test is carried out by using the bonding pad, for example. The laser light is selectively applied to each fuse in such a manner that the location of a defect is found out upon the probe test and the defective portion is substitutable with a relieving circuit, whereby the program for the fuse is carried out.

An electric fuse is known as another program element. For example, U.S. Pat. No. 5,110,754 has described a technology wherein an antifuse corresponding to a kind of electric fuse is used for defective relief or the like of a DRAM. The antifuse has a configuration capable of being programmed by dielectric breakdown of an oxide film held in an insulating state. Further, U.S. Pat. No. 5,742,555 has shown, as an example of an antifuse, an example in which an oxide film is used to form a capacitor in a p-type well region, and a negative voltage is applied to a well electrode of the capacitor and a positive voltage is applied to a plate electrode on the oxide film to thereby bring a gate oxide film into dielectric breakdown. As other references each having described a semiconductor integrated circuit using an electric fuse, there are known U.S. Pat. No. 5,324,681, etc.

As other program elements, there are known non-volatile storage elements each capable of reversibly changing a programmed state, such as an electrically erasable programmable EEPROM, a flash memory, etc. U.S. Pat. No. 5,742,555 has described a DRAM having such a program element.

The present inventors have discussed the mounting program elements in the flip-chip type semiconductor integrated circuit for the purpose of defective relief, mode setting and trimming.

The firstly-discussed program element is a fuse capable of being blown by laser. A fuse (polysilicon fuse) comprised of a polysilicon film is shaped in rectangular form over an element isolating region provided in a well region on a semiconductor substrate. One end of the fuse is connected to a source region of a selection transistor through metal wirings corresponding to plural layers, whereas the other end thereof is connected to a ground potential through its corresponding metal wiring. After an interlayer dielectric and a passivation film between the metal wirings corresponding to the plural layers are layered over the polysilicon fuse, the layered film is etched to define an irradiation window for the radiation of laser light and finally an insulating film having a thickness of 0.5 µm to 1 µm is left. When the polysilicon fuse configured in this way is blown, the laser light is applied thereto through the insulating film. For example, the width of the polysilicon film, a layout interval, and the width of the irradiation window for applying the laser light are designed so as to take 2 µm, 5 µm an 10 µm respectively. Applying He—Ne laser having an intensity of 1.5 µJ and a spot diameter of 6 µm at this time enables the polysilicon fuse to be blown.

It has however been revealed by the present inventors that the system for blowing the conventional polysilicon fuse by the radiation of laser light has the following problems.

The first problem is that the process of defining the window for applying the laser light therethrough is becoming very difficult. In a so-called system LSI product in which a large-capacity DRAM or the like is mixed with a high-speed logic circuit and an analog circuit, which have recently been progress on rapid market expansion in particular, the logic circuit needs to have metal wiring layers of five layers or more. Thus, since the thickness of the insulating film from the polysilicon fuse to the top passivation film reaches 5 µm or more, it is technically difficult to uniformly effect etching for leaving the insulating film to a thickness of about 0.5 µm at a fuse upper portion on the whole surface of the wafer. When the thickness of the insulating film at the fuse upper portion is left 1 µm or more, the incident intensity of laser light becomes weak and the melting-down or blowing of the fuse becomes insufficient. When the thickness of the insulating film at the fuse upper portion is thinned to 0.5 µm or less, there is in danger of the surface of the fuse being exposed depending on variations in the subsequent process treatment. Thus, the probability of failure occurrence that non-blown fuses will break, becomes high significantly.

The second problem is that the fuse cannot be blown by the conventional radiation of laser light from the viewpoint of the system of the manufacturing process in the flip-chip type semiconductor integrated circuit. In the conventional manufacturing process, a manufacturing process executed within a clean room in a wafer state is completed in a stage in which the formation of the passivation film for preventing moisture from entering an upper portion of each metal wiring layer has been completed. Afterwards, the assembly into a package is done after probe tests and relief have been carried out, followed by execution of the final selection. In the flip-chip type semiconductor integrated circuit on the other hand, the process from the formation of each metal wiring (relocation wiring) similar to a lead frame to the deposition of solder bump electrodes is carried out within the clean room in the wafer state after the formation of the passivation film in order to further reduce the manufacturing cost thereof. When the conventional system for blowing the fuse through the radiation of the laser light is applied to the flip-chip type semiconductor integrated circuit, the deposition and processing of each metal wiring for constituting the relocation wring similar to the lead frame at the upper portion of each blown fuse are performed, thereby resulting in unavoidance of degradation in reliability due to the corrosion of the polysilicon fuse and entrance of moisture from its corroded portion. Thus, the present inventors have found out the need for a system capable of electrically performing some kind of program in the flip-chip type semiconductor integrated circuit as an alternative to the system for blowing the fuse by the radiation of the laser light.

The third problem resides in that the polysilicon fuse needs a relatively large layout area. One fuse needs a layout area of at least $5 \times 10$ µm². This becomes a big factor that determines the upper limit of the number of fuses.

Next, the present inventors have discussed even the adoption of an electrically writable and erasable non-volatile storage element as the program element. According to it, it has been revealed that when the number of the program elements may be low, a chip occupied area taken by peripheral circuits used for electrical writing or the like relatively increases and hence area efficiency becomes disadvantageous.

According to the result of discussions, the present inventors have found out superiority in adoption of the electric fuse such as the antifuse or the like as the program element for the flip-chip type semiconductor integrated circuit. At this time, the present inventors have further revealed that since the application of a voltage for dielectric breakdown to the antifuse is a process necessary only in manufacturing stage of the semiconductor integrated circuit, there is no room to provide dedicated bump electrodes for the purpose of dielectric breakdown under such circumstances that a large number of bump electrodes must be formed with a great increase in the scale of the semiconductor integrated circuit. Further, since the state of stress/distortion developed in the bump electrodes is transferred directly to a chip because the bump electrodes are used as terminals for circuit board mounting in the flip-chip type semiconductor integrated circuit, the present inventors have recognized the need for the provision of means for relaxing it.

The present inventors have further discussed a bonding option for the flip-chip type semiconductor integrated circuit from another standpoint. The bonding option is a technique for determining operation modes according to, for example, whether each of bonding pads assigned to operation mode setting electrodes of a semiconductor integrated circuit, for example, should be kept floating or connected to a power terminal. To which lead pin a predetermined bonding pad of a semiconductor chip should be bonded, may be selected upon assembly in the bonding option. However, the bump electrodes are used as the terminals mounted directly to the circuit substrate or board in the flip-chip type semiconductor integrated circuit and correspond to the lead pins for the package. Thus, the execution of the process like the bonding option is no longer physically impossible after wafer processes are all completed. In order to change each of bump electrodes to be connected to electrode pads like specific bonding pads, wiring patterns each extending from the electrode pad like the predetermined bonding pad to its corresponding bump electrode must individually be changed. On the other hand, the present inventors have taken recognition of a need to enable a flip-chip type semiconductor integrated circuit having completed such wiring patterns once to be functionally set subsequently with a view toward gaining versatility or usability equivalent to the bonding option.

An object of the present invention is to provide a flip-chip type semiconductor integrated circuit which does not give rise to degradation in reliability elicited by using a by-laser fusible fuse as a program element, and a method of manufacturing the same.

Another object of the present invention is to provide a semiconductor integrated circuit wherein electrodes required to electrically change the state of a program element employed in a flip-chip type semiconductor integrated circuit do not limit the number of protruding electrodes for other applications.

A further object of the present invention is to provide a semiconductor integrated circuit capable of relaxing the state of stress/distortion given to a semiconductor substrate through protruding electrodes in a flip-chip type semiconductor integrated circuit.

A still further object of the present invention is to provide a flip-chip type semiconductor integrated circuit capable of easily obtaining versatility equivalent to a bonding option with respect to function setting or the like, and a method of manufacturing the same.

A still further object of the present invention is to provide a manufacturing method of efficiently carrying out necessary function selection and relief accompanied by inspection and a change in the state of a program element to thereby allow the manufacture of a flip-chip type semiconductor integrated circuit.

The above, other objects and novel features of the present invention will become apparent from the following description of the present specification and the accompanying drawings.

DISCLOSURE OF THE INVENTION

Summaries of typical ones of the inventions disclosed in the present application will be described as follows:
<<Probe Test and Flip-chip Type Semiconductor Integrated Circuit>>

[1] In the invention related to a flip-chip type semiconductor integrated circuit having focused attention on a probe test, testing pads (209b) each using a conductive layer such as a relocation wiring layer (205) or an under bump metallurgy layer (207) or the like are provided just above or in the neighborhood of terminals (202b) like bonding pads, which are not provided with bump electrodes (208) thereat and are used only for probe testing. Similar testing pads (209a) may be provided even with respect to terminals (202a) like bonding pads at which the bump electrodes are provided. The probe test is executed by using these testing pads or under the combined use of under bump metallurgies antecedent to the formation of the bump electrodes together with the testing pads. According to the above, bump electrodes for pads dedicated for probe testing may not be added owing to the use of the testing pads. Further, the use of testing pads provided in the neighborhood of the terminals like the bonding pads and smaller in size than the under bump metallurgies enables a probe test to be executed after a relocation wiring process.

Further, conductive layers like relocation wirings 205), and testing pads (209a, 209b) are formed on an organic insulating layer (204) such as polyimide or the like. Owing to the provision of the testing pads on the organic insulating layer low in dielectric constant and easy to increase its thickness, the capacitance between each of the testing pads and a semiconductor circuit placed therebelow can be reduced. Since the modulus of elasticity of the organic insulating layer is relatively low, the surface of each testing pad is easy to deform and hence contactability of each probe is enhanced.

An insulating layer (206) is formed on the relocation wiring. An under bump metallurgy and testing pads are formed thereon. Thus, the provision of each testing pad on the layered insulating layers corresponding to the two layers placed above and below the relocation wiring makes it possible to reduce the capacitance between each testing pad and the semiconductor circuit placed therebelow.

[2] The above will further be explained in detail. The testing pads (209b) are provided exclusively to the bump electrodes (208). Thus, the layout of the bump electrodes at practical intervals can be facilitated to the fullest extent from the meaning of the mounting thereof to a circuit substrate. Namely, a semiconductor integrated circuit device comprises a semiconductor substrate, a plurality of circuit elements formed in an element forming layer on the semiconductor substrate, a plurality of terminals (202a, 202b) formed on the surface of the element forming layer and connected to the predetermined circuit elements, a plurality of conductive layers (205) which are respectively connected to first terminals (202a) corresponding to some terminals of the plurality of terminals and extend on the element forming layer, protruding electrodes (208) respectively connected to the conductive layers, testing pads (209b) respectively connected to all or some of second terminals (202b) corresponding to the remaining terminals of the plurality of terminals, and an insulating film (206) which covers the surfaces of the protruding electrodes and the testing pads so as to expose the protruding electrodes and the testing pads.

In the above, testing pads (209a) can be added to the terminals (202a) each having the protruding electrode (208). A wafer probe test can easily be carried out using the testing pads (209a, 209b) alone.

When the conductive layers are used as relocation wirings (205) for protruding electrodes with respect to the arrangement of the terminals, the insulating films (204, 206) are disposed above and below each of the conductive layers. The insulating films relax the state of stress/distortion given to the semiconductor substrate through the protruding electrodes and testing pads in the flip-chip type semiconductor integrated circuit. If a film containing an organic material such as a polyimide film, a fluorocarbon resin film, or an elastomer film which contains a silicon or acrylic rubber material, is used as the insulating films in particular, then the film is relatively low in the modulus of elasticity as compared with an insulating film such as a silicon oxide film or the like, it is suited for the relaxation of the state of stress/distortion.

The testing pads can be placed just above the terminals corresponding thereto. Further, the testing pads can regularly be placed in the central portion of the semiconductor substrate, and the protruding electrodes can regularly be placed outside the testing pads respectively. The testing pads can also be extended on its corresponding insulating film.

[3] A method of manufacturing a semiconductor integrated circuit having a structure wherein the testing pads are provided exclusively to protruding electrodes, includes a first step (FIGS. 37 through 40) for constituting a required circuit in an element forming layer on a semiconductor wafer, forming a plurality of terminals (202a, 202b) connected to the predetermined circuit elements on the surface of the element forming inlayer, and causing a plurality of conductive layers (205) to be respectively connected to first terminals (202a) corresponding to some of the plurality of terminals and to extend over the element forming layer, a second step (FIG. 43) for forming protruding electrodes (208) connected to the conductive layers, a third step (FIG. 41) for connecting testing pads (209b) to all or some of second terminals (202b) corresponding to the remaining terminals of the plurality of terminals respectively to form the testing pads, a fourth step (FIG. 42) for inspecting the required circuit formed in the element forming layer, a fifth step (S9 in FIG. 58) for performing burn-in, and a sixth step (S8 in FIG. 58) for dicing the wafer.

When testing pads (209a) are added even to the terminals (202a) each having the protruding electrode (208), the thirst step results in a process for connecting all or some of the second terminals and all or some of the first terminals respectively to thereby form the testing pads.

Burn-in is performed after the execution of dicing posterior to the formation of protruding electrodes. Alternatively, the protruding electrodes are formed after burn-in in reverse and dicing may be carried out. In the former, burn-in sockets prepared for a BGA (Ball Grid Array) type semiconductor chip in which external connecting electrodes are mapped in area array form, can be used appropriately in a manner similar to the flip-chip type semiconductor integrated circuit. Alternatively, the arrangement of protruding electrodes in area array form is matched with the arrangement of the terminals for the existing burn-in sockets, whereby custom-engineered burn-in sockets may not be prepared newly and burn-in in each chip unit can easily be performed. This contributes even to a reduction in test cost. In the latter, the burn-in can also be carried out by using testing pads or testing pads and an under bump metallurgy as well as a probe test. Thus, contacting with each socket under a high temperature makes it possible to prevent the deformation of protruding electrodes like solder bump electrodes.

<<Program Element and Flip-chip Type Semiconductor Integrated Circuit>>

[4] In the present invention, a program element (1) like an electric fuse is adopted for a flip-chip type semiconductor integrated circuit. Namely, the semiconductor integrated circuit includes a semiconductor substrate (10), a plurality of circuit elements (1, 2) formed in an element forming layer (semiconductor region, circuit element forming region including wiring layer and insulating layer) on the semiconductor substrate, a plurality of terminals (86, 87, 88, 89) formed on the surface of the element forming layer and connected to the predetermined circuit elements, conductive layers (90) which are connected to the predetermined terminals (86, 87, 88, 89) and extend on the element forming layer, and protruding electrodes (93) connected to the conductive layers. At this time, a program element (1) for irreversibly changing a high-resistance state or a low-resistance state of a current path or channel by the development of a predetermined potential difference in the current channel is provided as at least one of the circuit elements. At least one of the terminals is defined as voltage input terminals (86, 87) for forming the potential difference.

According to the above, elicited degradation in reliability is not developed at all owing to the use of a laser-fusible fuse as the program element.

When the conductive layers are used as the relocation wirings (205) for the protruding electrodes with respect to the arrangement of the terminals, insulating films (204, 206), which expose at least the protruding electrodes and cover the surface thereof, can be placed above and below each of the conductive layers. Owing to such insulating films, the state of stress/distortion applied to the semiconductor substrate through each protruding electrode (209) in the flip-chip type semiconductor integrated circuit can be relaxed. If a polyimide film containing an organic substance or a film such as elastomer is adopted as the insulating films in particular, then the film is relatively low in the modulus of elasticity as compared with an insulating film such as silicon oxide or the like, and hence the film is excellent in the relaxation of the state of stress/distortion.

The semiconductor integrated circuit can further be provided with pad electrodes (90, 90a) which are respectively connected to the terminals and exposed from the insulating films. The pad electrodes can be used for testing pads or the like provided for the purpose of probe tests.

Some pad electrodes (90a) in the pad electrodes can be used to apply voltages for developing a predetermined potential difference in the program element. In the case of a circuit configuration in which the pad electrodes (90a) may be kept floating after the program element has been programmed, protruding electrodes may not be assigned to the pad electrodes (90a). Thus, the electrodes required to electrically change the state of the program element employed in the flip-chip type semiconductor integrated circuit do not limit the number of protruding electrodes for other applications. On the other hand, in the case of a circuit configuration in which after the program element has been programmed, the pad electrodes (90a) must forcedly be set to a ground potential (Vss) or a source voltage (Vcc), protruding electrodes (93a) are assigned to the pad electrodes (90a), and the protruding electrodes (93a) may be connected to power wrings for the ground potential (Vss) or the source voltage (Vcc) on a wiring board upon substrate implementation.

When the voltages for developing the predetermined potential difference in the program element are voltages different form operating source voltages employed in a circuit other than the program element, the electrode for applying the program voltage may be shared between a plurality of program elements.

An electric fuse changed from a high-resistance state to a low-resistance state due to an electrical breakdown can be adopted for the program element. For example, the current path or channel of the program element is charged with an insulating film in the high-resistance state, and the insulating film is broken in the low-resistance state.

The breakdown of the insulating film can be carried out by applying a positive voltage (VDD) to one end of the current channel and applying a negative voltage (Vbb') to the other end thereof. Thus, the program element can obtain a high voltage as a predetermined potential difference, and an absolute value-based voltage with a circuit's ground voltage (Vss) as the reference can be limited to a substantially normal operating voltage. In this case, the negative voltage may commonly be supplied from the protruding electrodes or pad electrodes used for application of the predetermined voltages for forming the potential difference to each individual program elements. Alternatively, an internal voltage formed inside a chip, based on a positive voltage (VDD) and a ground voltage (GND) supplied from outside the chip may be supplied to each of the program elements. For example, a high voltage (VCH) or a negative voltage (Vbb') higher than the VDD is used as the internal voltage. As to the presence or absence of a program for each program element, the applied voltage on the opposite side of the program element may be controlled by use of an address signal or the like.

The program element can be used for defective relief. Namely, the semiconductor integrated circuit has normal circuits each comprised of the circuit elements and at least one relieving circuit corresponding to one to be substituted for the defective normal circuit and comprised of the circuit elements. The program elements can be adopted for memory means (160) for storing relief information for specifying the normal circuit to be replaced by the corresponding relieving circuit. For instance, the normal circuits are memory cells and the relieving circuit is a redundant memory cell. The semiconductor integrated circuit has a comparator (161) which compares the relief information stored by the corresponding program element and an access address signal of each memory cell referred to above and is comprised of the circuit elements, and a selection circuit (106XD) which is capable of selecting the redundant memory cell as an alternative to the selection of the memory cell in response to the coincidence of the comparator and capable of selecting the corresponding memory cell in response to the non-coincidence of the comparator and which comprises the circuit elements.

The program elements can be used for the function selection of the semiconductor integrated circuit. Namely, the program elements can be adopted as means (AF0 through AF2) for storing operation mode designation information for determining operation modes of the semiconductor integrated circuit. Thus, the flip-chip type semiconductor integrated circuit can easily obtain versatility equivalent to a bonding option in terms of the function selection or operation mode selection even after the formation of the protruding electrodes.

The program elements can be adopted as means (AF10 through AF12) for storing trimming information used for selecting the characteristic of a predetermined circuit incorporated in the semiconductor integrated circuit. For example, the semiconductor integrated circuit has a resistance type voltage divider (183), and the trimming information stored in the program element selects a divided voltage produced by the resistance type voltage divider.

[5] A method of manufacturing a semiconductor integrated circuit wherein program elements like electric fuses are adopted for a flip-chip type semiconductor integrated circuit, includes a first step for constituting a required circuit in an element forming layer on a semiconductor wafer, taking or including at least a program element for irreversibly changing a high-resistance state or a low-resistance state of a current path or channel by development of a predetermined potential difference in the current channel in the circuit and forming a plurality of terminals connected to the circuit on the surface of the element forming layer, a second step (S7) for forming a plurality of protruding electrodes for mounting connections, corresponding to some of the plurality of terminals, a third step (S5) for testing or inspecting the circuit, a fourth step (S6) for replacing a defective or faulty portion with a relieving circuit according to the result of inspection by the third step, a fifth step (S9) for performing burn-in, and a sixth step (S8) for dicing the wafer. Further, the method includes a seventh step (S4) for irreversibly changing the state of each of the program elements to thereby select the function of the circuit. The dielectric breakdown type electric fuse (1) can be used as the program element.

According to the above, the function selection of the semiconductor integrated circuit is allowed without using a by-laser fusible fuse as the program element. Thus, this can contribute to yield enhancement of a flip-chip type semiconductor integrated circuit subjected to the function selection and manufactured, and an improvement in reliability thereof.

The selection of each function by the program element can be carried out before the formation of the protruding electrodes. Namely, the second step (S7) is carried out after the seventh step (S4). After the formation of the protruding electrodes, irregularities are formed on the wafer to no small extent. If the function selection is done before the formation of the protruding electrodes, then the contact of a probe with each pad or terminal for the application of a voltage to the program element for the function selection is easy and the working efficiency of the function selection can be improved.

Contrary to the above, the function selecting (S4) based on the program element can be performed after the formation of the protruding electrodes (S7). In this case, it is necessary to expose electrodes for respectively applying voltages to the program elements on the surface of the semiconductor integrated circuit for the purpose of the function selection in a manner similar to the protruding electrodes. However, since each individual semiconductor integrated circuits can be stocked in a state in which each wafer process has virtually been finished, except for a process attendant on the function selection, stock management is easy.

In the fourth step (S6) for replacing the defective portion by its corresponding relieving circuit, the replacement thereof can be performed while the state of each program element is being irreversibly changed. At this time, the respective steps for the function selection (S4), inspection (S5) and relief (S6) can be carried out by one-circuit probing processing. Namely, the third step, fourth step and seventh step are sequentially performed and respectively include probing processing on the terminals or protruding electrodes as needed. If the protruding electrodes are formed (S7) after the respective steps for the function selection (S4), inspection (S5) and relief (S6), then the contact of a probe with each pad or terminal for the application of a voltage to each program element is easy and the working efficiency of the inspection and relief can also be improved as well as that of the function selection.

If the protruding electrodes are formed according to the second step after the fifth step (S9) for performing the burn-in (S7), it is then unnecessary to consider the deformation of each protruding electrode under a high-temperature environment, and hence the burn-in can easily be carried out from its standpoint.

[6] When attention is given to the replacement of a defective portion with a relieving circuit in a flip-chip type semiconductor integrated circuit, a method of manufacturing a semiconductor integrated circuit includes a first step for constituting a required circuit in an element forming layer on a semiconductor wafer, taking or including at least a program element for irreversibly changing a high-resistance state or a low-resistance state of a current path or channel by development of a predetermined potential difference in the current channel in the circuit and forming a plurality of terminals connected to the circuit on the surface of the element forming layer, a second step (S7) for forming a plurality of protruding electrodes for mounting connections, corresponding to some of the plurality of terminals, a third step (S5) for testing or inspecting the circuit, a fourth step (S6) for replacing a defective or faulty portion with a relieving circuit according to the result of inspection by the third step, a fifth step (S9) for performing burn-in, and a sixth step (S8) for dicing the wafer. The fourth step (S6) is provided as a step for irreversibly changing the state of each of the program elements to thereby perform the replacement. In the fourth step, a voltage for developing a predetermined potential difference in the current path is applied to a predetermined terminal connected to the program element, of the plurality of terminals, for example. The program element is used as the dielectric breakdown type electric fuse, for example.

According to the above, the defective relief of the semiconductor integrated circuit is allowed without using a by-laser fusible fuse as the program element. Thus, this can contribute to yield enhancement of a flip-chip type semiconductor integrated circuit manufactured under the relief, and an improvement in reliability thereof.

BRIEF DESCRIPTION OF THE DRAWINGS

FIG. 30 is an explanatory view illustrating the manner in which operation modes each settable by a bonding option are kept in order;

FIG. 31 is a block diagram showing a configuration which allows a function selection equivalent to the bonding option by use of the antifuse circuits;

FIG. 32 is an explanatory view depicting the manner in which operation modes each settable by antifuses shown in FIG. 31 are kept in order;

FIG. 41 is a vertical cross-sectional view showing a manufacturing process step following FIG. 40;

FIG. 42 is a vertical cross-sectional view illustrating a manufacturing process step following FIG. 41;

FIG. 43 is a vertical cross-sectional view showing a manufacturing process step following FIG. 42;

FIG. 44 is an explanatory view illustrating a comparison between the number of bonding pads in a 64 Mbits synchronous DRAM chip and the number of external terminals in a package;

FIG. 53 is a perspective view illustrating the stage of completion of a conventional wire bonding connecting wafer;

FIG. 54 is a perspective view depicting the state of formation of under bump metallurgies following FIG. 53;

FIG. 55 is a perspective view showing a probe inspection process following FIG. 54;

FIG. 59 is an explanatory view showing chip contacts of a probe and a socket or the like in respective testing processes of probe inspections, burn-in and final tests in the respective manufacturing process flows shown in FIG. 58.

BEST MODE FOR CARRYING OUT THE INVENTION

<<Antifuse Circuit>>

Figure 1:
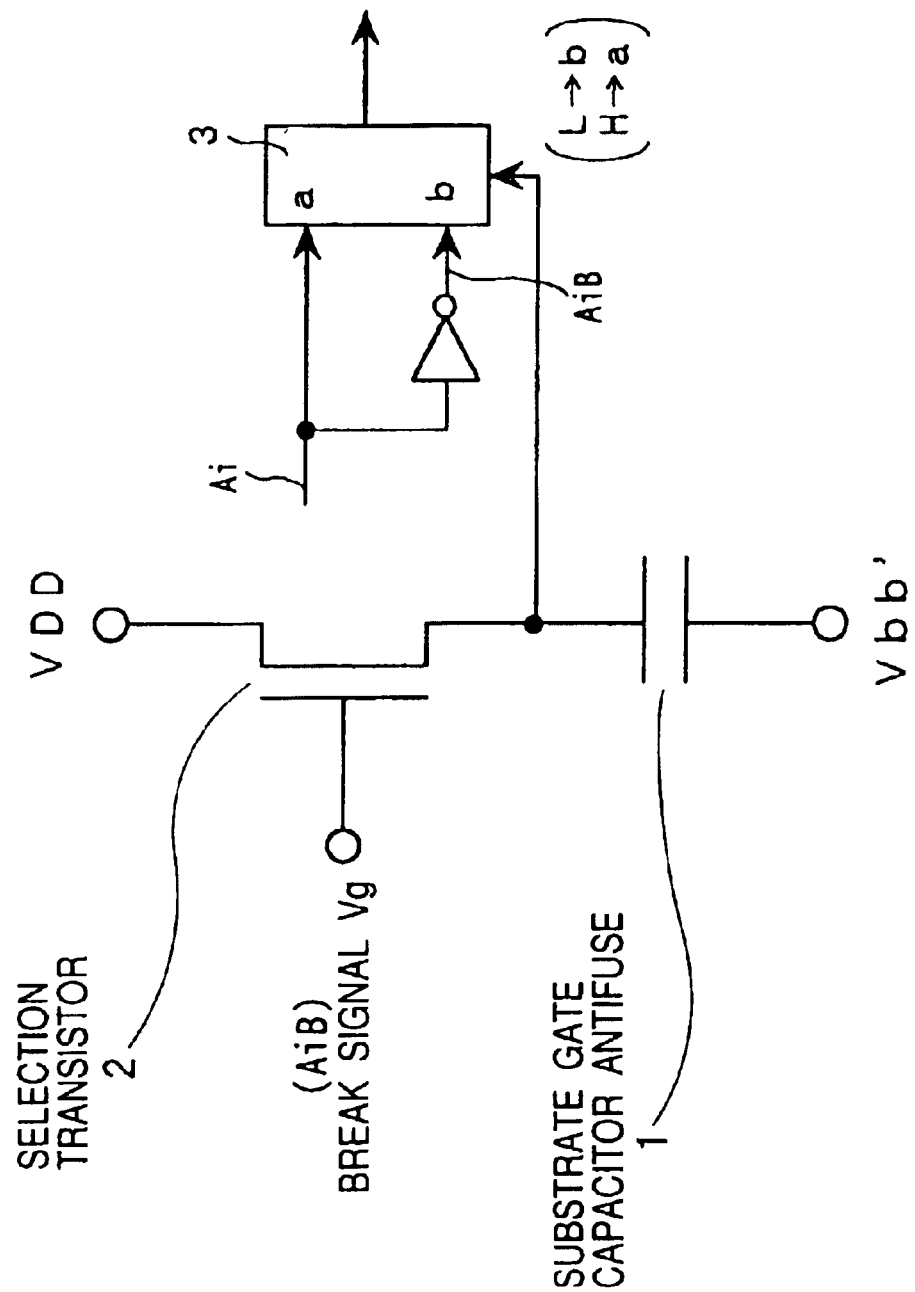
FIG. 1 is a circuit diagram showing one example of an antifuse circuit employed in a semiconductor integrated circuit according to the present invention.

One example of an antifuse circuit employed in a semiconductor integrated circuit according to the present invention is shown in FIG. 1. In FIG. 1, a circuit element designated at numeral 1 is an antifuse used as a dielectric breakdown type electric fuse indicative of one example of a program element. The antifuse 1 comprises a so-called substrate gate capacitor formed in a semiconductor region, which is separated from another peripheral transistor and to which a substrate voltage Vbb' is applied. There is provided a selection transistor 2 having a source terminal to which a gate capacitance electrode of the antifuse 1 is connected, a drain terminal to which a breakdown voltage VDD is applied, and a gate electrode to which a break control signal Vg is applied. In the antifuse (hereinafter also called a substrate gate capacitor) defined as the substrate gate capacitor, the breakdown voltage VDD is applied to the gate capacitance electrode of the antifuse1 through the selection transistor 2 turned on in response to a break control signal Vg of a high level, for example, and the substrate voltage Vbb' is applied to the antifuse 1 from the substrate side. Due to the difference between the potentials applied to both ends of the antifuse 1, an insulating film like a gate insulating film of the antifuse 1 is broken down so that the antifuse 1 is changed from a high-resistance state to a low-resistance state.

Although not restricted in particular, when the configuration shown in FIG. 1 is applied to the relief of a defective bit of a memory or the like, the source of the selection transistor 2 is coupled to a selection terminal of a selector 3. A corresponding bit Ai of an address signal and an inverted signal AiB thereof at a memory access are inputted to the selector 3. For example, a logical value of the break signal Vg has a logical value identical to the inverted signal AiB of the address bit Ai. The selector 3 selects and outputs the inverted signal AiB when the input at the selection terminal is a low level (logical value "0"), and selects and outputs the address bit Ai when the input at the selection terminal is a high level (logical value "1"). Thus, when the antifuse 1 is broken by the break signal Vg (=AiB) of the logical value "1", the selection terminal of the selector 3 is brought to the logical value "0", whereby the selector 3 outputs the inverted signal AiB of the corresponding address bit Ai. When the break signal Vg (=AiB) is of the logical value "0", the antifuse 1 is not broken and the selection terminal of the selector 3 is brought to the logical value "1", whereby the selector 3 outputs the corresponding address bit Ai. In other words, when the logical value of the address bit Ai coincides with an inverted logical value of the logical value of the break signal Vg (=AiB), the output of the selector 3 is brought to the logical value "1".

Owing to the use of one-bit configuration shown in FIG. 1 by plural bits, the antifuses 1 using the plural bits can be programmed with faulty or defective addresses to be relieved. Namely, a program for the antifuse 1 is executed with the inverted signal corresponding to each bit for the defective address to be relieved as the break signal Vg for each bit. When an access address of a memory having finished the program processing of the antifuses is equal to each defective address to be relieved, the outputs of the selectors 3 for the respective bits are all brought to the logical value "1". If the access address of the programmed memory differs from each defective address to be relieved even one bit, then the output of at least one selector 3 is brought to the logical value "0". Detecting this state by an unillustrated negative AND gate (NANDGATE: NAND) makes it possible to detect an access relative to the address to be relieved. Thus, a relieving redundant bit is selected in place of a defective bit.

Figure 2:
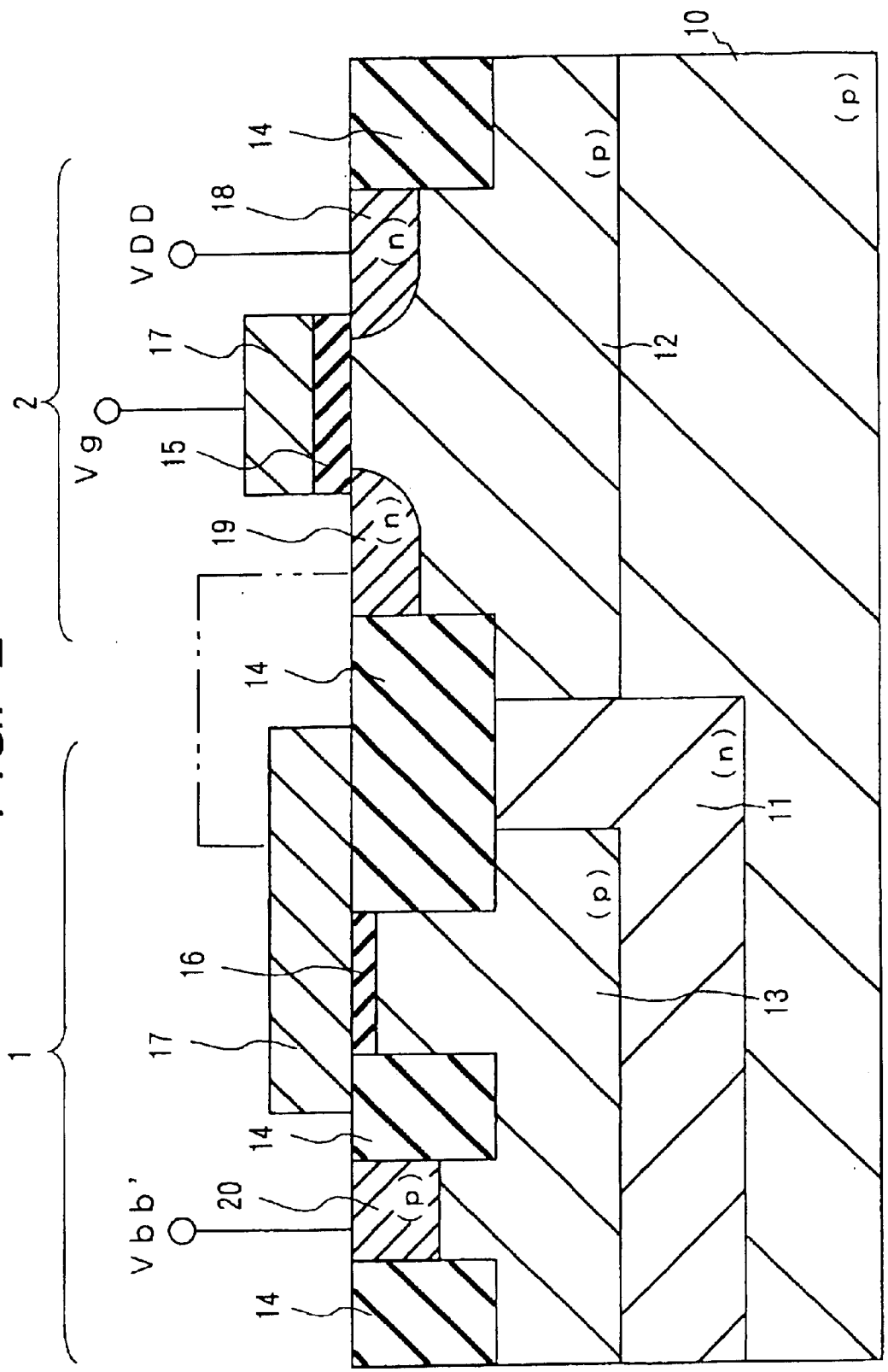
FIG. 2 is a vertical cross-sectional view illustrating one example of a device structure of circuit elements which constitute the antifuse circuit shown in FIG. 1.

One example of a section structure of circuit elements, which constitute the antifuse circuit shown in FIG. 1, is shown in FIG. 2. A second conduction type (e.g., n-type) deep well region 11 is formed in a surface area of a first conduction type (e.g., p-type) semiconductor substrate 10, and a first conduction type shallow well region 13 is formed inside the second conduction type deep well region 11. A fist conduction type shallow well region 12 is formed outside the second conduction type deep well region 11. A selection transistor 2 comprised of a second conduction type drain region 18, a second conduction type source region 19, a gate oxide film 15 and a gate electrode 17, which is separated by element isolating regions 14, is formed in a surface region of the first conduction type shallow well region 12. An antifuse 1, which is separated by element isolating regions 14 and comprised of a gate capacitance oxide film 16, a gate capacitance electrode 17 and a first conduction type substrate connecting diffused layer 20, is provided in a surface region of the first conduction type shallow well region 13. The gate capacitance electrode 17 is connected to the second conduction type source region 19 of the selection transistor 2. Further, a breakdown voltage VDD is applied to the second conduction type drain region 18 of the selection transistor 2, and the substrate voltage Vbb' is applied to the first conduction type substrate connecting diffused layer 20.

Assuming that a gate break-down withstand voltage of the substrate gate capacitor is given as BVg, and the threshold voltage of the selection transistor is given as Vths in the semiconductor device of the present invention, the antifuse circuit is set to the following expression under the condition of break signal Vg>VDD+Vths:

VDD+Vbb'>BVg or preferably

|VDD|~|Vbb'|>BVg/2.

According to the antifuse 1, the aforementioned problem related to the irradiation of laser light for fusing or blowing the conventional fuse can be solved. Namely, it is not necessary to define an irradiation window even when the number of metal wiring layers is five or more. Further, since a change in the state of each fuse is carried out based on an electrical program, a process system like a flip-chip type semiconductor integrated circuit in which the details thereof is to be described later, also shows no problem about degradation in reliability. Further, since the substrate gate capacitor can be laid out in the form of 3×3 $\mu m^2$ or less even when a 0.5 $\mu m$ process technology is used, a layout area can be reduced to $\frac{1}{5}$ or less as compared with a laser fusion type. Further, the present process technology can cope with an increase in the number of fuses.

Figure 3:
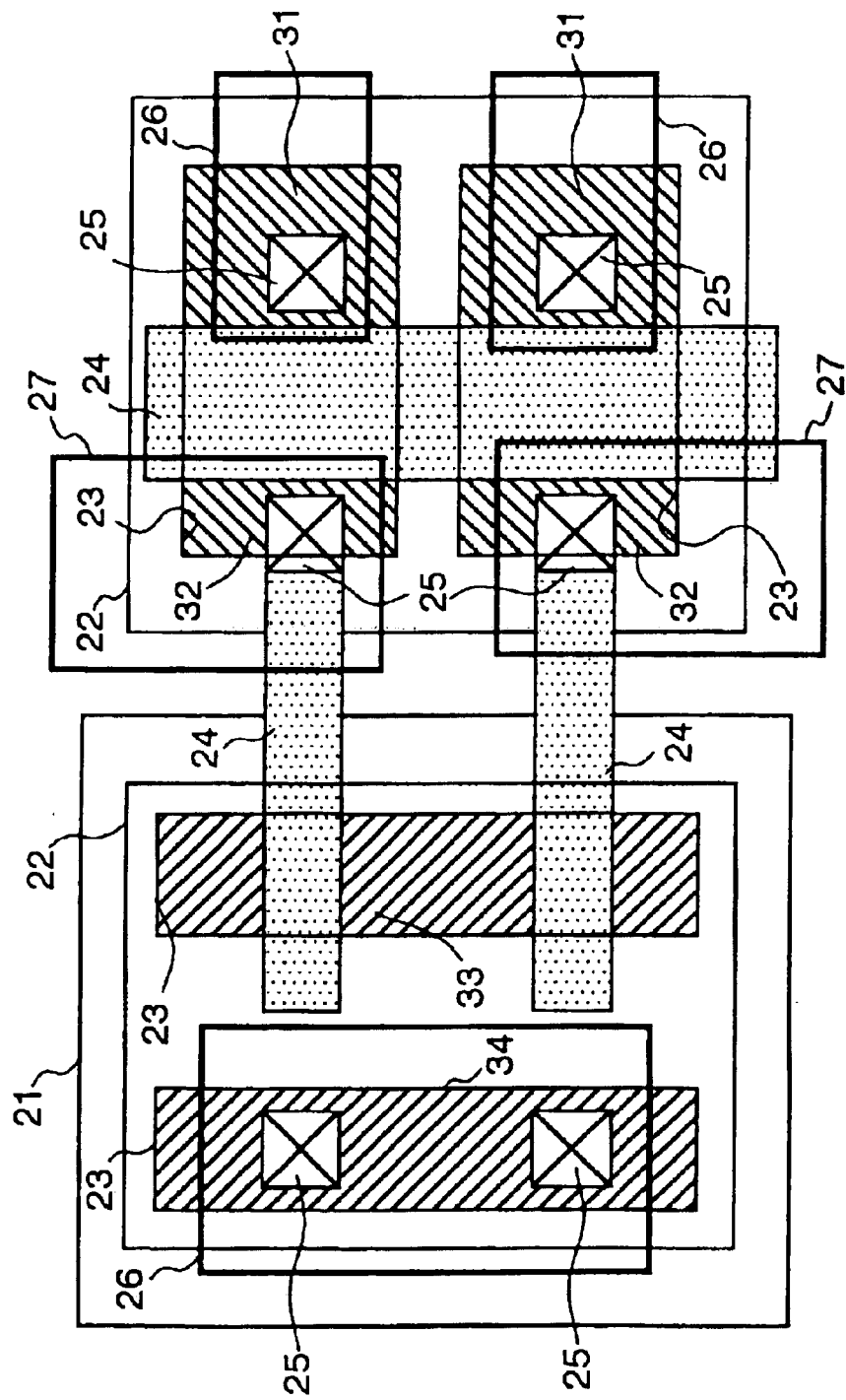
FIG. 3 is a plan view depicting one example of the layout of antifuses each using a substrate gate capacitor.

The layout of the two antifuses 1 is shown in FIG. 3 as a plan layout of the antifuses each using a substrate gate capacitor. A pattern 21 for forming a deep n-type well region and a pattern 22 for forming a shallow p-type well region are formed on a p-type semiconductor substrate. Each of patterns 23 defines an element isolating region outside its rectangle. Each of patterns 24 comprises, for example, a polysilicon layer for defining a gate electrode 17 of a selection transistor 2 and a gate capacitance electrode 17 of an antifuse 1. Reference numerals 25 respectively indicate patterns for forming contact holes, and reference numerals 26 and 27 respectively indicate patterns for forming first metal wiring layers. Reference numerals 31 respectively indicate n-type drain regions 18 each used for the selection transistor 2, reference numerals 32 respectively indicate n-type source regions 19, reference numeral 33 indicates a p-type diffused layer, and reference numeral 34 indicates a p-type substrate connecting diffused layer.

Cross-sectional views set every respective manufacturing process steps for obtaining the configurations of the selection transistor 2 and antifuse 1 (substrate gate capacitor) shown in FIG. 2 are illustrated in FIGS. 4 through 7.

Figure 4:
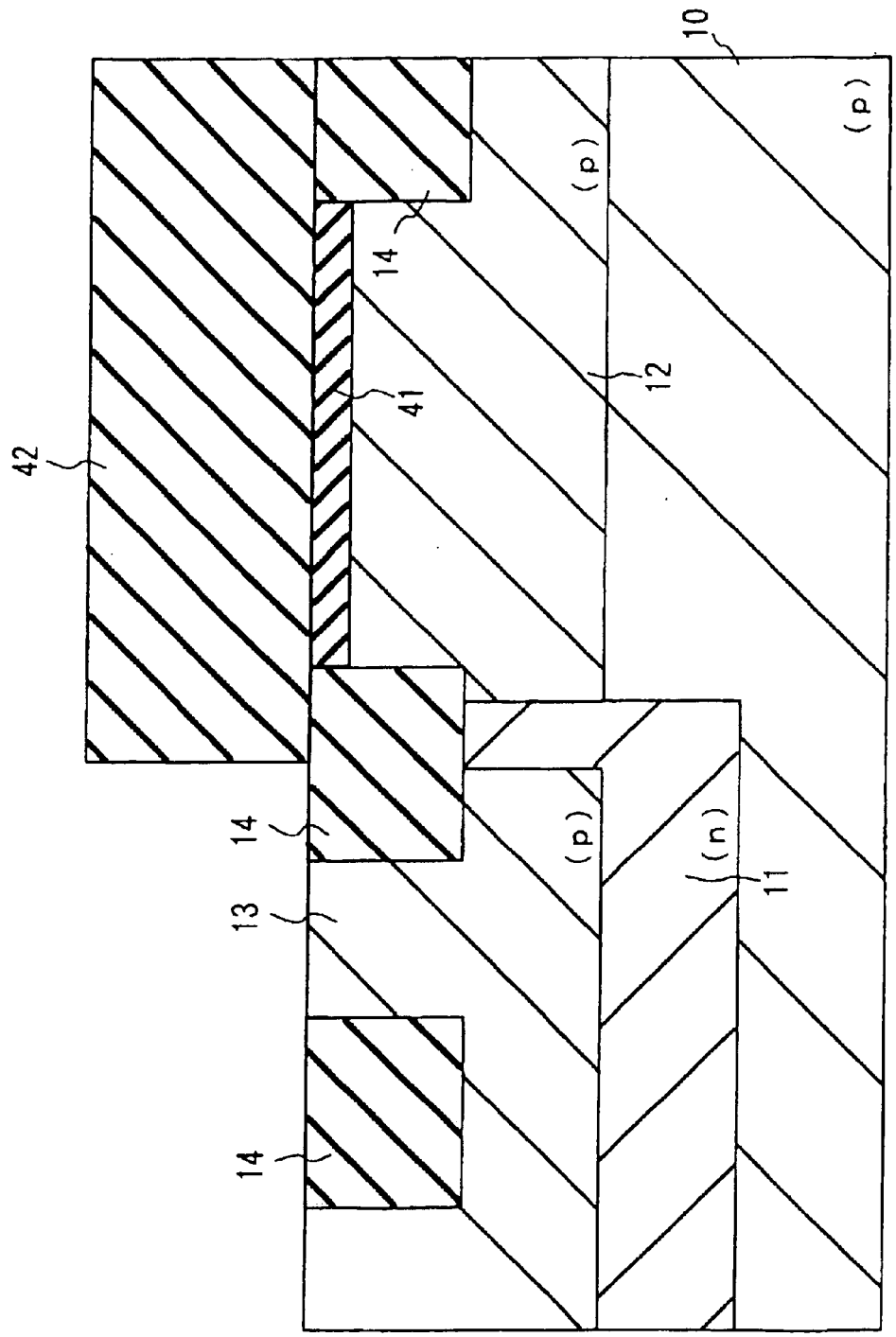
FIG. 4 is a vertical cross-sectional view showing the state of an initial manufacturing process used for constituting a selection transistor and an antifuse shown in FIG. 2.

As shown in FIG. 4, trench-type element isolating regions 14 each having a depth of 0.3 $\mu m$ are first formed on a p-type silicon substrate 10 having a resistivity of 10 $\Omega cm$. Afterwards, a phosphor (P+) ion having an acceleration energy of 1000 keV is implanted by a dose of $1\times 10^{13}/cm^2$ by an ion implantation method to thereby form a deep n-type well 11. A B+ ion having an acceleration energy of 350 keV, a born (B+) ion having an acceleration energy of 150 keV, and a $BF_2$+ ion having an acceleration energy of 50 keV are respectively implanted by a dose of $1\times 10^{12}/cm^2$, a dose of $2\times 10^{12}/cm^2$ and a dose of $5\times 10^{12}/cm^2$ to thereby form shallow p-type wells 12 and 13. Thereafter, a high-withstand gate oxide film 14 having a thickness of 7 nm is grown by a thermal oxidation method at a temperature of 850° C. Further, a 1 $\mu m$-thick resist film 42 in which only a region for forming a substrate gate capacitor is open, is formed by the normal lithography method. Afterwards, the high-withstand gate oxide film 41 in a region in which the substrate gate capacitor is formed, is removed by a wet etching method.

Figure 5:
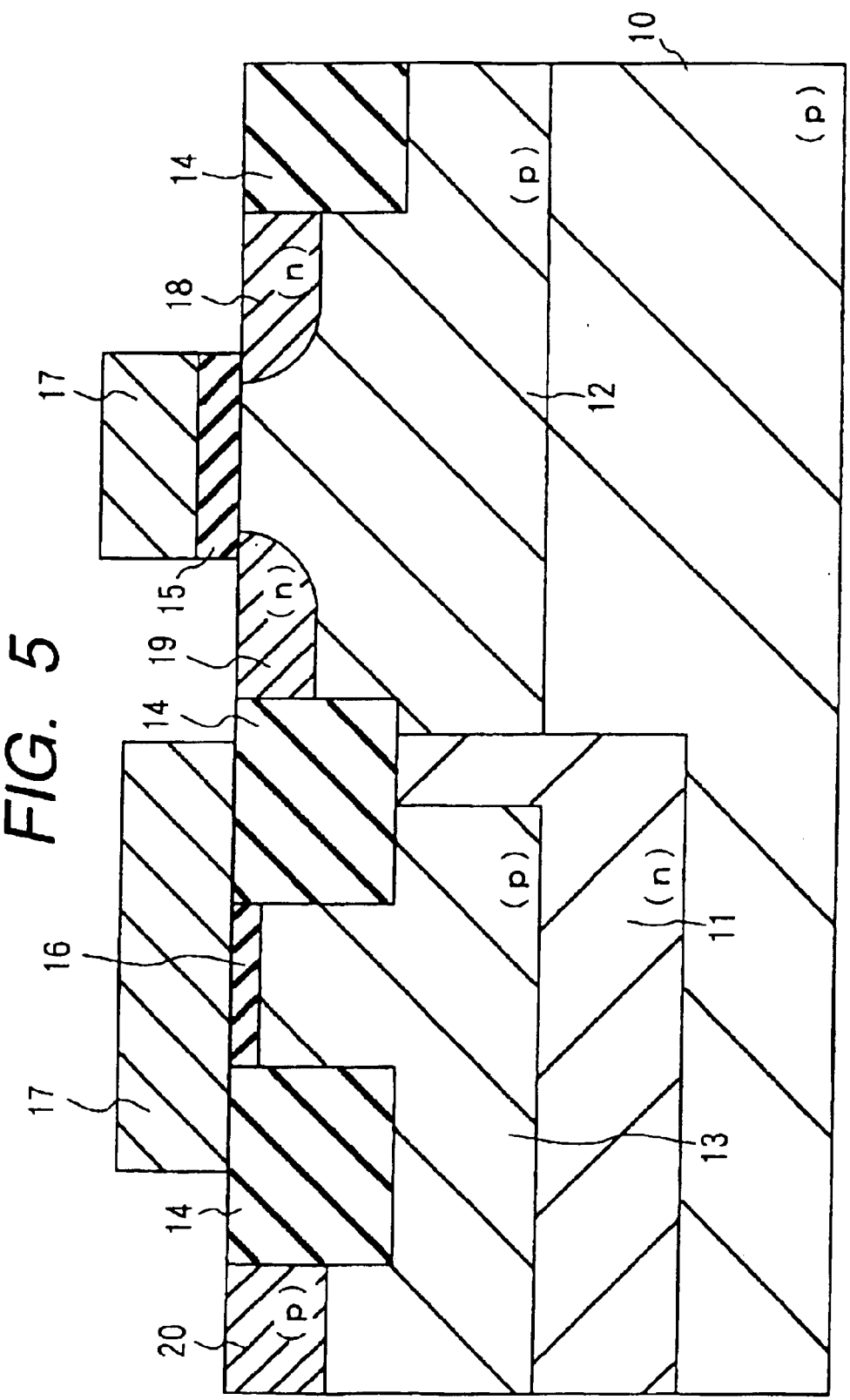
FIG. 5 is a vertical cross-sectional view illustrating a next manufacturing process following FIG. 4.

Next, as shown in FIG. 5, the resist film 42 is removed by an ashing method. After cleaning of the silicon substrate, a low-withstand gate oxide film 16 having a thickness of 4.5 nm is grown by the thermal oxidation method at the temperature of 850° C. Simultaneously, cleaning and oxidation are added to form a high-withstand gate oxide film 15 increased to a thickness of 8 nm. Afterwards, a gate electrode 17 is formed which comprises a 200-nm thick polysilicon film which is deposited by a CVD method (Chemical Vapor Deposition) at a temperature of 600° C. and in which a P+ ion having an acceleration energy of 20 keV is implanted by a dose of $4\times 10^{15}/cm^2$, and which is processed by the normal lithography method. An arsenic (As+) ion having an acceleration energy of 20 keV is implanted by a dose of $2\times 10^{15}/cm^2$ to thereby form an n-type drain region 18 and an n-type source region 19. Further, a B+ ion having an acceleration energy of 10 keV is implanted by a dose of $2\times 10^{15}/cm^2$ to thereby form a p-type substrate connecting diffused layer 20.

Figure 6:
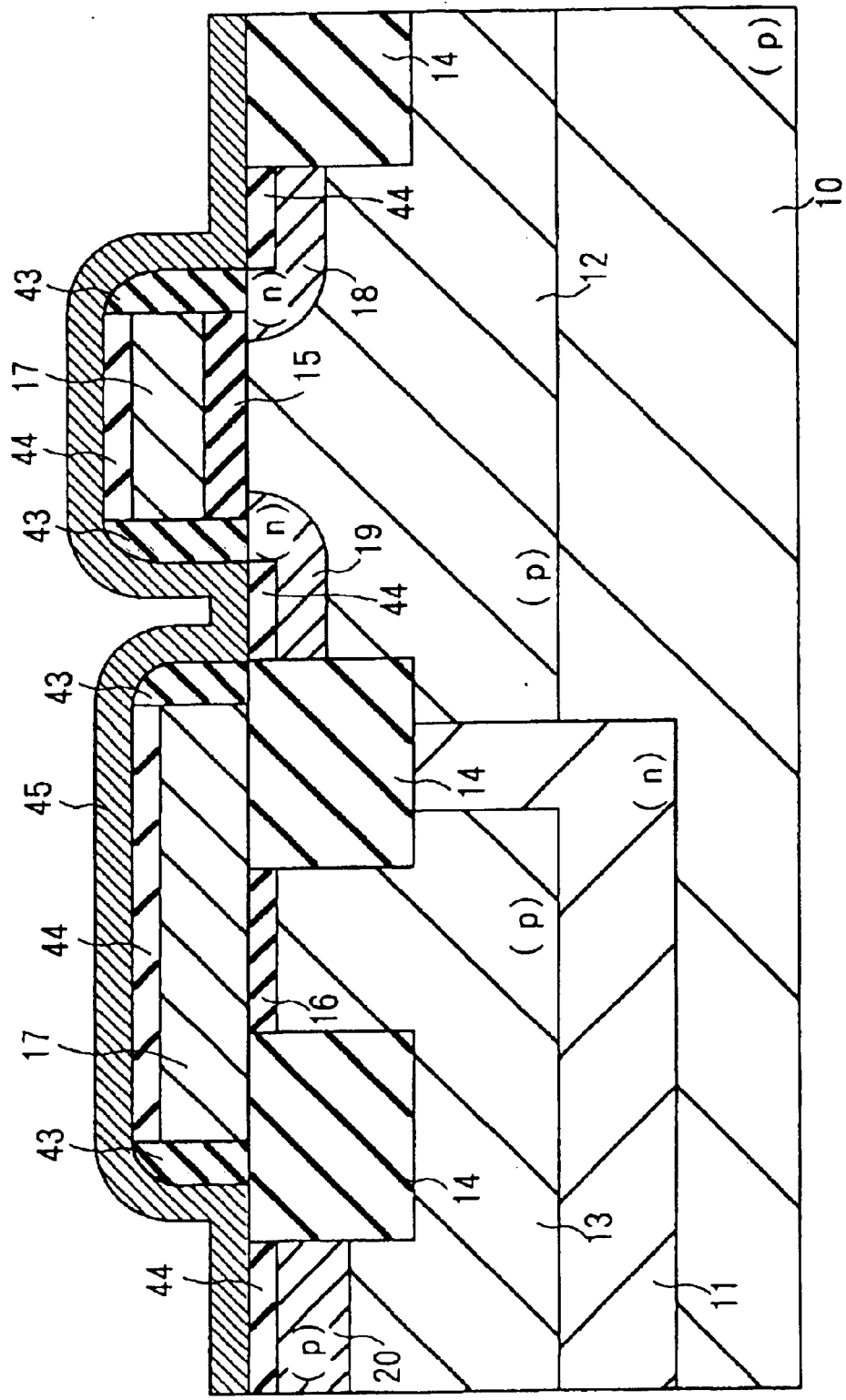
FIG. 6 is a vertical cross-sectional view depicting a next manufacturing process following FIG. 5.

As shown in FIG. 6, side spacers 43 comprised of an oxide film having a thickness of 100 nm, which is deposited by a CVD method using a temperature of 700° C. and processed by an etchback method, is further formed, and a Co silicide film 44 having a thickness of 40 nm is grown on the substrate and the gate electrode, followed by deposition of a silicon nitride film 45 having a thickness of 100 nm by a CVD method using a temperature of 400° C.

Figure 7:
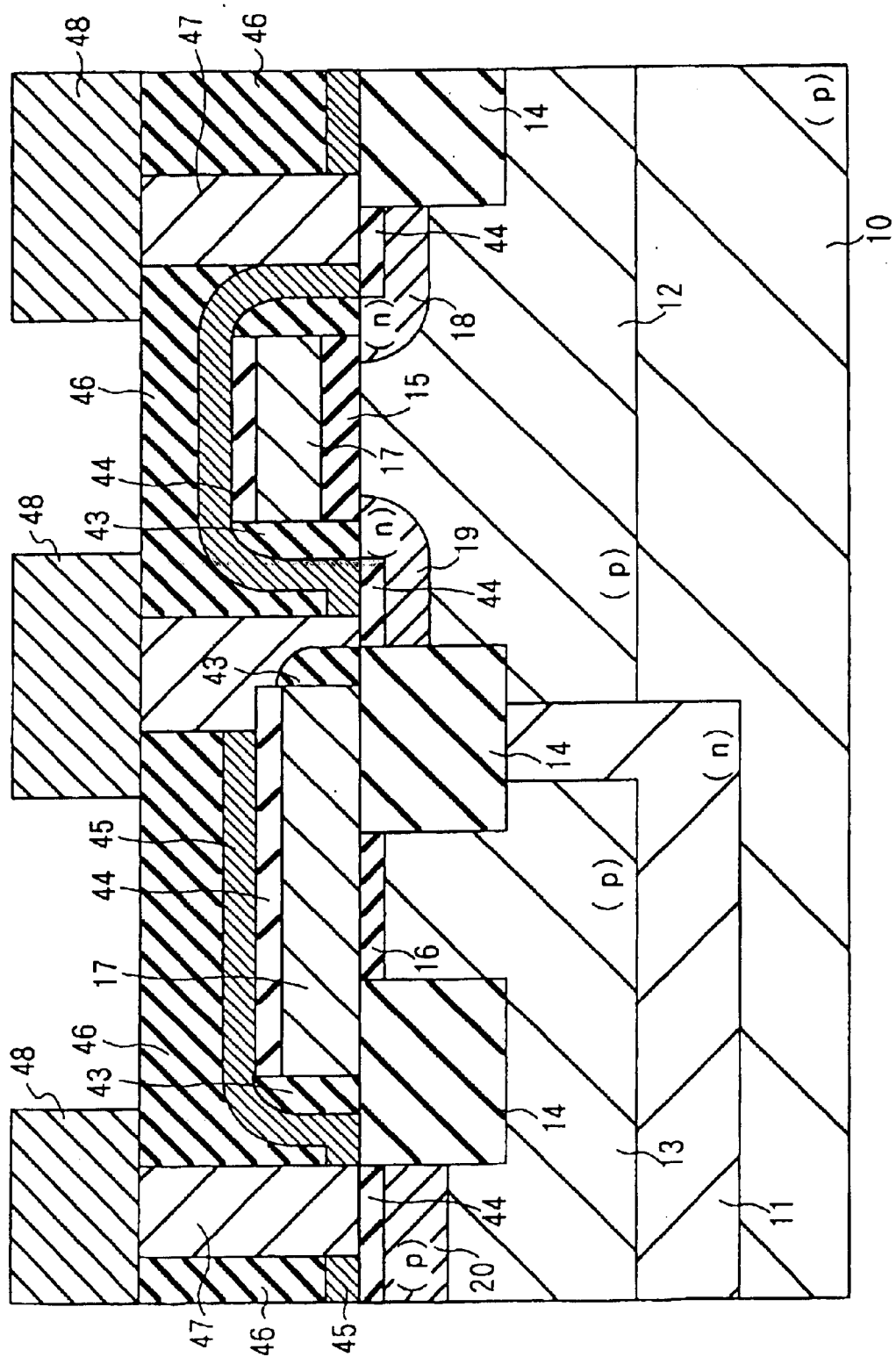
FIG. 7 is a vertical cross-sectional view showing a next manufacturing process following FIG. 6.

Finally, a 1 $\mu m$-thick silicon oxide film 46 deposited by the CVD method and flattened by a CMP method (Chemical Mechanical Polishing) is formed as shown in FIG. 7. Then contact holes are defined in desired positions and tungsten (W) plugs 47 embedded therein by the CVD method and the etchback method are formed. Further, an aluminum film having a thickness of 500 nm is deposited by a sputtering method to thereby form first metal wirings 48 processed by the normal lithography method, whereby the manufacture of a principal portion is completed.

Figure 8:
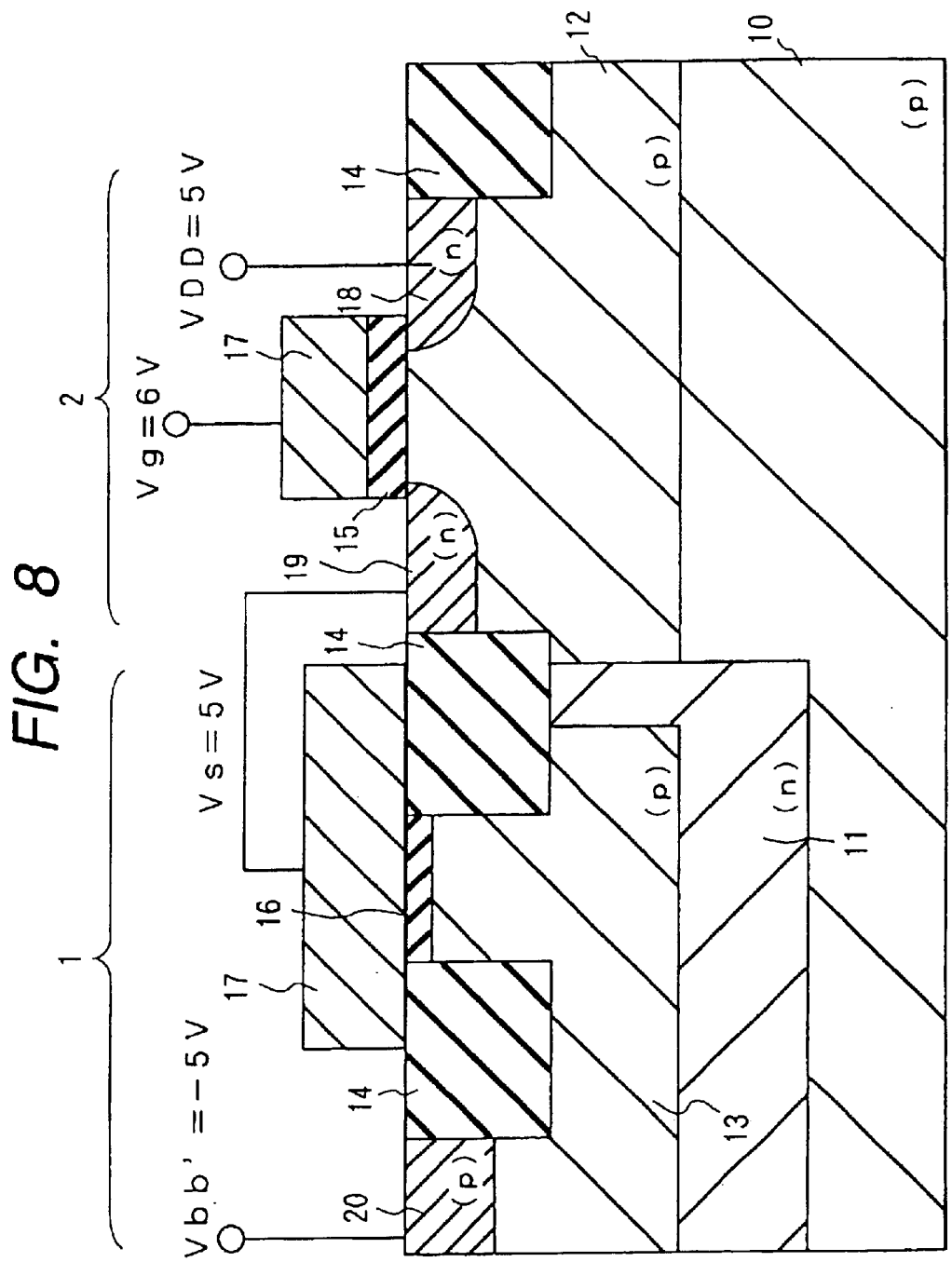
FIG. 8 is an explanatory view showing one example of a voltage applying condition at a dielectric breakdown operation of the antifuse.

A voltage applying condition at a dielectric breakdown operation of the antifuse 1 is shown in FIG. 8 by way of example. A ground potential 0V is applied to the p-type silicon substrate 10 and the shallow p-type well region 12 in which the selection transistor exists, and a source voltage 3.3V is applied to the deep n-type well region 11. Further, a breakdown voltage VDD=5V is applied to the n-type drain region 18 of the selection transistor with a substrate voltage Vbb' of the substrate gate capacitor=−5V. Afterwards, a voltage pulse of a break signal Vg=6V is applied to its corresponding gate electrode of the desired selection transistor 2 for a time of 1 ms, and a voltage of 10V is effectively applied to the low-withstand gate oxide film 16 of the antifuse 1. Thus, the gate insulating film 16 is broken and the antifuse 1 undergoes an electrical breakdown.

Figure 9:
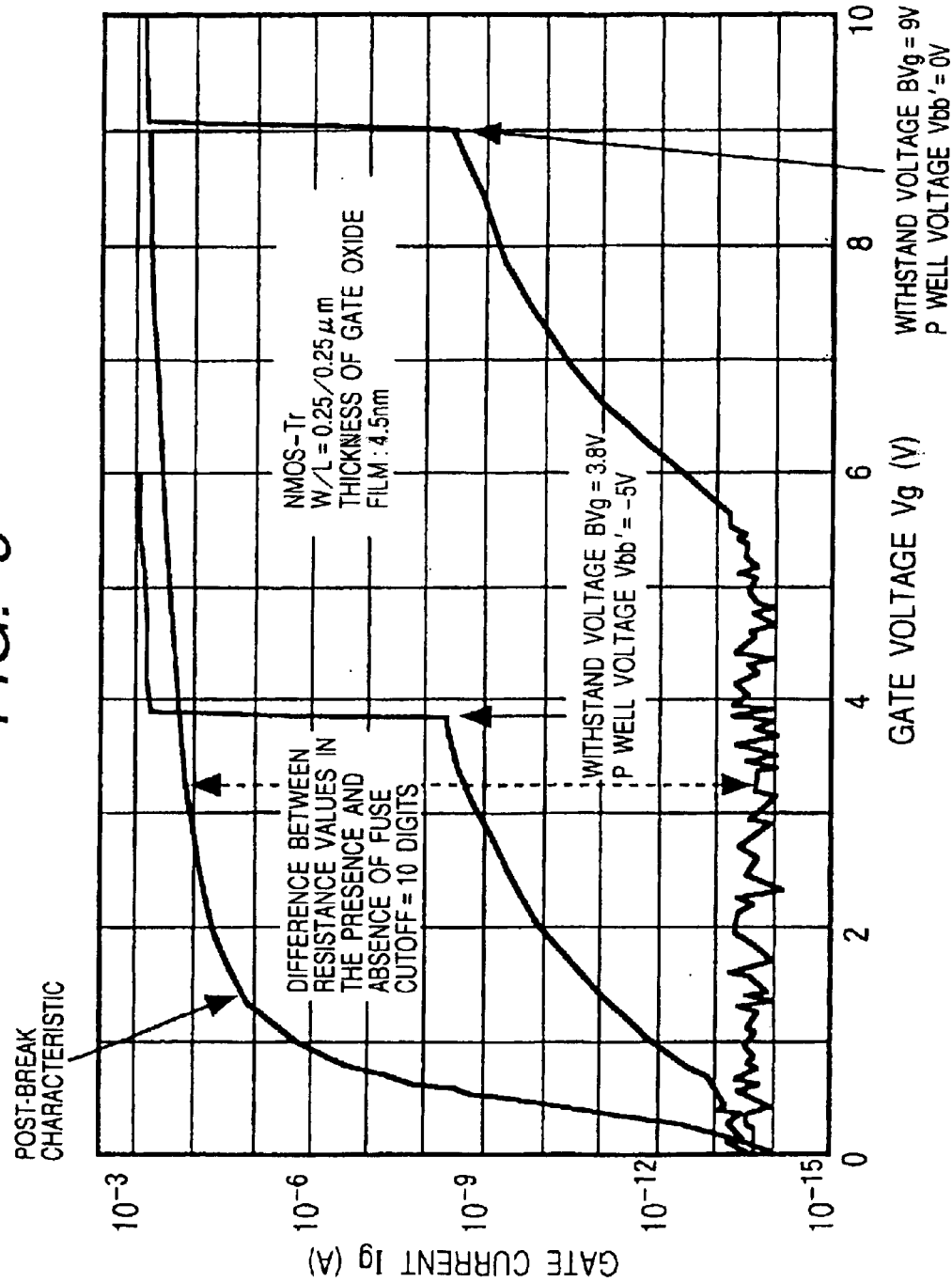
FIG. 9 is a characteristic diagram illustrating one example of a voltage current characteristic at dielectric breakdown of the antifuse.

FIG. 9 shows a voltage-current characteristic at dielectric breakdown of the antifuse 1 corresponding to the substrate gate capacitor. The plan sizes of the substrate gate capacitor are given as an element isolation interval of 0.25 $\mu m$ and a gate width of 0.25 $\mu m$. When Vbb'=0V, a gate breakdown withstand voltage BVg is 9V. Since Vbb'=−5V in the present embodiment, the breakdown voltage necessary for the gate capacitance electrode side is reduced to 3.8V. Thus, if 5V are applied from the selection transistor, then the antifuse can be broken without any problem. Although the value of a current flowing through the low-withstand gate oxide film 16 immediately after the breakdown is limited to 1 mA, the resistance value of the post-breakdown fuse is reduced by 10 digits like about 10 $k\Omega$ as compared with the pre-breakdown. Thus, the current driving capacity of the selection transistor 2 may be designed so as to take 1 mA or more as a guide. Further, the current driving capacity of a comparison transistor 3 connected between a relief determination circuit and the selection transistor may be designed so that the resistance value of the post-breakdown fuse reaches about 10 $k\Omega$ as a guide.

Figure 10:
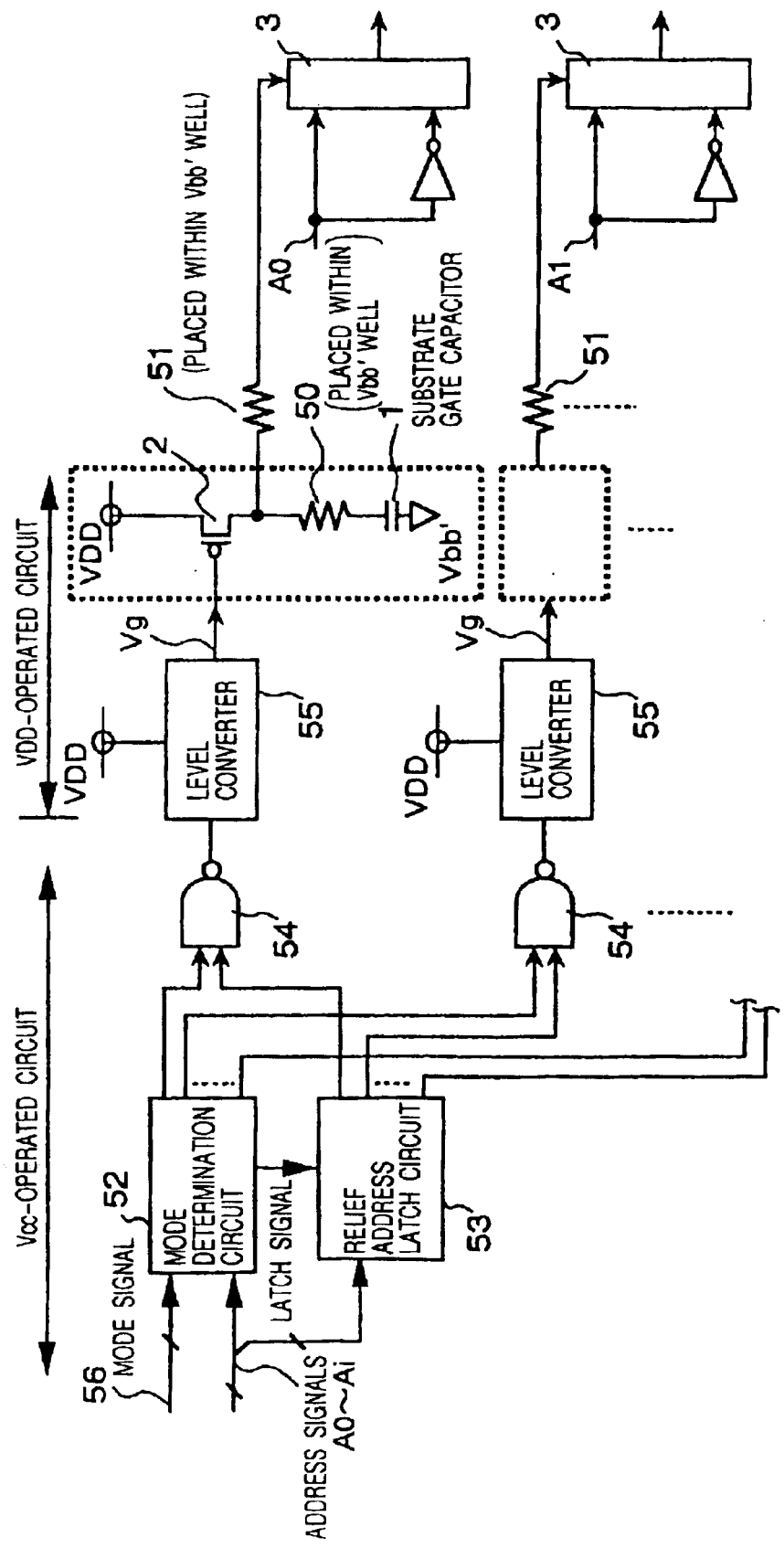
FIG. 10 is a circuit diagram of an antifuse circuit in which a protection resistor and a latch-up prevention resistor for a selection transistor is added to the configuration of FIG. 1.

An example of an antifuse circuit in which a protection resistor and a latch-up prevention resistor for a selection transistor are added to the configuration of FIG. 1, is shown in FIG. 10. In FIG. 10, the selection transistor 2 is configured as a p channel transistor, and a protection resistor 50 and a latch-up prevention resistor 51 for the selection transistor 2 are added. While operating sources or power supplies for the circuit shown in FIG. 10 are manifested as Vbb' and VDD in the circuit, the clearly-expressed sources are set separately from power terminals of other circuits. Operating sources or power supplies for power nonmanifested-circuits are set as Vcc and Vss. A mode determination circuit 52, a relief address latch circuit 53, NAND gates 54, and level converters 55 are provided as circuits for forming break signals Vg. When a program mode for an antifuse 1 is set to the mode determination circuit 52, based on a mode signal 56 (or mode signal 56 or part of address signals), the mode determination circuit 52 causes the relief address latch circuit 53 to latch address data corresponding to each defective bit. Afterwards, the mode determination circuit 52 takes in an address for a fuse to be subjected to dielectric breakdown, which is supplied from the outside, and outputs it to its corresponding NAND gate 54 in bit-correspondence form. Address data are shown in the drawing as A0 through Ai respectively. When an address outputted from the mode determination circuit 52 and an address outputted from the relief address latch circuit coincide with each other with both as a high level, the outputs of their corresponding NAND gates 54 are respectively brought to a low level. The output of each NAND gate 54 is converted to the amplitude of the source voltage VDD by its corresponding level converter S5. The converted signal is supplied to the gate electrode of its corresponding selection transistor 2 as the break signal Vg. The break signal Vg is brought to a low level in response to the low level (logical value "0") of the corresponding NAND gate 54, whereby a breakdown voltage VDD is applied to its corresponding antifuse 1 used as a substrate gate capacitor. Thus, the antifuse 1 undergoes an electrical breakdown.

Although not restricted in particular, the source voltage VDD and the substrate bias voltage Vbb' are respectively set to Vcc and Vss after the antifuse 1 has been programmed.

From the above, the corresponding address bit Ai at the time that the fuse 1 undergoes the electrical breakdown, is of a high level (logical value "0"). This relationship is identical to the case shown in FIG. 1. In FIG. 10, a selector 3 is provided at the drain of each selection transistor 2 in a manner similar to FIG. 1. A relief determining operation at the normal operation subsequent to the antifuse 1 being programmed is identical to the contents described in FIG. 1. Namely, when access addresses of memories having finished the program processing of the antifuses 1 are respectively equal to the defective or faulty addresses A0 through Ai to be relieved, the outputs of the selectors 3 corresponding to the respective bits are all brought to the logical value "1", whereby accesses relative to the addresses to be relieved are detected.

Figure 11:
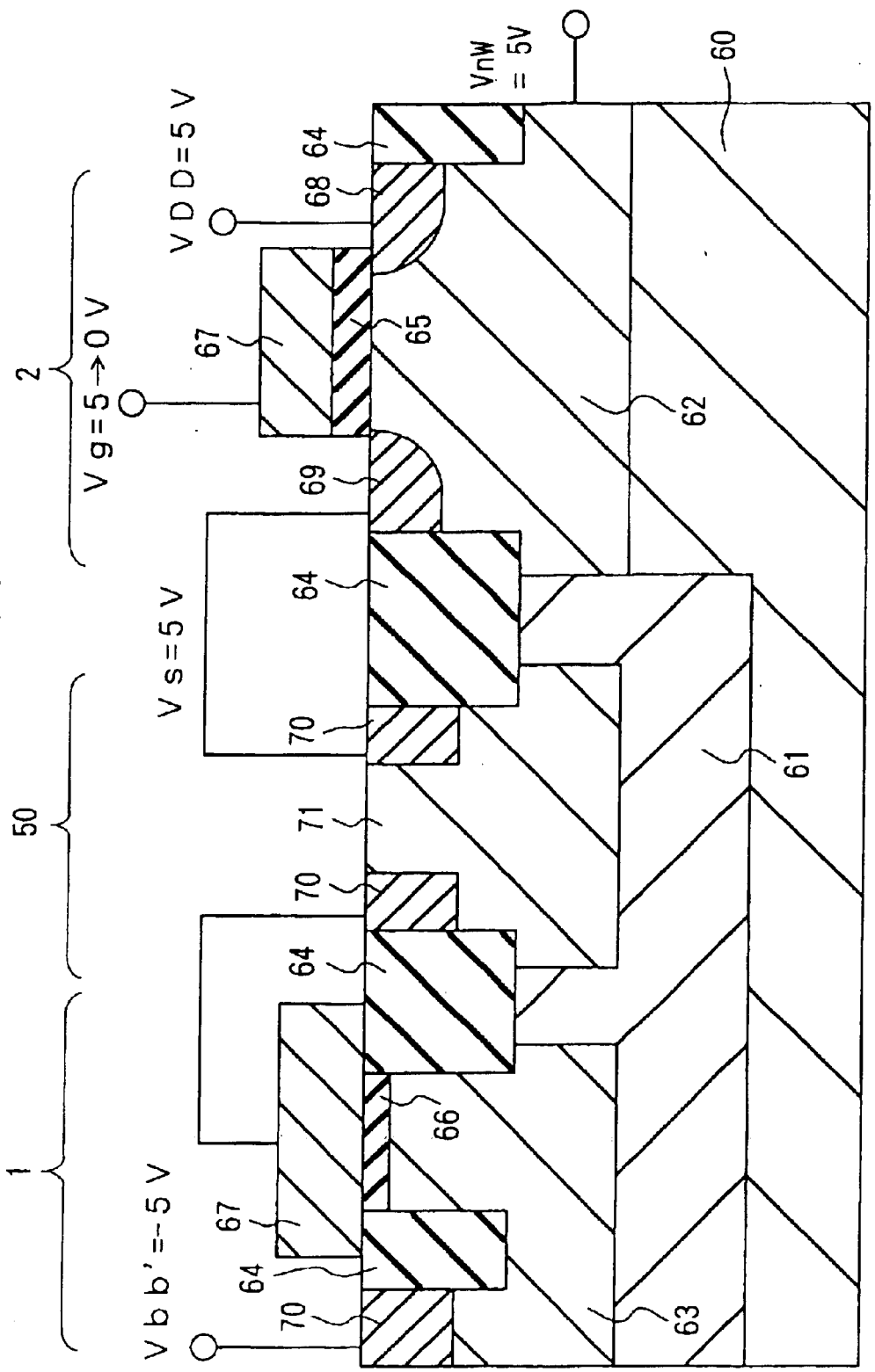
FIG. 11 is a vertical cross-sectional view illustrating, by way of example, a voltage applying condition and a device sectional structure around an antifuse at dielectric breakdown of the antifuse in the circuit shown in FIG. 10.

A voltage applying condition and a device sectional structure around an antifuse at dielectric breakdown of the antifuse in the circuit shown in FIG. 10 are illustrated in FIG. 11 by way of example. In FIG. 11, a deep n-type well region 61 and a shallow n-type well region 62 are formed on a p-type silicon substrate 60. Shallow p-type well regions 63 and 71 are disposed in the deep n-type well region 61. A selection transistor 2, which is separated by element isolating regions 64 and comprises a p-type drain region 68, a p-type source region 69, a gate oxide film 65 and a gate electrode 67, is formed within the shallow n-type well region 62. A substrate gate capacitance oxide film 66 is formed within the shallow p-type well region 63. A substrate gate capacitor, i.e., an antifuse 1 comprises a p-type substrate connecting diffused layer 70 and a gate electrode 67. A protection resistor 50 in which p-type resistance diffused layers 70 are connected using the shallow p-type well region 71, is formed between the gate electrode 67 of the substrate gate capacitor and the p-type source region 69 of the selection transistor 2.

In FIG. 11, the p-type silicon substrate 60 is fixed to a ground potential Vss (=0V), and Vnw=VDD=5V is applied to the shallow n-type well region 61 and the shallow n-type well region 62. After Vbb'=−5V is applied to the p-type substrate connecting diffused layer 70 of the antifuse 1 and the breakdown voltage VDD=5V is applied to the p-type drain region 68 of the selection transistor 2, the break signal Vg=5V outputted from the corresponding level converter 55 shown in FIG. 10 is inputted to the gate electrode 67. Thus, Vb'=−5V is applied to one capacitance electrode of the antifuse 1 and VDD=5V is applied to the other capacitance electrode, so that the substrate gate capacitance oxide film 66 is brought into dielectric breakdown.

In the example illustrated in FIG. 11, the thickness of the oxide film 46 of the antifuse 1 is set as 4.5 nm and formed thinner than that of the gate oxide film 65 with a view toward facilitating its dielectric breakdown. Even in the case where the thickness of the gate oxide film employed in the normal DRAM process is 7 nm, its gate breakdown withstand voltage is about 11V. Therefore, if Vbb'=−7V is applied to the p-type substrate connecting diffused layer 50 of the antifuse 1 even when the thickness of the oxide film 66 of the antifuse 1 is set to 7 nm in a manner similar to the gate oxide film 65, a similar dielectric breakdown operation is allowed.

<<Flip-chip Type DRAM>>

Figure 12:
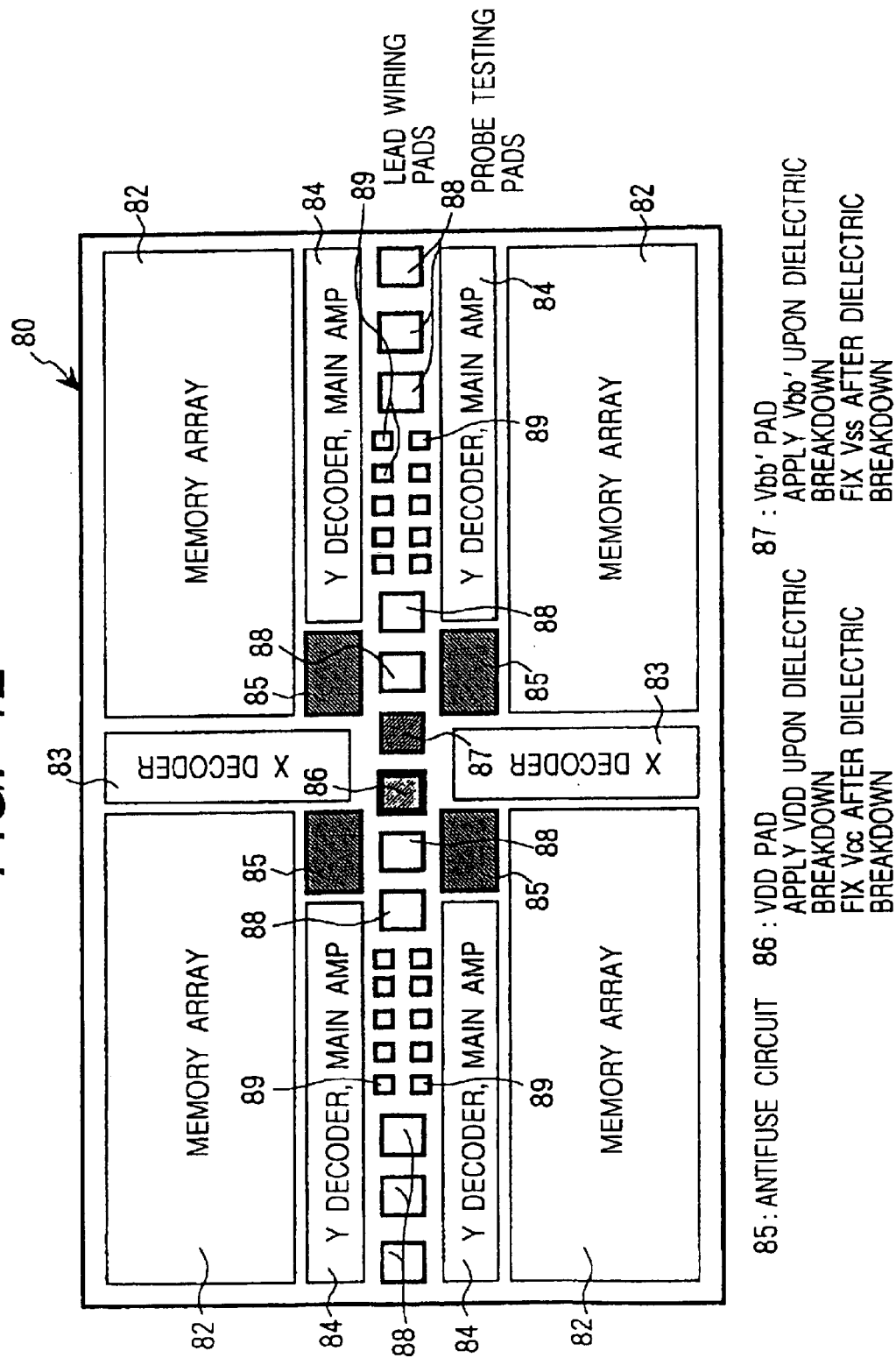
FIG. 12 is a plan view showing a DRAM chip of a flip-chip type DRAM indicative of another example of a semiconductor integrated circuit according to the present invention.

A DRAM chip for a DRAM (hereinafter called also simply a "flip-chip type DRAM") of a flip-chip type indicative of another example of a semiconductor integrated circuit according to the present invention is shown in FIG. 12. In a DRAM chip 80 shown in the same drawing, antifuse circuits are used to relieve faulty or defective bits.

Although not restricted in particular, the DRAM chip 80 has 64 Mbit memory arrays 84 corresponding to four blocks, which are provided on a semiconductor substrate. Further, the DRAM chip 80 has X decoders (row decoders) 83 set every pairs of memory arrays 82, and peripheral circuits such as Y decoders (column decoders) and main amplifiers 84 set every memory blocks 82. Antifuse circuits 85 each comprised of an antifuse 1 used as a substrate gate capacitor are provided in association with the respective memory arrays 82. Power pads 86 and 87 for the antifuse circuits 85 are disposed in the central portion of the semiconductor substrate. 80×80 $\mu m^2$ metal pads 88 for probe testing are provided outside the power pads. Further, 40×40 $\mu m^2$ metal pads 89 for taking or pulling out relocation wirings (lead wires) to bump electrodes are provided. The antifuse circuits 85 can adopt the antifuse circuits shown in FIGS. 1 and 10 respectively. A program mode is set based on a mode signal or the like in the same manner as described above. The antifuse circuit may enter the program mode by use of a WCBR (for enabling a write enable signal WE and a column-address-strobe signal CAS prior to a row-address-strobe signal RAS being enabled) test mode and part of address signals in a DRAM.

The power pad 86 is a power pad to which a breakdown voltage VDD (=5V) is applied upon breakdown of the antifuse 1 and a source voltage Vcc (=3.3V) is applied upon the normal operation. Upon breakdown of the antifuse 1 (substrate gate capacitor), the other power pad 87 is supplied with its substrate voltage Vbb' (=−5V) and is fixed to a ground potential Vss (=0V) upon the normal operation.

FIGS. 13 through 16 are respectively chip plan views showing required process steps up to the acquisition of a flip-chip type DRAM by use of the DRAM chip 80.

Figure 13:
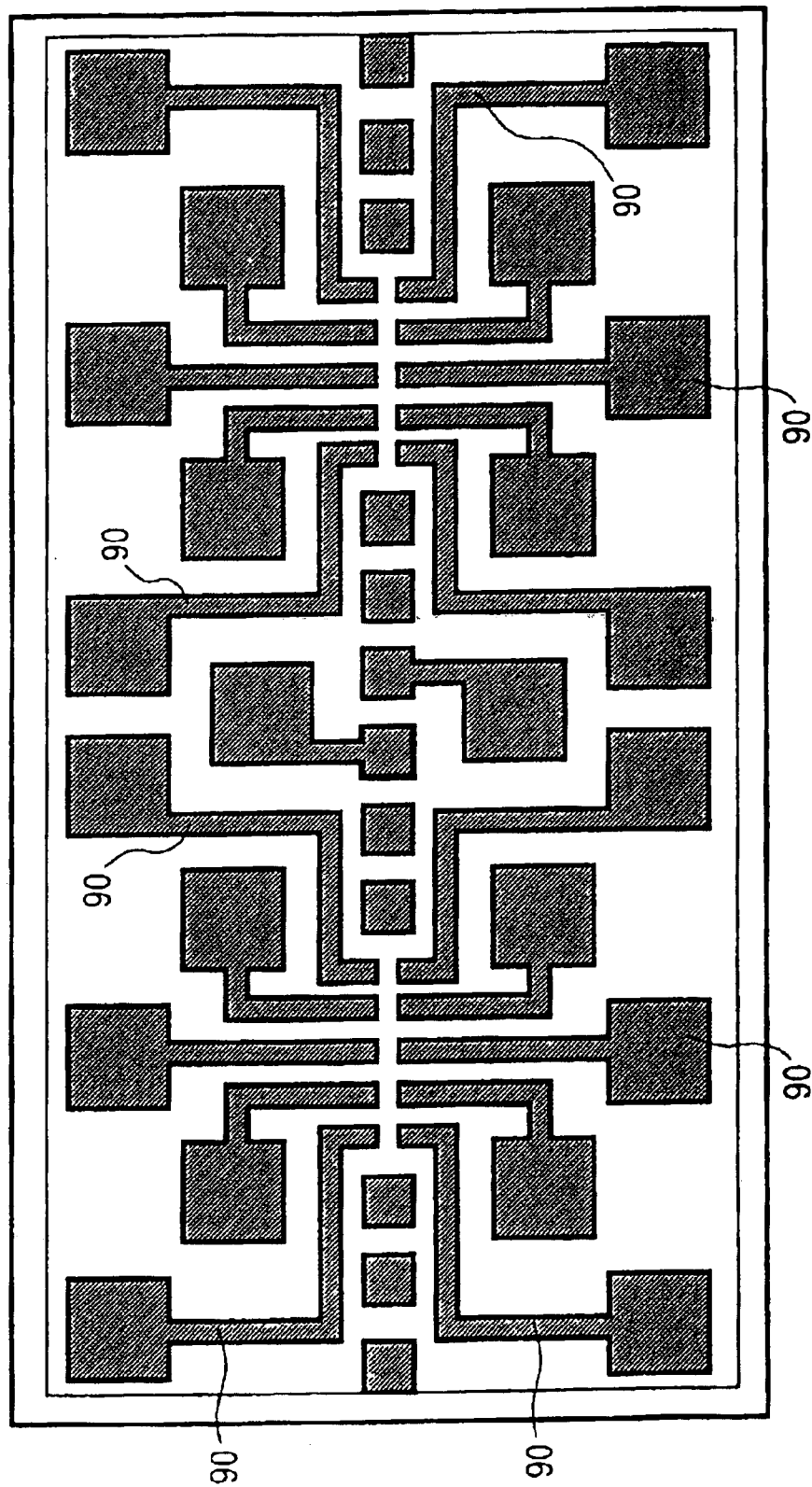
FIG. 13 is a chip plan view illustrating an initial manufacturing process used when a flip-chip type DRAM is obtained using the DRAM chip shown in FIG. 12.

First of all, relocation wirings (lead wires) 90 illustrated in FIG. 13 by way of example are patterned on the wafer-shaped DRAM chip shown in FIG. 12. Namely, a third layer aluminum wring is formed on the DRAM chip 80 shown in FIG. 12, and a passivation film comprised of a 0.5 μm-thick oxide film and a 1 μm-thick plasma nitride film is formed over the third aluminum wiring. A photosensitive polymer membrane or film having a thickness of 10 μm is applied over the passivation film. Openings are defined in association with the positions of the bonding pads designated at numerals 86, 87, 88 and 89 so as to expose up to the third layer aluminum wiring. Afterwards, copper having a thickness of 1 μm is deposited by a sputtering method and the relocation wirings 90 are patterned on the DRAM chip as shown in FIG. 13.

Figure 14:
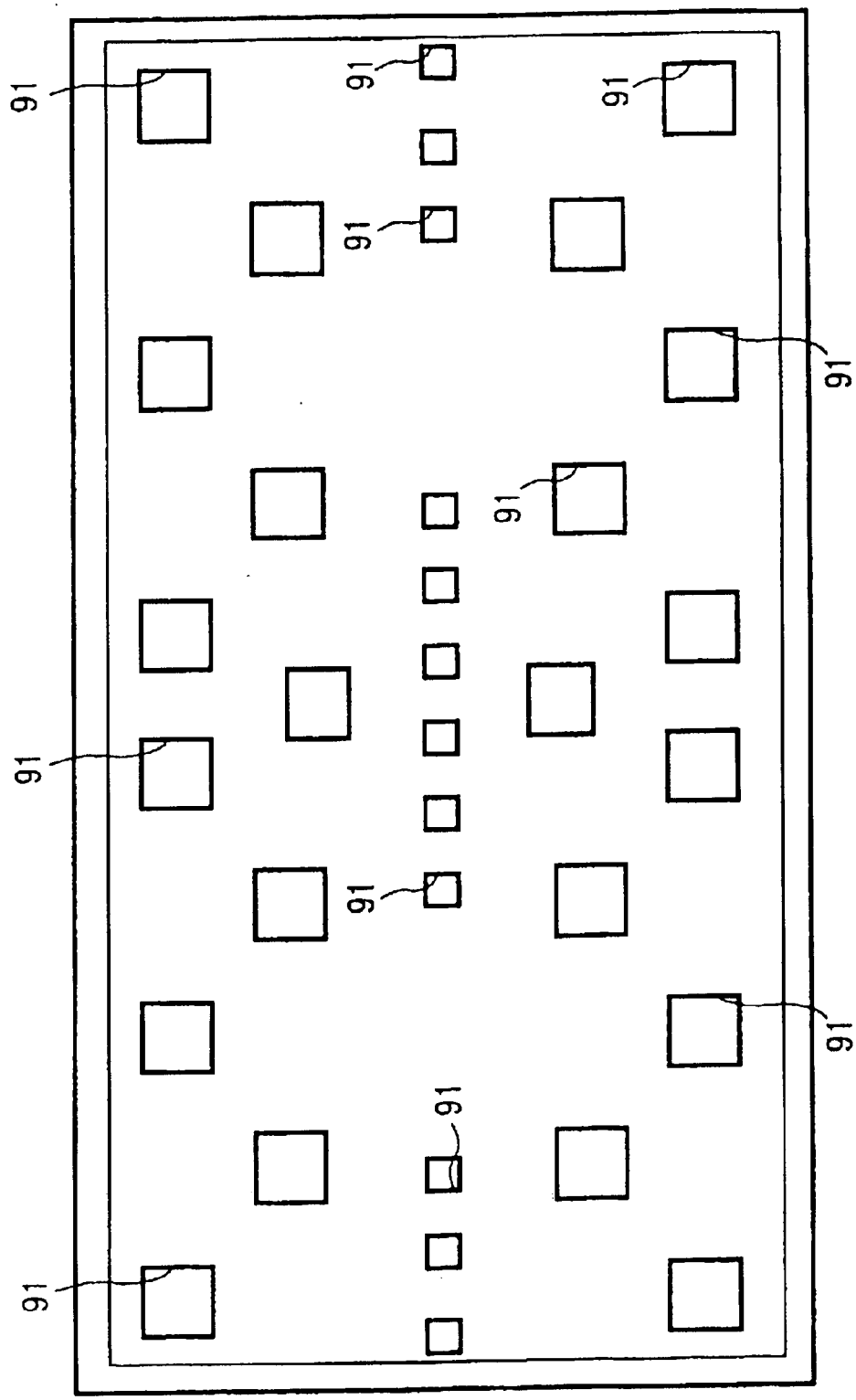
FIG. 14 is a chip plan view depicting a next manufacturing process following FIG. 13.

Next, as shown in FIG. 14, a resin having a thickness of 3 μm is applied onto the relocation wirings 90, and pad open holes 91 are defined only in areas in which solder bump electrodes are displaced, and areas for bringing probes for probe inspection into contact therewith.

Figure 15:
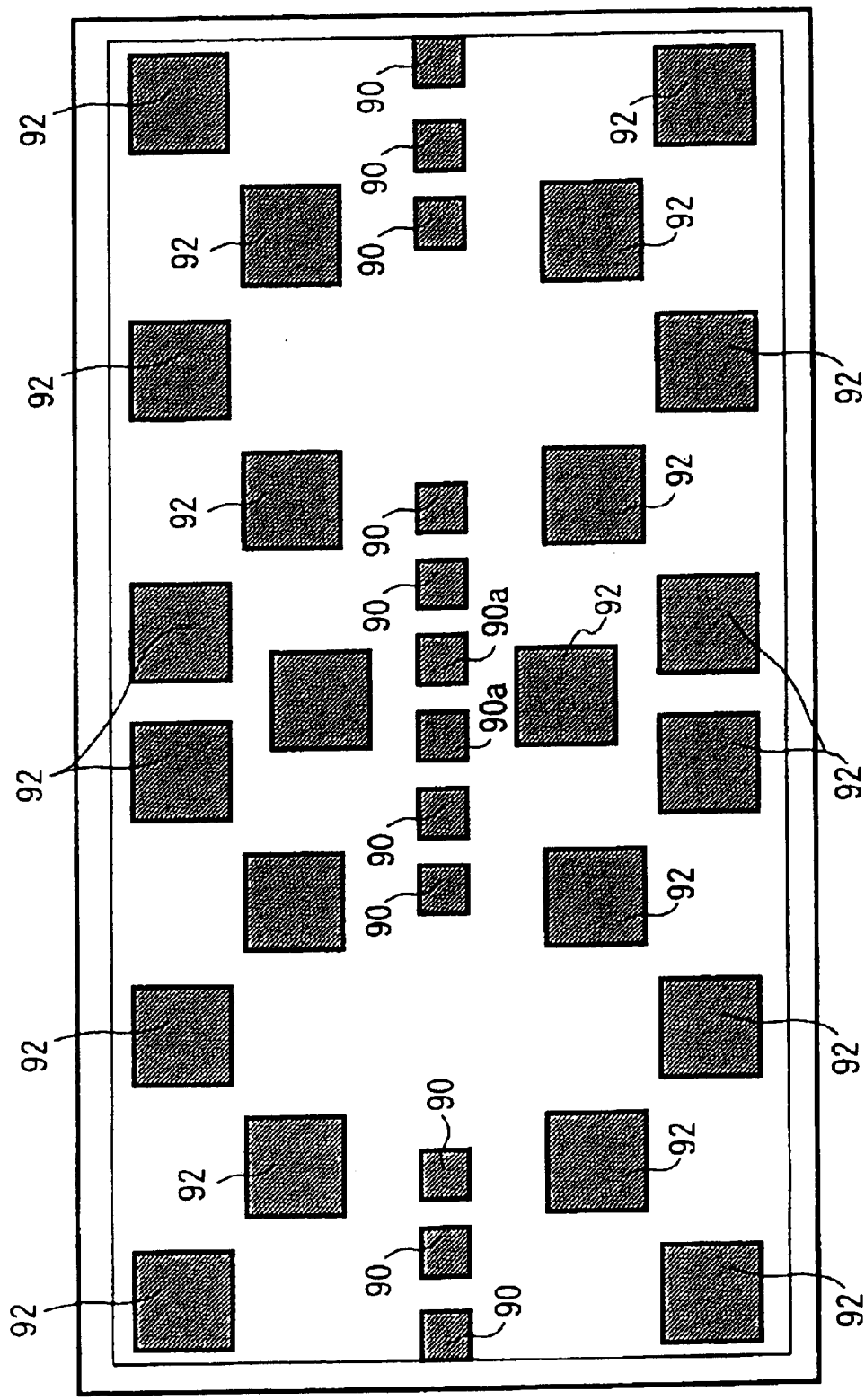
FIG. 15 is a chip plan view showing a next manufacturing process following FIG. 14.

Further, a Cr film having a thickness of 0.3 μm is deposited by the sputtering method and patterned to thereby form barrier layers (under metal layers) 92 for the solver bump electrodes as shown in FIG. 15. The barrier layer 92 functions as a barrier layer for blocking the generation of an intermetallic compound by a reaction between tin (Sn) and copper (Cu) contained in each solder bump electrode. Reference numerals 90 and 90a respectively indicate relocation wirings exposed from the pad open holes 91, which in turn are used as the pads for probe testing as described above. In particular, the relocation wirings 90a are used to supply the voltages VDD and Vbb' for programming the antifuse 1.

Figure 16:
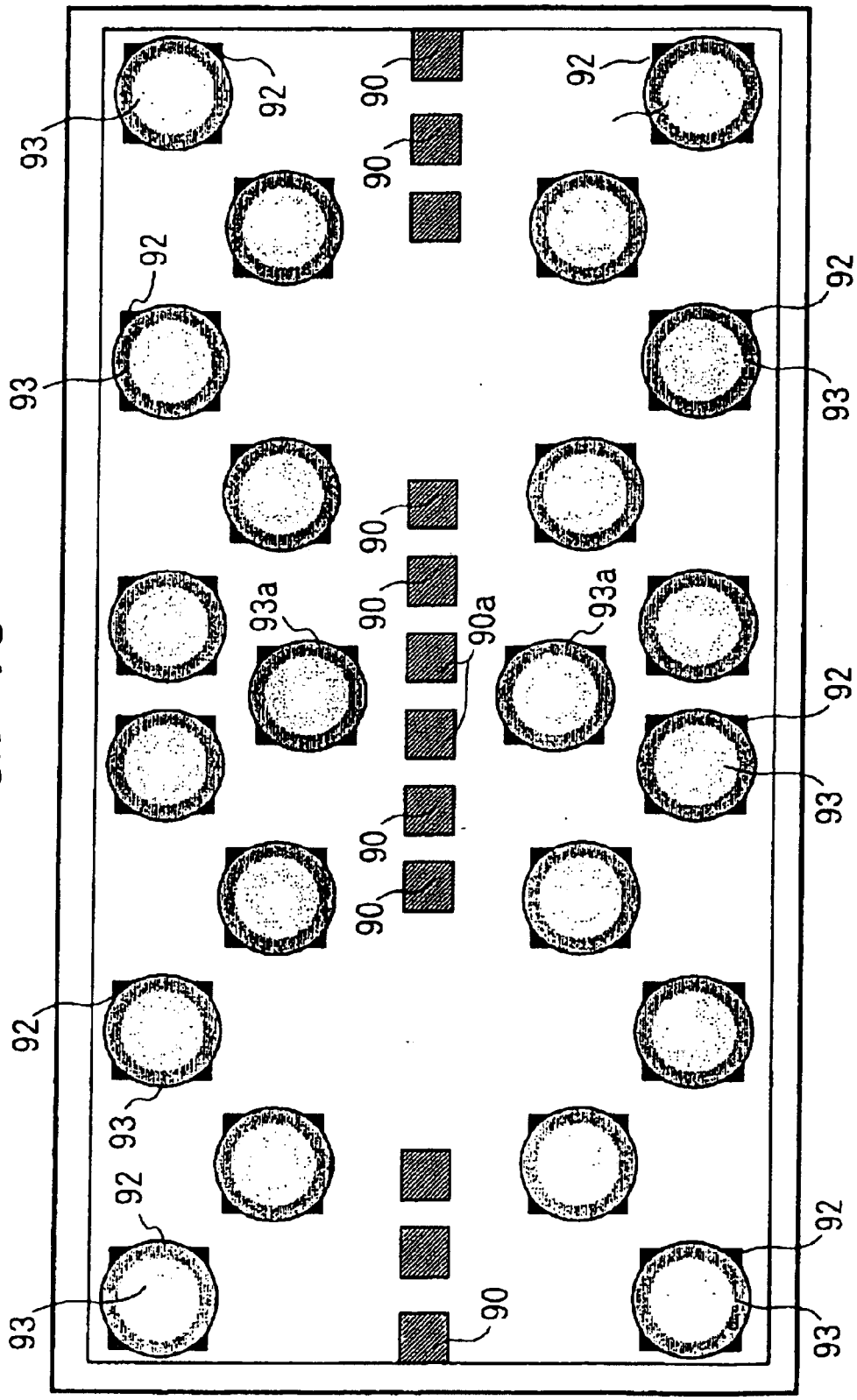
FIG. 16 is a chip plan view illustrating a next manufacturing process following FIG. 15.

Finally, as shown in FIG. 16, solder bump electrodes 93 and 93a each having a diameter of 200 μm, for example, are formed on their corresponding barrier layers 92, and a wafer process for the flip-chip type DRAM is completed. The solder bump electrodes 93a are respectively electrodes for forcedly bringing terminals for applying the voltages VDD and Vbb' used to program the antifuse 1 to the source voltage Vcc and the ground voltage Vss. Afterwards, a probe test, and relieving and selecting tests based on the breakdown of the substrate gate capacitor (antifuse) 1 are executed. Finally, the cutting of chips from the wafer is carried out. The cut-out flip-chip type DRAMs are face-down bonded onto a printed circuit board and the injection and curing of a filler are effected thereon, whereby products are brought to completion. When the product is implemented on the substrate, the pairs of solder bump electrodes 93a are connected to their corresponding power wirings for the source voltage Vcc and the ground voltage Vss.

Figure 17:
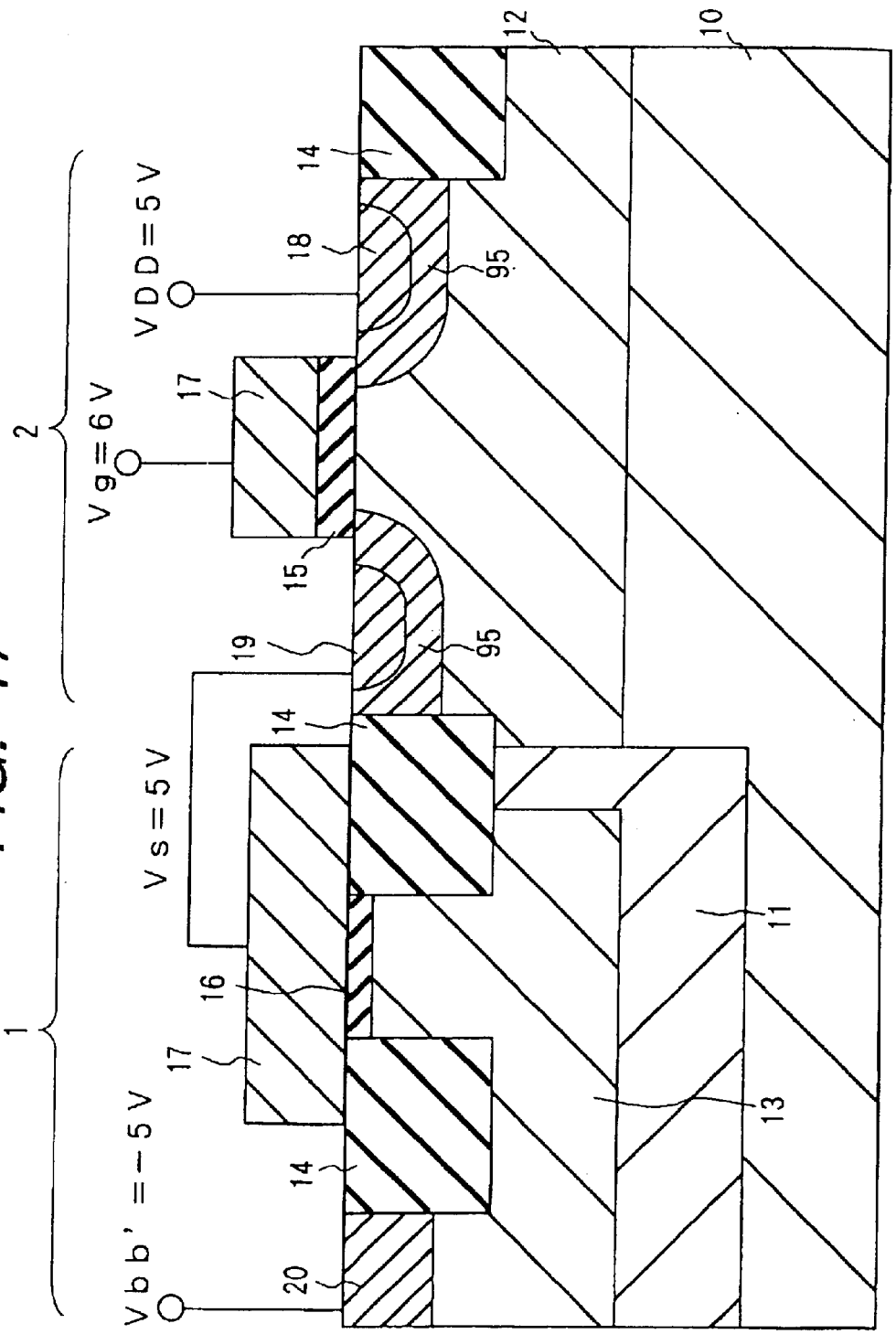
FIG. 17 is a vertical cross-sectional view depicting a principal portion of an antifuse circuit employed in the flip-chip type DRAM shown in FIG. 12.

A vertical cross-section of a principal portion of the antifuse circuit 85 employed in the flip-chip type DRAM is shown in FIG. 17. A deep n-type well region 11 is formed on a p-type silicon substrate 10, and a shallow p-type well region 13 is formed inside the deep n-type well region 11. A shallow p-type well region 12 is formed next to the deep n-type well region 11. A selection transistor 2 separated by element isolating regions 14 and comprising n-type low-concentration source/drain regions 95, an n-type drain region 18, an n-type source region 19, a gate oxide film 15 and a gate electrode 17 employed in a cell transistor of a DRAM memory cell is provided in a surface region of the shallow p-type well region 12. An antifuse 1 separated by element isolating regions 4 and comprised of a gate capacitance oxide film 16, a gate capacitance electrode 17 and a p-type substrate connecting diffused layer 20 is provided in a surface region of the shallow p-type well region 13. The gate capacitance electrode 17 is connected to the n-type source region 19 of the selection transistor 2. Owing to the provision of the n-type low-concentration source/drain regions 95 in the selection transistor 2, a source/drain withstand voltage can be improved from 7V to 10V, thereby making it possible to improve the reliability of the transistor.

<<Flip-chip Type System LSI>>

Figure 18:
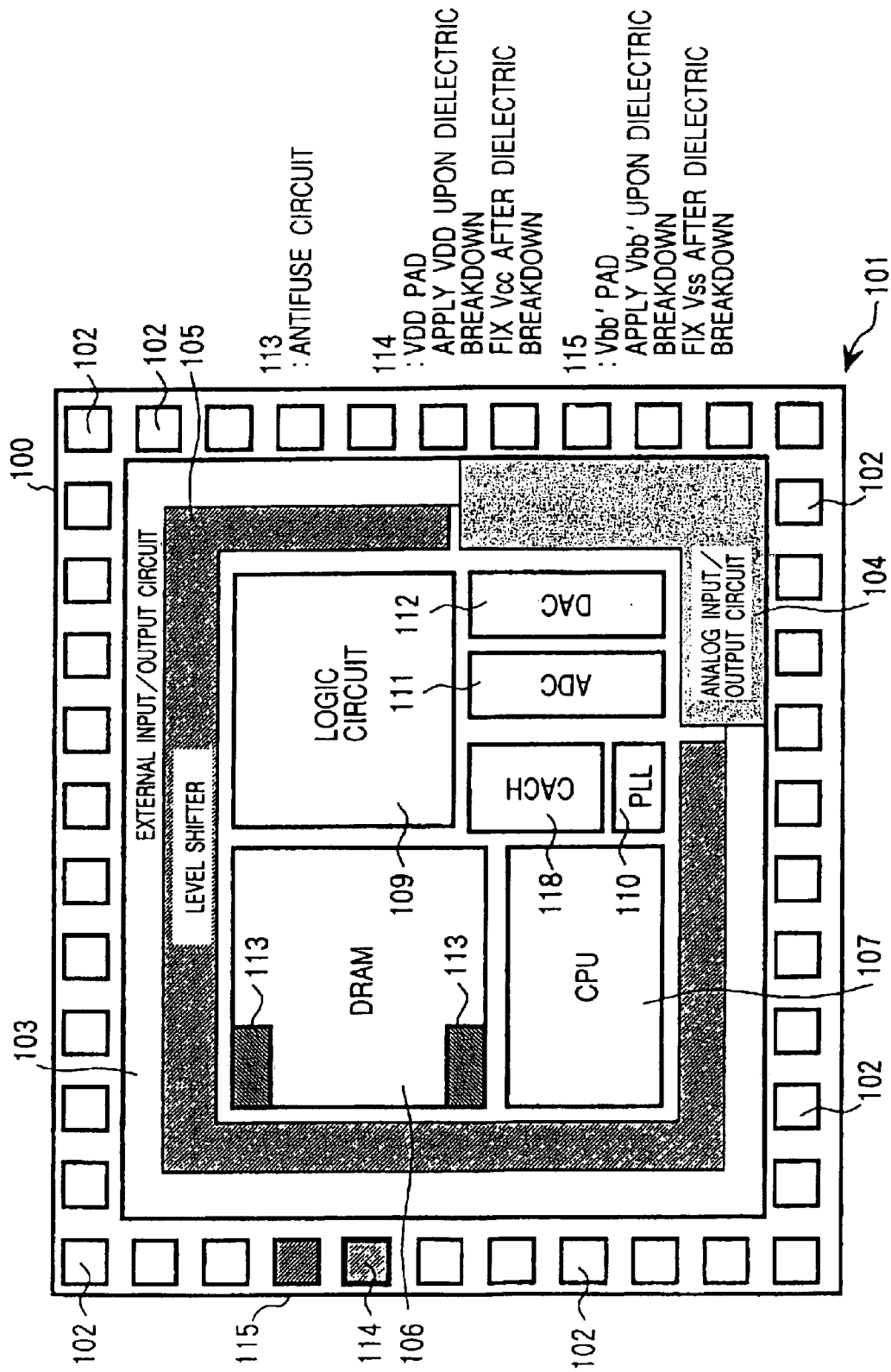
FIG. 18 is a functional block diagram of a flip-chip type system LSI according to a third example of a semiconductor integrated circuit of the present invention.

A function block diagram of a flip-chip type system LSI according to a third example of a semiconductor integrated circuit of the present invention is shown in FIG. 18. Although not restricted in particular, the system LSI 101 shown in the same drawing has a large number of pads 102 such as probe testing metal pads, metal pads for taking out relocation wirings (lead wires) to bump electrodes, etc. all of which are disposed at the peripheral edge of a semiconductor substrate 100. An external input/output circuit 103 and an analog input/output circuit 104 are provided inside an area for the pads 102. The external input/output circuit 103 and the analog input/output circuit 104 use an external power supply relatively high in level, like 3.3V as an operating power supply. A level shifter 105 reduces the external power supply to an internal source voltage like 1.8V. A dynamic random access memory (DRAM) 106, a central processing unit (CPU) 107, a cache memory (CACH) 108, a logic circuit (LOG) 109, a phased-locked loop (PLL) 110, an analog-digital converter (ADC) 111, and a digital-analog converter (DAC) 112 are provided inside the level shifter 105. Reference numerals 113 respectively indicate antifuse circuits, which are used to relieve the defect or malfunction of the DRAM 106. The DRAM 106, CPU 107, LOG 109 and CACH 108 are activated with the internal source voltage like 1.8V supplied from the level shifter 105 as an operating power supply. However, the DRAM 106 boosts the internal source voltage to form a word line selecting level and uses the boosted voltage as an operating power supply for a word driver or the like.

In FIG. 18, designated at numerals 114 and 115 are respectively power pads dedicated for the antifuse circuits 113. The power pad 114 is a power pad to which a breakdown voltage VDD (=5V) is applied upon breakdown of the antifuse 1 and to which a source voltage Vcc (=3.3V) is applied upon the normal operation. The other power pad 115 is supplied with a substrate voltage Vbb' (=−5V) upon breakdown of the antifuse (substrate gate capacitor) 1 and is fixed to a ground potential Vss (=0V) upon the normal operation.

Figure 19:
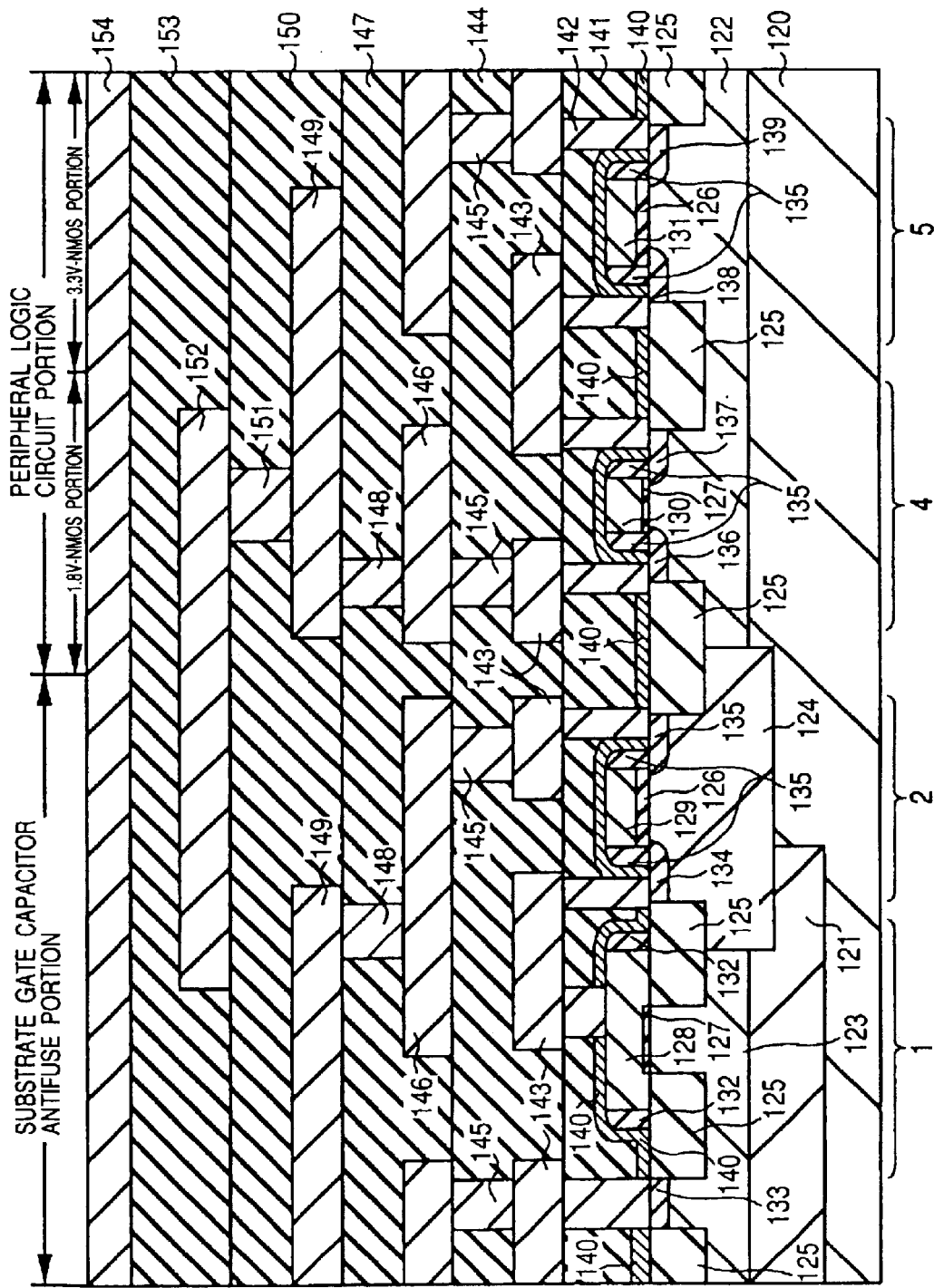
FIG. 19 is a vertical cross-sectional view showing a device structure for antifuse circuits, a logic circuit and an external input/output circuit shown in FIG. 18.

A vertical section of a device structure for the antifuse circuits, logic circuit and external input/output circuit shown in FIG. 18 is illustrated in FIG. 19 by way of example.

A deep n-type well region 121 having a depth of 2 μm, a shallow n-type well region 124 having a depth of 1 μm, and shallow p-type well regions 122 and 123 each having a depth of 0.8 μm are disposed on a p-type silicon substrate 120 having a resistivity of 10 Ω cm. A substrate gate capacitor (antifuse) 1 is placed within the shallow p-type well region 123 and is comprised of a thin gate oxide film 127 having a thickness of 4 nm, a p-type substrate connecting diffused layer 130, and a gate electrode 128 which is comprised of an n-type polysilicon film having a thickness of 0.2 μm and has a gate length of 0.3 μm. Within the shallow n-type well region 124, a selection transistor 2 is separated by element isolating regions 125 having a thickness of 0.3 μm and is formed of a p-type drain region 135, a p-type source region 134, a gate oxide film 126 having a thickness of 8 nm, and a gate electrode 129, which is comprised of a p-type polysilicon film having a thickness of 0.2 μm and has a gate length of 1 μm. The gate electrode 128 of the substrate gate capacitor 1 and the p-type source region 134 of the selection transistor 2 are connected to each other by contact plugs 142 with tungsten (W) embedded therein and first layer metal wirings 143.

Within the shallow p-type well region 122, an n channel transistor 4 operated at a source voltage of 1.8V is separated by its corresponding element isolating regions 125 and formed of an n-type drain region 137, an n-type source region 136, a thin gate oxide film 127 having a thickness of 4 nm, and a gate electrode 130 which is comprised of an n-type polysilicon film having a thickness of 0.2 μm and has a gate length of 0.2 μm.

Also within the shallow p-type well region 122, an n channel transistor 5 is separated by its corresponding element isolating regions 125 and formed of an n-type drain region 139, an n-type source region 138, a thick gate oxide film 126 having a thickness of 8 nm, and a gate electrode 131 which is comprised of an n-type polysilicon film having a thickness of 0.2 μm and has a gate length of 0.4 μm.

A 100 nm-thick silicon nitride film 140 deposited by a CVD method is disposed over the transistors 4 and 5 for the purpose of self-alignment contact formation. Contact plugs 142 and first metal wirings 143 comprised of a 0.5 μm-thick aluminum film both of which are provided at desired positions of a 1 μm-thick contact interlayer film 141 flattened by a CMP method, first interlayer plugs 145 and second layer metal wirings 146 comprised of the 0.5 μm-thick aluminum film both of which are provided at desired positions of a 1 μm-thick first interlayer film 144 flattened by the CMP method, a second interlayer plug 148 and a third layer metal wiring 149 comprised of the 0.5 μm-thick aluminum film both of which are provided at desired positions of a 1 μm-thick second interlayer film 147 flattened by the CMP method, a third interlayer plug 151 and a fourth layer metal wiring 152 comprised of a 1 μm-thick aluminum film both of which are provided at desired positions of a third interlayer film 150 having a thickness of 0.8 μm, a fourth interlayer film 153 having a thickness of 0.8 μm, and a fifth layer metal wiring 154 comprised of an aluminum film having a thickness of 1 μm are disposed over the transistors 4 and 5.

In the system LSI 101, the thickness of the gate oxide film of each MIS transistor is classified into two types as described above. Circuits, each of which needs to ensure some withstand voltage (voltage withstanding breakdown of gate oxide film) with respect to the operating voltage of the MIS transistor, e.g., the external input/output circuit 103, analog input/output circuit 104, DRAM 106, ADC 111 and DAC 112 are not restricted in particular but include MIS transistors each having a gate length of 0.4 μm and a gate oxide film thickness of 8 nm when a 0.2 μm process technology is used. On the other hand, circuits each using a deboosted relatively low internal voltage as an operating source or power supply, i.e., the logic circuit 109, cache memory 108, and CPU 107 comprise MIS transistors each having a gate length of 0.2 μm and a gate oxide film thickness of 4 nm. Although not restricted in particular, the level shift circuit 105 includes MIS transistors having both gate oxide film thicknesses. The antifuse 1 makes use of a gate oxide film of 4 nm and has been considered so as to avoid the utilization of a voltage excessively high in level for the purpose of dielectric breakdown.

<<Relieving Circuit of DRAM>>

One example of a specific circuit configuration for relieving defective bits of the DRAM employed in the system LSI shown in FIG. 18 will be described.

Figure 20:
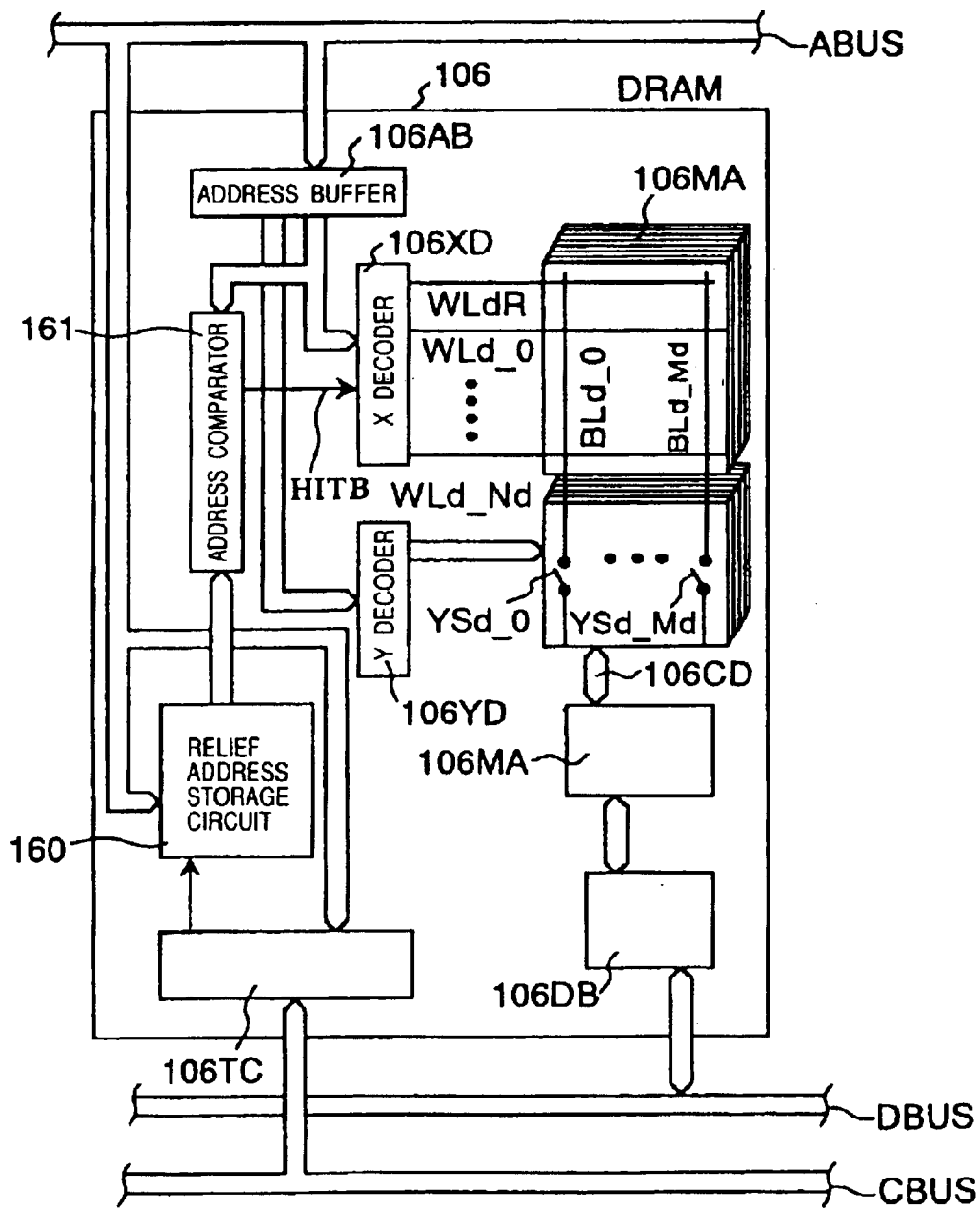
FIG. 20 is a block diagram illustrating one example of a DRAM 106 built in the flip-chip type system LSI shown in FIG. 18.

One example of the DRAM 106 is shown in FIG. 20. The DRAM 106 is a relatively large-capacity readable/writable memory utilized as a work memory or a main memory of a CPU 107. The DRAM 106 has a large capacity like, e.g., a few GHz according to an increase in the scale of the system. Each of memory cell arrays 106MA of the DRAM 106 has a redundant word line WLdR in addition to normal word lines WLd_0 through WLd_Nd. Selection terminals of normal dynamic memory cells are connected to their corresponding normal word lines WLd_0 through WLd_Nd, and selection terminals of redundant dynamic memory cells are connected to the redundant word line WLdR. Data input/output terminals of the memory cells are connected to their corresponding bit lines BLd_0 through BLd_Md. Although not illustrated in the drawing in particular, the bit lines BLd_0 through BLd_Md have folded bit-line structures folded back with a sense amplifier as the center. The bit lines BLd_0 through BLd_Md are commonly connected to a common data line 106CD through Y selectors YSd_0 through YSd_Md.

One of the word lines WLd_0 through WLd_Nd and the redundant word line WLdR is selected by an X decoder 106XD. One of the Y selectors YSd_0 through YSd_Md is turned on by a decode output of a Y decoder 106YD. It should be understood that the memory cell array 106MA and the Y selectors YSd_0 through YSd_Md are provided as N sets as viewed in the obverse and reverse directions of the paper in FIG. 20. Thus, when selecting operations are carried out by the X decoder 106XD and the Y decoder 106YD, the input/output of data is effected on the common data line 106CD in N-bit units. Write data is supplied a data buffer 106DB from a data bus DBUS. In accordance with the input data, the main amplifier 106MA drives one bit line through the common data line 106CD. Upon a data read operation, the main amplifier 106MA amplifies read data transferred from the corresponding bit line to the common data line 106CD and outputs it from the data buffer 106DB to the data bus DBUS.

Which word line of the normal word lines WLd_0 through WLd_Nd should be replaced with the redundant word line WLdR for the purpose of its selection is determined by relief information stored in a relief address storage circuit 160. While the details thereof will be described later, the relief address storage circuit 160 has the antifuse circuits 113 corresponding to the number of bits necessary to store relief addresses.

The relief information stored in the relief address storage circuit 160 is supplied to an address comparator 161. When the relief information outputted from the relief address storage circuit 160 is effective or valid, the relief information is compared with a row address signal outputted from an address buffer 106AB by the address comparator 161. When they are found to coincide with each other, a detection signal HITB is brought to a logical value "0" (low level). Except when they coincide with each other, the detection signal HITB is brought to a logical value "1" (high level). The X decoder 106XD and the Y decoder 106YD are supplied with address signals on an address bus ABUS through the address buffer 106AB and decode the supplied address signals, respectively. Particularly when the detection signal HITB supplied from the address comparator 161 is of the logical value "1" that means inconsistency, the X decoder 106XD decodes the row address signal outputted from the address buffer 106AB. On the other hand, when the detection signal HITB is of the logical value "0" that means consistency, the decoding of the row address signal outputted from the address buffer 106AB is prohibited and the X decoder 106XD selects the redundant word line WLdR as an alternative to it. Thus, a memory access related to each defective word line is replaced by a selecting operation of a redundant memory cell related to the redundant word line WLdR.

A timing controller 106TC performs internal timing control of the DRAM 106. The timing controller 106TC is supplied with strobe signals such as a read signal and a write signal, etc. from the CPU 107 through a control bus CBUS and supplied with address signals corresponding to plural bits, which are regarded as memory selection signals, from the address bus ABUS. When the timing controller 106CT detects the operation selection of the DRAM 106, the circuits such as the X decoder 106XD, etc. are activated. When the read operation is specified by the read signal, information stored in a memory cell selected in the memory cell array 106MA is outputted to the data bus DBUS through the main amplifier 106MA and the data buffer 106DB. When the write operation is specified by the write signal, data inputted via the data buffer 10DB and the main amplifier 106MA is written into the corresponding memory cell selected in the memory cell array 106MA.

Figure 21:
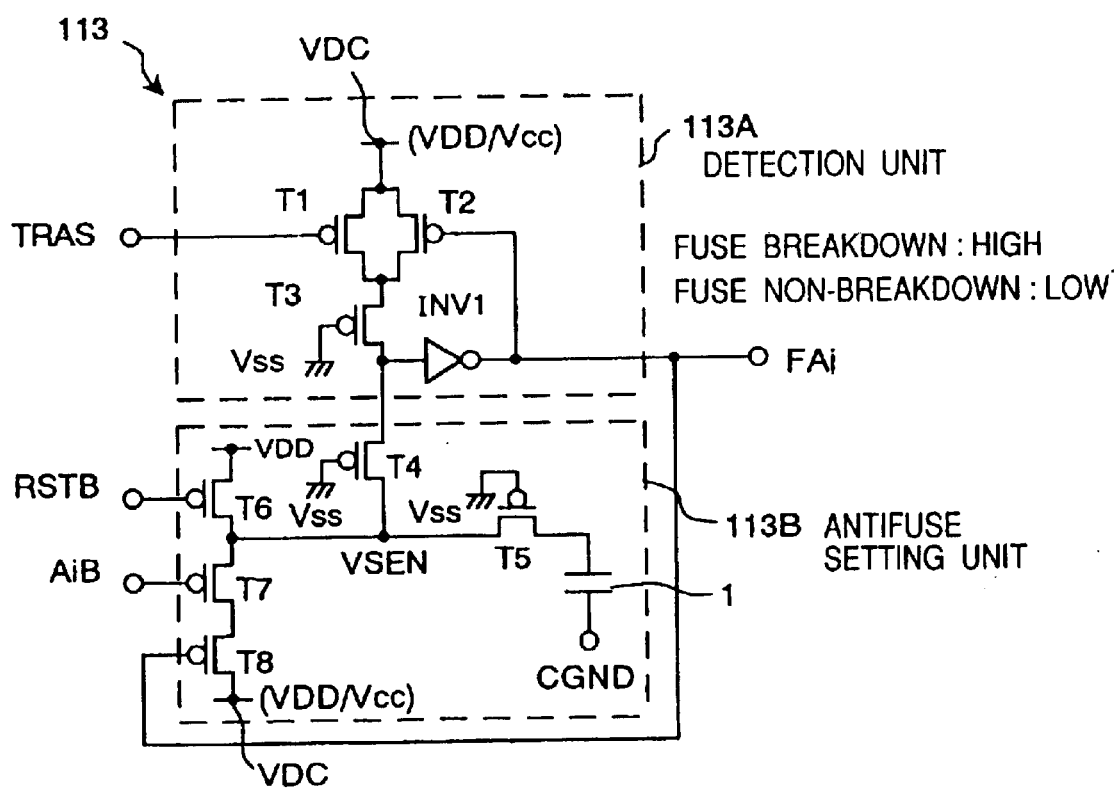
FIG. 21 is a circuit diagram depicting one example of the antifuse circuit corresponding to one bit, which is employed in a relief address storage circuit.

One example of the antifuse circuit 113 corresponding to one bit, which is employed in the relief address storage circuit 160, is shown in FIG. 21. The antifuse circuit 113 has a detection unit 113A and an antifuse setting unit 113B. One capacitance electrode of an antifuse 1 like the substrate gate capacitor is connected t a terminal CGND connected to the power pad 115, whereas the other capacitance electrode thereof is connected to a node VSEN through a p channel transistor T5. −5V is applied to the terminal CGND upon dielectric breakdown of the antifuse 1, and 0V is applied thereto upon the normal operation. The gate of the transistor T5 is connected to a ground voltage VSS and blocks the transfer of a negative voltage applied to the terminal CGND upon dielectric breakdown of the antifuse 1 to the node VSEN side.

The voltage VDD is applied to the node VSEN through a p channel transistor T6. Further, the voltage VDD is applied thereto through a series circuit which comprises p channel transistors T7 and T8. The transistor T6 is turned on according to a low level (reset instruction level) of a reset signal RSTB, whereas the transistor T7 is turned on by a low level (selection level) of a select signal AiB of an antifuse 1. The transistor T8 is switch-controlled in response to the feedback of a detection signal FAi of the detection unit 113A.

In the detection unit 113A, p channel transistors T4 and T3 are series-connected to the node VSEN. The transistor T3 is connected to a terminal VDC through a pair of p channel transistors T1 and T2 connected in parallel form. The terminal VDC is connected to the power pad 114. The gate electrode of the transistor T1 is supplied with an internal control signal brought to a high level upon the access operation of the DRAM. The gate electrode of the transistor T2 is feed-back connected to the drain of the transistor T3 through an inverter INV1.

While the transistor T4 may be an n channel transistor, its drive capability or power (W/Lg) is set higher than that of the transistor T3 and the input level of the inverter INV1 is adjusted in this condition.

When the antifuse 1 shown in FIG. 21 is brought into dielectric breakdown, the terminal VDC is set to a breakdown voltage VDD like 5V and the terminal CGND is set to a negative substrate bias voltage Vbb' like −5V. Upon the first operation, the reset signal RSTB is temporarily brought to a low level and the node VSEN is initially set to the voltage VDD. The signal TRAS is rendered high in level and the signal AiB is rendered low in level, whereby the output of the inverter INV1 is first set to a low level. In this condition, the node VSEN is supplied with the breakdown voltage VDD through the transistors T7 and T8. Thus, a potential difference of about 10V is developed in one capacitance electrode of the antifuse 1, whereby the antifuse 1 undergoes the electrical breakdown. The antifuse 1 subjected to the dielectric breakdown changes from a high-resistance state to a low-resistance state, so that the voltage applied to the node VSEN is reduced. The inverter INV1 detects it and thereby cuts off the transistor T8, whereby the state of the application of the high voltage to the antifuse 1 is automatically stopped.

Upon the access operation of the DRAM, the terminal VDC is set to 3.3V, the terminal CGND is set to 0V, and the signals RSTB and AiB both hold a high level respectively, whereas the signal TRAS is set to a low level. If the antifuse 1 is already subjected to the dielectric breakdown, then the detection signal FAi is brought to a high level. If not so, then the detection signal FAi is brought to a low level.

Figure 22:
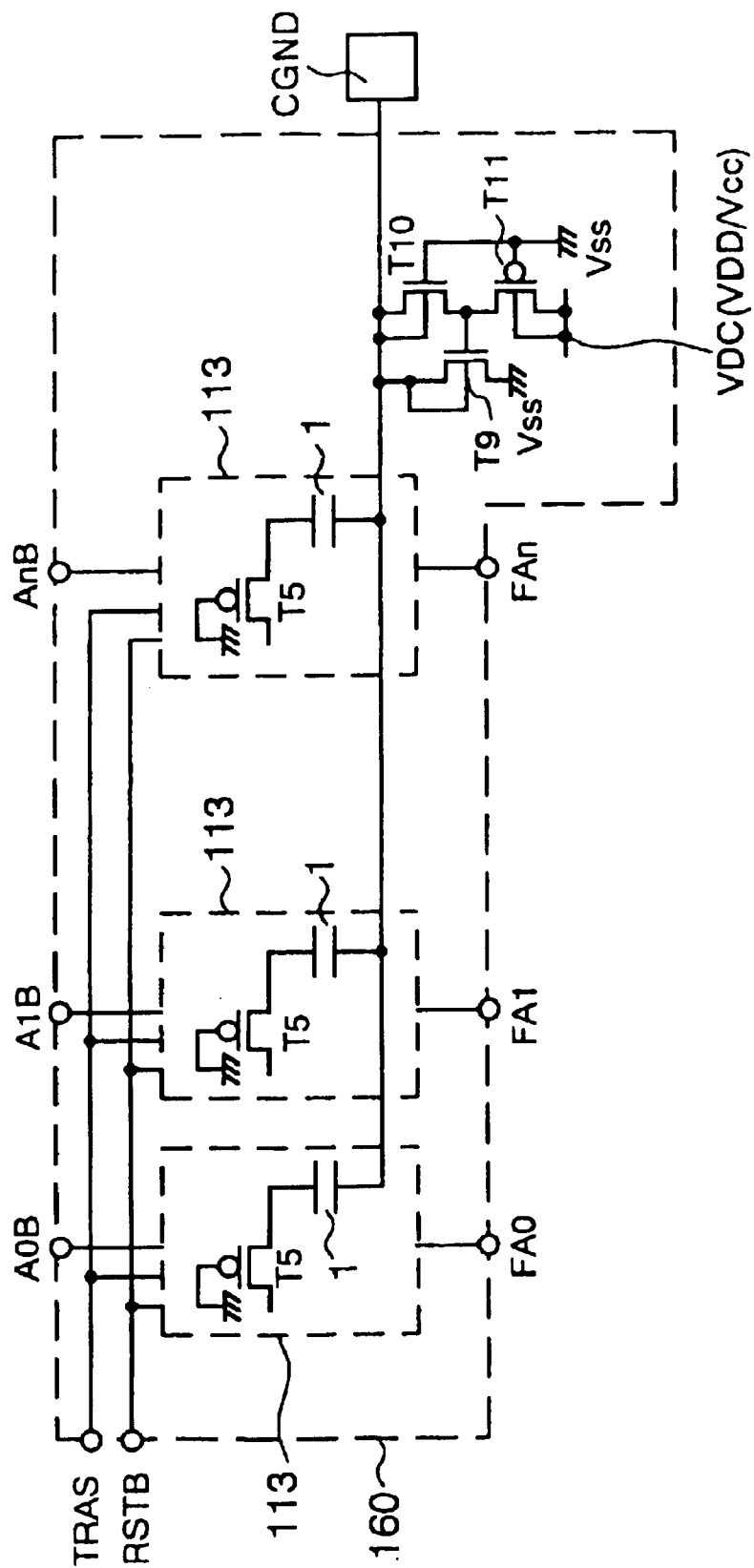
FIG. 22 is a circuit diagram showing one example of a relief address storage circuit using the antifuse circuit shown in FIG. 21.

A circuit configuration for storing one relief address is illustrated in FIG. 22 as one example of an relief address storage circuit 160 using the antifuse circuits 113. The configuration of each antifuse circuit 113 is simplified in its diagrammatic representation. For example, n+1 antifuse circuits 113 are provided. Each individual antifuse circuits 113 are commonly supplied with the signal TRAS and the reset signal RSTB. One capacitance electrodes of respective antifuses 1 are commonly connected to the terminal CGND. Further, the respective antifuse circuits 113 are individually supplied with n+1-bit program address signals A0B through AnB in a bit-correspondence relationship and output n+1-bit signals FA0 through FAn in a bit-correspondence relationship. Each of the bits for the program address signals A0B through AnB corresponds to the selection signal AiB. The program address signals A0B through AnB result in level inverted signals corresponding to respective bits for address signals A0 through An indicative of addresses (failure or defective addresses) to be relieved. Each of the program address signals is supplied from its corresponding external address input terminal in a program mode of each antifuse circuit 113.

In FIG. 22, a circuit, which comprises n channel transistors T9 and T10 and a p channel transistor T11, is a circuit which is capable of externally applying a negative voltage (e.g., −5V) to the terminal CGND common to the large number of antifuse circuits 113 upon a fuse program operation and applies a ground voltage VSS to lines connected to the terminal CGND upon the normal operation for itself. Namely, the transistor T11 is a MIS transistor for applying a voltage VDD level for normally bringing the transistor T9 to an on state to the gate electrode of the transistor T9. The transistor T11 is a MIS transistor whose Lg (gate length) is large and whose internal resistance is high. When the voltage at the terminal CGND drops to a negative voltage, the transistor T10 is turned on so that the voltage applied to the gate of the transistor T9 is brought to a negative voltage near the negative voltage at the terminal CGND, thus turning off the transistor T9. Thus, the power lines connected to the terminal CGND are supplied with a ground voltage VSS according to the turning on of the transistor T9 upon the normal operation, and the reverse flow of a current from the ground voltage VSS to the negative voltage at the terminal CGND is prevented upon a program operation of each antifuse 1.

According to the circuits shown in FIGS. 21 and 22, the antifuse 1 of the antifuse circuit 113 corresponding to each low-level bit of the program address signals A0B through AnB is brought into dielectric breakdown upon the program operation of the antifuse 1. Each of the signals FA0 through FAn outputted in response to the program state results in the intended address signal to be relieved.

Figure 23:
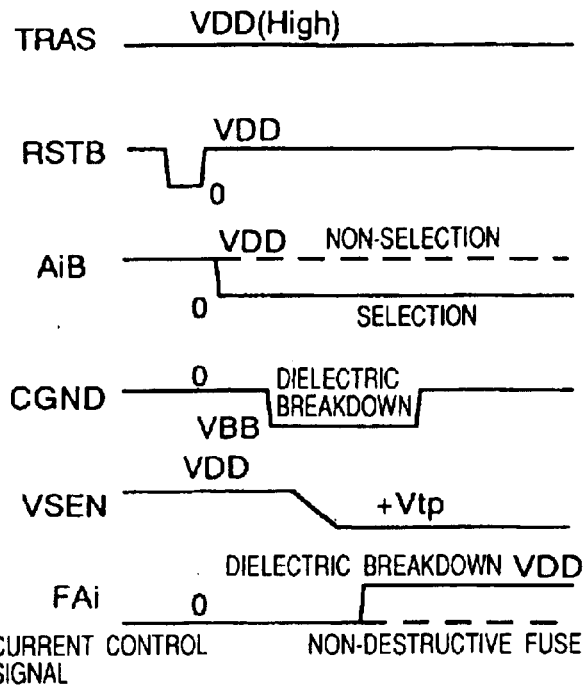
FIG. 23 is a timing chart showing one example of operation at the time that the antifuse undergoes an electrical breakdown.
Figure 24:
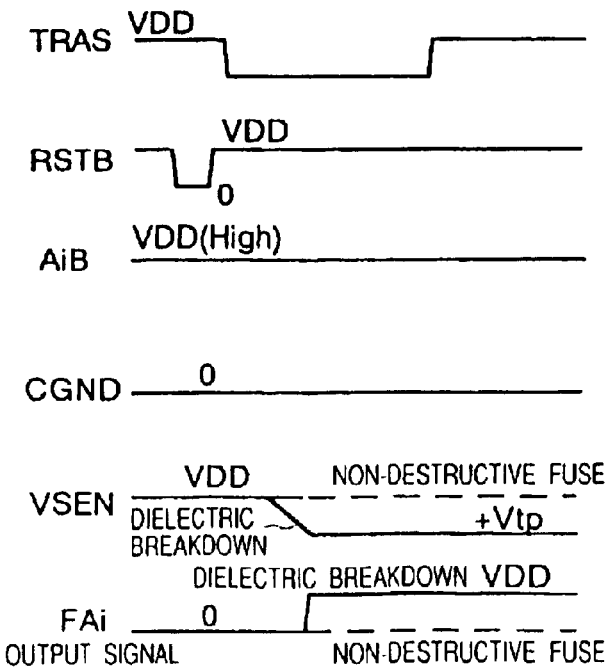
FIG. 24 is a timing chart illustrating one example of the reading operation of a detection signal.

FIG. 23 is a timing chart taken when the antifuse 1 undergoes an electrical breakdown, and FIG. 24 is a timing chart for describing the read operation of a detection signal FAi, respectively.

In FIG. 23, the dielectric breakdown of each antifuse 1 is selected according to the low level of the address designation signal AiB and carried out by applying the voltage VDD to the node VSEN and applying the negative voltage to the terminal CGND. Since the transistor T5 is of a p channel MIS transistor, the level of the voltage VDD at the node VSEN can be applied to the upper terminal (node VSEN) of the corresponding antifuse 1 without a level loss. Since a current path extending from VDD to CGND via VSEN does not exist in a program non-selected antifuse 1 in which a program address signal AiB is brought to a high level, the antifuse 1 is not broken. When the antifuse 1 is broken, it is brought into a low-resistance state such as a short state, and even the upper terminal of the antifuse 1 becomes negative. However, the node VSEN is not reduced to VSS (ground voltage)+Vthp (threshold voltage of p channel MIS transistor) or less by the transistor T5. The transistor T4 may be either a p channel MIS transistor or an n channel MIS transistor. However, it may preferably transfer a reduction in the level of the node VSEN to the input of the inverter INV1 to thereby change the detection signal FAi from low to high levels. Thus, the current path extending from VDD to CGND via VSEN is not developed and other antifuses 1 not yet subjected to breakdown proceed to breakdown. While the negative voltage at the terminal CGND is applied between the gate and source of the transistor T5 and between the source thereof and an NWELL (n-type well region), the absolute-value voltage with the ground voltage VSS as the reference may be small as compared with the use of only the high voltage on the positive side. Therefore, the pn-junction of the transistor T5 is not broken.

The signal AiB is rendered high in level and the signal TRAS is rendered low in level to thereby carry out the reading of the antifuse 1. Upon fuse reading at the time that the antifuse 1 is being broken, a current flows into the terminal CGND (=0V) through the transistors T1, T3, T4, T5 and antifuse 1 from the voltage VDD side, so that the node VSEN is brought to a low level and the signal FAi outputted from the inverter INV1 is brought to a high level. On the other hand, upon reading of each antifuse 1 placed in a non-destructive state, the node VSEN does not fall below the voltage VDD, and the detection signal FAi is maintained at a high level. The transistor T4 may be either a p channel MIS transistor or an n channel MIS transistor. However, the transistor T4 is set in such a manner that the drive capability thereof is set higher than that of the transistor T3 and the input of the inverter INV1 can reliably be determined by the level of the node VSEN. The transistor T4 is provided for the separation between the operations of the detection unit 113A and the fuse setting unit 113B. The transistor T4 may be omitted according to a subsequent-stage circuit configuration using the detection signal FAi.

Figure 25:
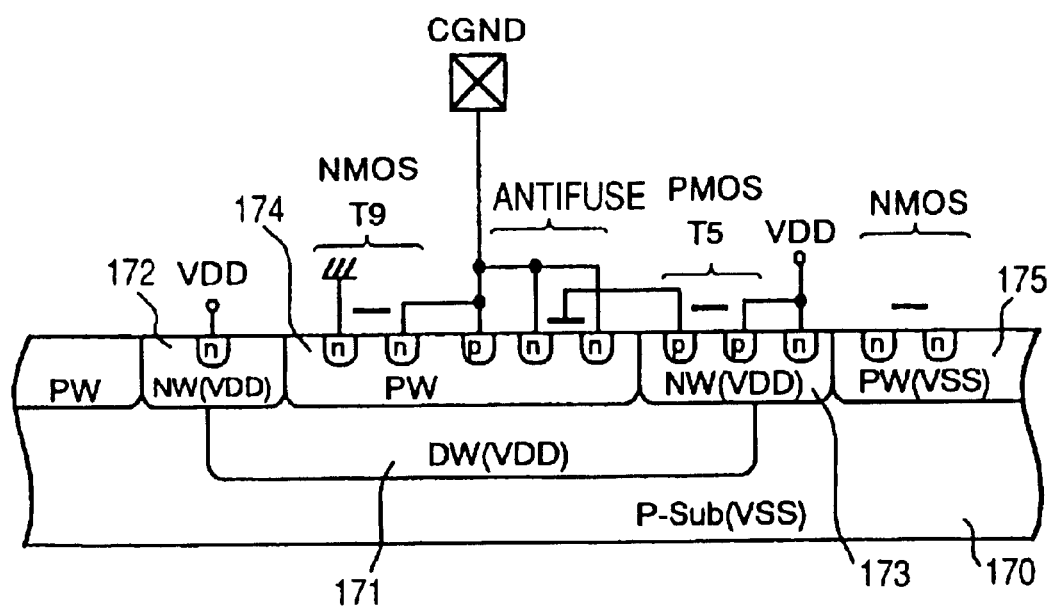
FIG. 25 is a vertical cross-sectional view depicting one example of a device section illustrative of transistors and antifuses shown in FIG. 22.

A device section illustrative of the transistors T5, antifuses 1 and transistor T9 shown in FIG. 22 is illustrated in FIG. 25 by way of example.

In FIG. 25, reference numeral 170 indicates a p-type semiconductor substrate (P-Sub(VSS)), reference numeral 171 indicates a deep n-type well region (DW(VDD)), reference numerals 172 and 173 indicate shallow n-type well regions (NW(VSS)), and reference numerals 174 and 175 indicate shallow p-type well regions (PW), respectively.

In the structure shown in FIG. 25, the p-type well region 174 of the antifuse 1 can be reduced to a negative potential by using a triple well structure based on the deep n-type well region 171. The n channel MIS transistor T9 is also formed in the same p-type well region 171. The triple well structure is a structure wherein well voltages for n channel MIS transistors of a memory array and its peripheral circuit can respectively independently be set to the optimum voltages and heavily used in a DRAM to enhance noise resistance of the memory array. The n channel MIS transistors for the normal peripheral circuit are provided in the p-type well regions 175 on the semiconductor substrate 170 and their well potentials are set as a ground potential VSS.

While an insulating film for the antifuse 1 is formed thin in FIG. 25, a DRAM memory cell structure similar to one described in U.S. Pat. No. 5,324,681 to make it easy to break the antifuse 1. When tantalum oxide ($Ta_2O_5$) is used in particular, the structure is asymmetric in withstand voltage and low in withstand voltage where a negative voltage is applied to the terminal CGND. This is advantageous to the structure shown in FIG. 21. In the antifuse 1, a gate oxide film having a thin one of two types of film thicknesses can be used as a gate oxide film in a gate process using the two types of film thicknesses (e.g., tOX=4 nm or 8 nm) except when each memory cell is used.

Figure 26:
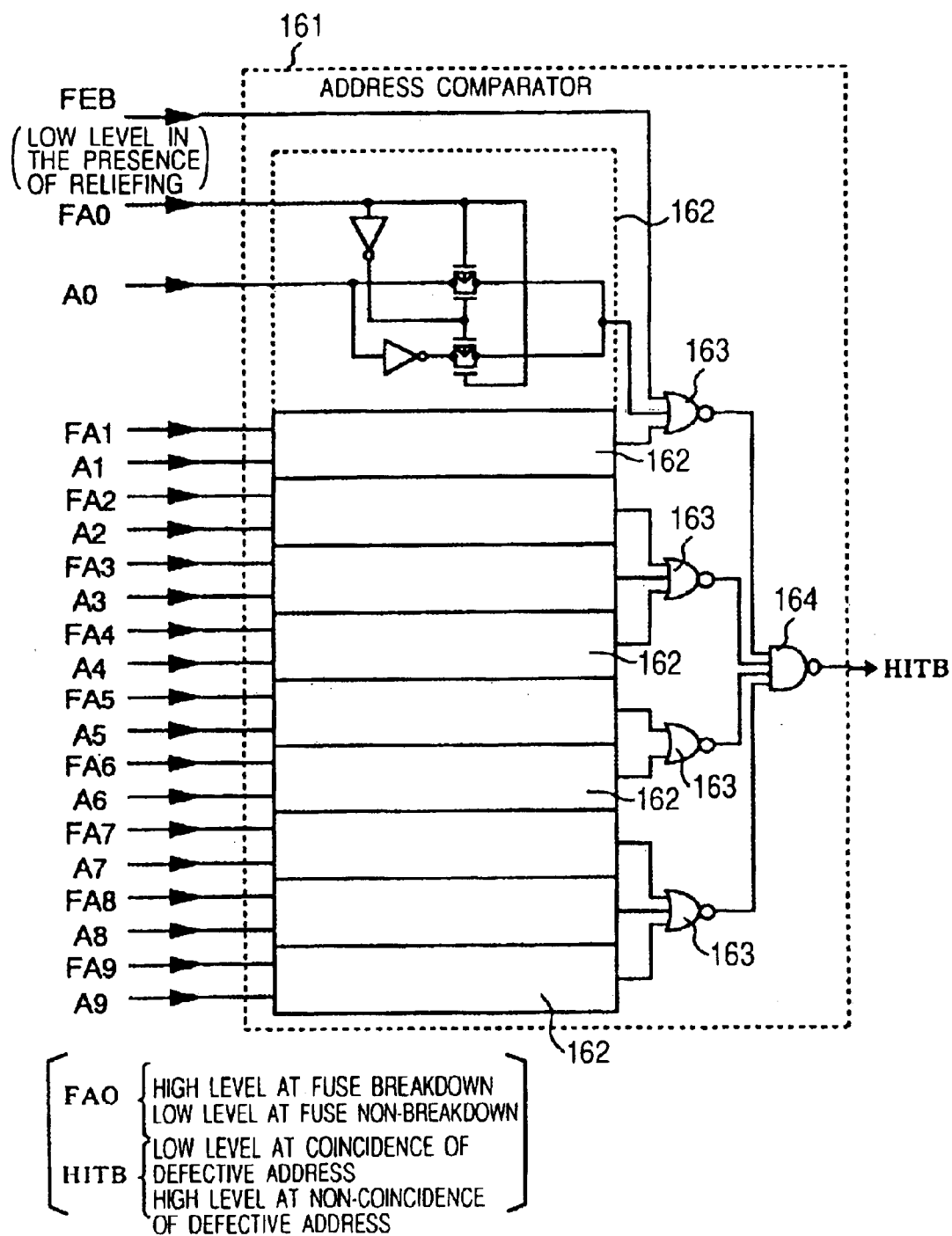
FIG. 26 is a logical circuit diagram showing one example of an address comparator.

One example of the address comparator 161 is shown in FIG. 26. The address comparator 161 has selector units 162 which respectively transfer respective bits corresponding to access address signals A0 through A9 in inversion or non-inversion form according to the logical values of the corresponding bits of the detection signals FA0 through FA9. The selector unit 162 to which A0 and FA0 are inputted, outputs an inverted level of the address bit A0 when the detection signal FA0 is high in level (when the antifuse 1 is placed in a dielectric breakdown state) and outputs a non-inverted level of the address bit A0 when the detection signal FA0 is low in level (when the antifuse 1 is placed in a non-dielectric breakdown state). Other selector units 162 are also configured in a manner similar to the above. The breakdown of the antifuse 1 is carried out when the corresponding program address AiB is low in level. Since each detection signal FA is high in level in this condition, the outputs of all the selector units 162 are brought to a low level (logical value "0") over all the bits when the access address signals A0 through A9 equal to inverted signals of respective bits for program addresses A0B through A9B are inputted. If the inverted signals of the respective bits for the program addresses A0B through A9B and the access address signals A0 through A9 differ even one bit, then the output of any of the selector units 162 is brought to a high level (logical value "1"). NOR and NAND gates 163 and 164 are provided to detect such a condition. A relief enable signal FEB is also supplied to one NOR gate 163. The relief enable signal FEB is a signal brought to a low level where the relieving of each defective bit is done. Such one antifuse circuit as shown in FIG. 21 by way of example is assigned as its signal source. When each access address coincides with a defective address, a detection signal HITB outputted from the NAND gate 164 is rendered low in level, whereas the detection signal HITB is brought to a high level when they do not coincide with each other. A program for the antifuse 1, which is used for relieving, is done as one sphere of a test process by setting a program mode to the system LSI. The setting of the program mode can be carried out through a mode terminal, for example.

While the description of FIG. 20 has been made with the word-line relief as one example, the relieving of bits or the relieving of the two may be performed. While a description has been made of the case in which the antifuse set for programming the defective address is provided as one set, it is needless to say that the provision of a plurality of antifuse sets can cope with a plurality of faulty or defective addresses.

<<Setting of Mode by Antifuse>>

A configuration, which allows mode setting in place of a bonding option, will be described as an example in which the antifuse circuit is used for function setting.

Figure 27:
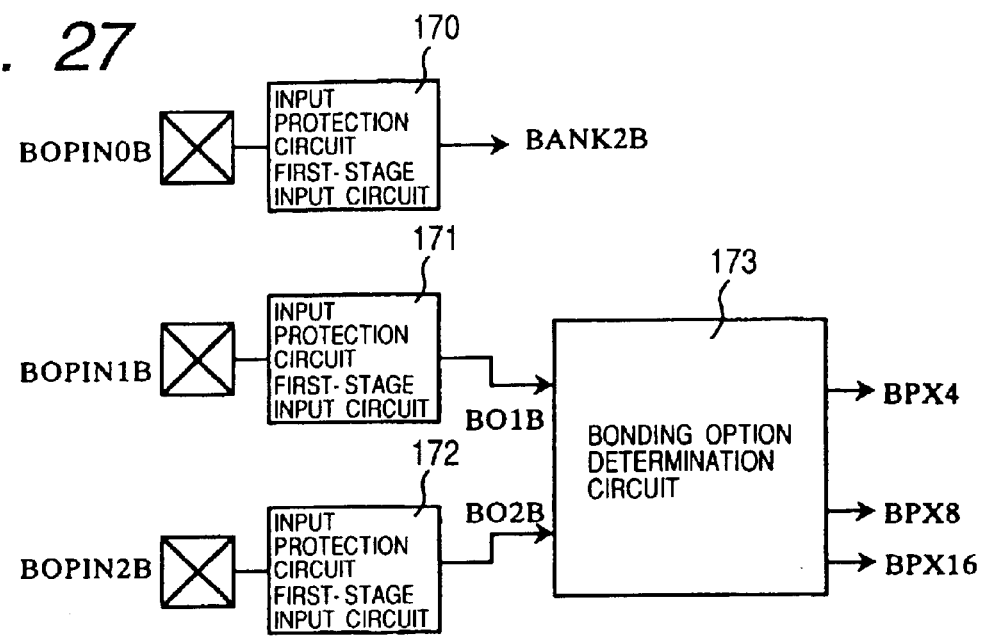
FIG. 27 is an explanatory view illustrating one example of a bonding option.
Figure 28:
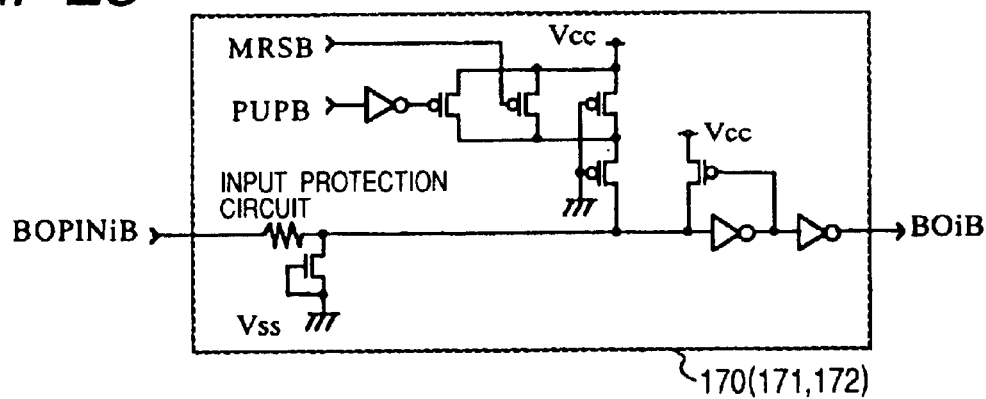
FIG. 28 is a circuit diagram depicting one example illustrative of an input protection circuit and a first-stage input circuit.

As an example of the bonding option, a description will first be made of the selection of both the number of banks and the number of parallel input/output bits for data in such a DRAM as shown in FIG. 12. In an explanatory view of a bonding option shown in FIG. 27, the operation modes of the DRAM are determined according to whether three option pads BOPIN0B, BOPIN1B and BOPIN2B are brought to floating or connected to a ground voltage VSS. The state of the option pad BOPIN0B is brought to a two-bank enable signal BANK2B via an input protection circuit and a first-stage input circuit 170. The signal BANK2B means two banks (2Bank) according to a high level, whereas it means four banks (4Bank) according to a low level. The input protection circuit and first-stage input circuit 170 are given as illustrated in FIG. 28 by way of example. If an input BOPINiB is low in level (ground voltage), then an output BOiB is also brought to a low level. If the input BOPINiB is placed under floating, then the output BOiB is brought to a high level.

Figure 29:
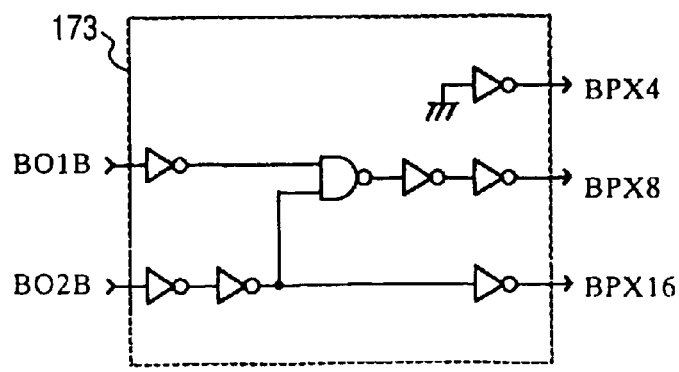
FIG. 29 is a logical circuit diagram showing one example of a bonding option determination circuit.

The states of the option pads BOPIN1B and BOPIN2B are supplied to a bonding option determination circuit 173 through the input protection circuit and first-stage input circuit 171 and 172, where the states of signals BPX4, BPX8 and BPX16 each indicative of the number of parallel input/output bits for data are determined according to the states of the inputs. The input protection circuit and first-stage input circuit 171 and 172 have logical paths illustrated in FIG. 28 by way of example. The bonding option determination circuit 173 has a logical configuration shown in FIG. 29. According to this logic, when an input BO1B is high in level, a signal BPX8 is brought to a high level regardless of an input BO2B, whereas if the input BO1B is low in level, then signals BPX8 and BPX16 are respectively brought to a high level regardless of the input BO1B.

If the operation modes settable by the bonding option are put in order, then they are represented as shown in FIG. 30. Thus, according to the states of the three option pads in the DRAM, six cases, i.e., combinations of the number of banks 2 or 4 and the number of parallel input/output bits four, eight or sixteen bits can be selected. This bonding option is executed in a bonding process step in an assembly process subsequent to the completion of a wafer process. The internal signals BANK2B, BPX4, BPX8 and BPX16 obtained in this way are set to unillustrated subsequent-stage circuits and used for control on an address buffer and a predecoder, control on a main amplifier, control on an output buffer, etc.

A configuration which allows a function selection equivalent to the bonding option through the use of each antifuse circuit, is shown in FIG. 31 by way example. Since no bonding step is set upon chip assembly in the flip-chip type semiconductor integrated circuit, the function selection cannot be performed in the case of the above bonding option system. The conventionally available laser fuse cannot be used either. The configuration of FIG. 31 is one in which these points have been taken into consideration. This is one wherein antifuse circuits AF0 through AF2 are applied and the selection of functions can electrically be performed according to the setting of programs to the antifuse circuits AF0 through AF2 even after a wafer process has been completed and bump electrodes have been formed. Such an antifuse circuit as shown in FIG. 21 by way of example can be used for the antifuse circuits AF0 through AF2 shown in FIG. 31. The programs for the antifuse circuits AF0 through AF2 are executed in test modes. Namely, each antifuse circuit first enters an antifuse setting mode. By using a WCBR (for enabling a write enable signal WE and a column-address-strobe signal CAS prior to a row-address-strobe signal RAS being enabled) test mode and part of address signals in a DRAM, for example, each antifuse circuit may enter the operation mode as one of the test modes. A breakdown voltage VDD is applied to the terminal VDC and a negative voltage Vbb' is applied to the terminal CGND. A program address for designating each fuse to be subjected to dielectric breakdown is supplied from its corresponding external address input terminal as a normal address signal. The operation modes settable by the antifuses AF0 through AF2 are represented as shown in FIG. 32, and settable functions correspond to FIG. 30.

Incidentally, the function selection described herein was an example illustrative of the configuration of the number of the parallel data input/output bits in the DRAM and the selection of the number of banks. While the switching between operation modes such as a first page, an EDO mode (Extended Data Out Page Mode), a static column, etc. has been carried out by use of bonding options even in the case of a standard DRAM in addition to the above, the switching between these can also easily be performed by antifuse programming in the same manner as described above.

<<Trimming by Antifuse>>

A description will next be made of a case in which each antifuse is used for trimming correction of each internal voltage. When a voltage VPERI is generated within a chip for a DRAM, the level thereof changes under the influence of process variations. The voltage VPERI is measured according to a probe test. If it falls outside an allowable range, then a trimming circuit for correcting it is utilized. The antifuse circuit can be used for its trimming setting.

Figure 33:
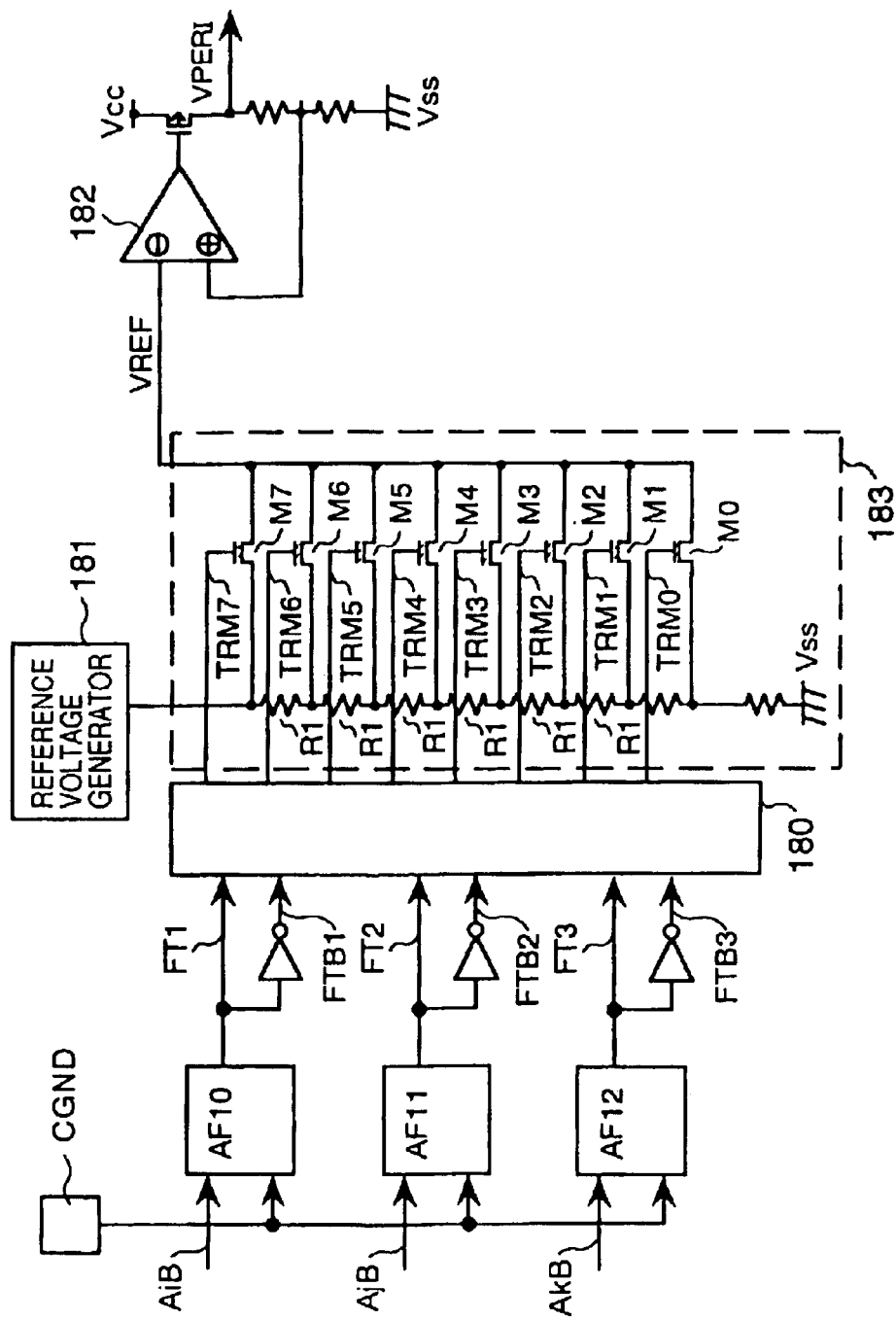
FIG. 33 is a circuit diagram showing one example of a trimming setting circuit having adopted antifuses.
Figure 34:
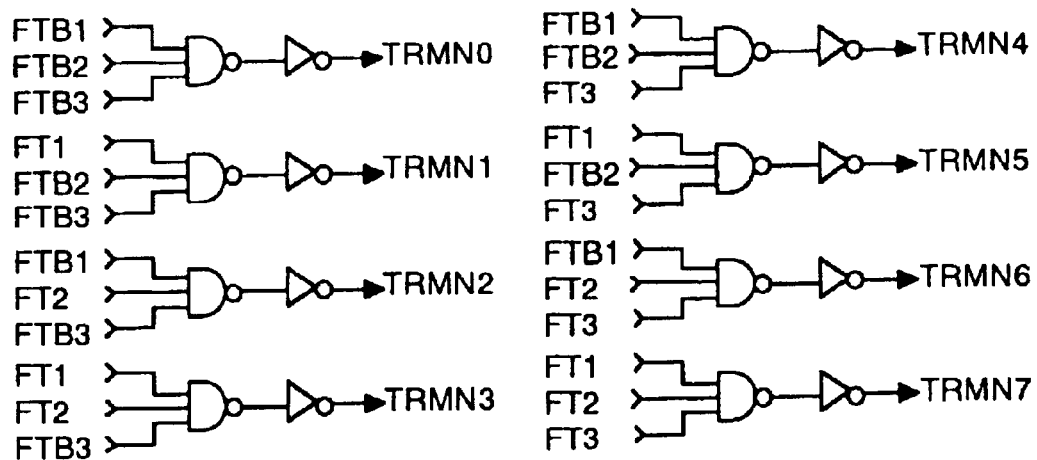
FIG. 34 is a logical circuit diagram illustrating one example of a logic configuration of a trimming decoder.

One example of a trimming setting circuit is shown in FIG. 33. The trimming setting circuit has three antifuse circuits AF10 through AF12. Signals outputted from the respective circuits are supplied to a trimming decoder 180 as 3-bit complementary signals FT1, FTB1 through FT3 and FTB3. The antifuse circuit shown in FIG. 21 or the like can be used for the antifuse circuits AF10 through AF12. AiB through AkB means 3-bit program address signals respectively. The trimming decoder 180 decodes the 3-bit complementary signals and brings one of eight selection signals TRM0 through RTM7 to a selected level. The logic of the decoder 180 is shown in FIG. 34 as an example. The selection signals TRM0 through TRM7 are set as selected signals corresponding to divided voltages of a resistance type voltage divider 183. Namely, a reference voltage generated by a reference voltage generator 181 is by-resistance divided by a series circuit comprised of a plurality of resistors R1. The divided voltages are selected by their corresponding n channel selection MIS transistors M1 through M7. The selection signals TRM0 through TRM7 are set as gate control signals for the selection MIS transistors M0 through M7. Each of the voltages selected by the selection MIS transistors M0 through M7 is supplied to its corresponding inversion input terminal of an op amplifier 182 as a reference voltage VREF. The output of the op amplifier 182 is connected to a gate electrode of a p channel output transistor M8 connected to a power terminal Vcc. A potential applied to the drain of the output transistor M8 is set as a voltage VPERI and a voltage obtained by dividing the voltage VPERI is set as a voltage fed back to a non-inversion input terminal of the op amplifier 182. The voltage VPERI produces levels corresponding to twice to a few times the reference voltage VREF according to the by-resistance divided state of the fed-back voltage. When the MIS transistor located on the upper side of FIG. 33, of the selection MIS transistors M1 through M7, is turned on, a relatively high-level reference voltage VREF is obtained. When the MIS transistor located on the lower side thereof is turned on in reverse, a relatively low-level reference voltage VREF is obtained. In a state in which the fuses of the antifuse circuits AF10 through AF11 are not programmed at all, a central level is normally obtained through the use of the selection MIS transistor M4.

The trimming circuit for such a voltage regulator as described above can be applied even to circuits such as an ADC, etc. The trimming circuit is not limited to the voltage regulator and can be applied even to a circuit or the like for correcting a delay time, which makes use of resistive and capacitive elements.

<<Testing Pads of Flip-chip Type Semiconductor Integrated Circuit>>

A description will next be made of testing pads of a flip-chip type semiconductor integrated circuit. Here, a flip-chip type means the form of a mounting technology of placing an element forming surface (circuit forming surface) of a semiconductor chip in an opposing relationship to a printed circuit board to be mounted, and connecting electrodes formed on the element forming surface and electrodes on the printed circuit board to one another.

Figure 35:
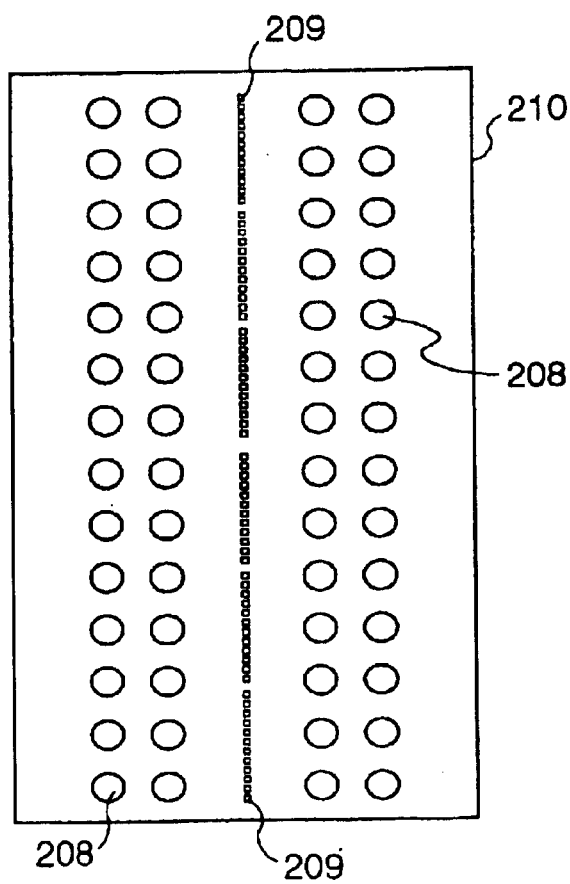
FIG. 35 is a plan view depicting one example of a flip-chip type DRAM.

A plan view of a flip-chip type DRAM mentioned as one example herein is first shown in FIG. 35. As shown in the same drawing, a large number of testing pads 209 are arranged in a central portion of a chip for a flip-chip type DRAM 210 along the longitudinal direction thereof. Further, a large number of bump electrodes 208 are laid out outside the testing pads 209 in area array form.

Figure 36:
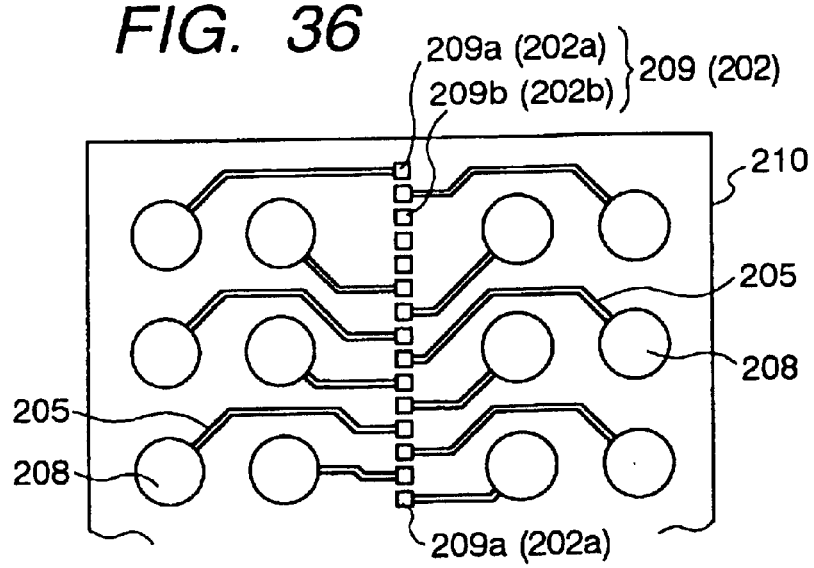
FIG. 36 is a plan view showing the manner in which part of FIG. 35 is shown in enlarged form and a surface insulating layer is removed to allow routing of relocated wirings to be brought into view.

FIG. 36 is a plan view showing the manner in which part of FIG. 35 is shown in enlarged form and a surface insulating layer is removed to allow routing of relocated wirings to be brought into view. Namely, FIG. 36 shows the state of connections of testing pads and bump electrodes. The testing pads 209 are roughly divided into pads 209a connected to their corresponding bump electrodes 208 through relocation wirings 205, and pads 209b disconnected from the bump electrodes. One testing pads 209a are connected to their corresponding power-supply or signal input/output bonding pads (202a) of bonding pads (202) not shown in FIG. 36. Further, the relocation wirings 205 are drawn out of the corresponding bonding pads (202a) and connected to their corresponding bump electrodes 208. The other testing pads 209b are not used in the final use stage of the flip-chip type DRAM 210 and connected to unillustrated bonding pads (202b) used in a probe testing stage or the like. The corresponding bonding pads (202b) are disconnected from the bump electrodes 208.

FIGS. 37 through 43 are respectively cross-sectional views showing a method of manufacturing the flip-chip type DRAM shown in FIG. 35. A section structure along the relocation wirings 205 extending from the power-supply or signal input/output bonding pads 202a to the bump electrodes 208, and a section structure of the bonding pad 202b portion dedicated for probe testing are shown while following respective manufacturing stages.

Figure 37:
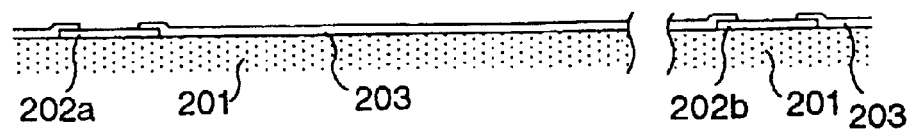
FIG. 37 is a vertical cross-sectional view illustrating an initial state in a manufacturing process of the flip-chip type DRAM shown in FIG. 35.

FIG. 37 shows a wafer section in a state in which bonding pads 202 (202a and 202b) are formed on the surface of a DRAM chip 201 having a large number of circuit elements formed on a semiconductor substrate and are covered with a protective layer 203 except for openings for the bonding pads 202. One shown herein is placed in a stage of the completion of the conventional wire-bonding connecting wafer.

Figure 38:
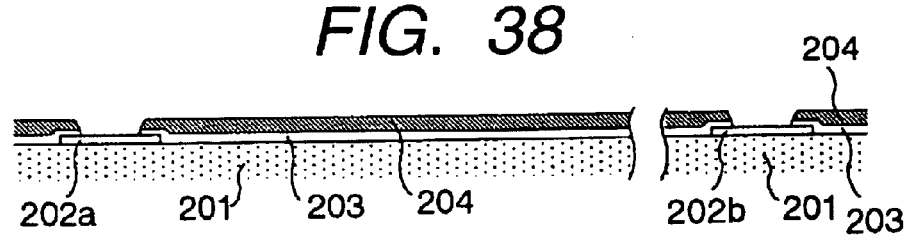
FIG. 38 is a vertical cross-sectional view depicting a manufacturing process step following FIG. 37.

A lower insulating layer 204 is first formed on the surface of the wafer as shown in FIG. 38. Portions of the bonding pads 202 (202a and 202b) are made open or exposed at the lower insulating layer 204.

Figure 39:
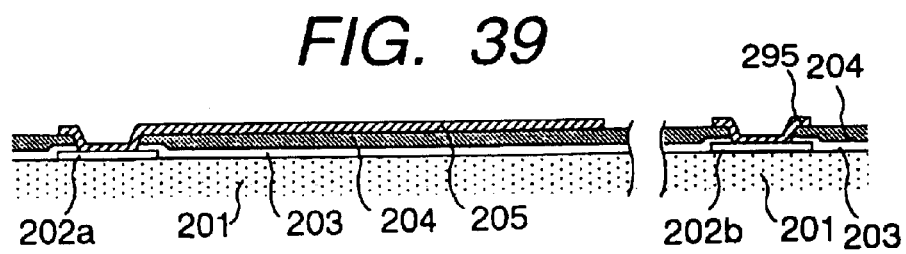
FIG. 39 is a vertical cross-sectional view showing a manufacturing process step following FIG. 38.

Next, as shown in FIG. 39, a relocation wiring 205 is formed up to the position to form each bump electrode from the bonding pad 202a and at the same time a relocation wiring layer 295 is formed with respect to the pad 202b dedicated for testing.

Figure 40:
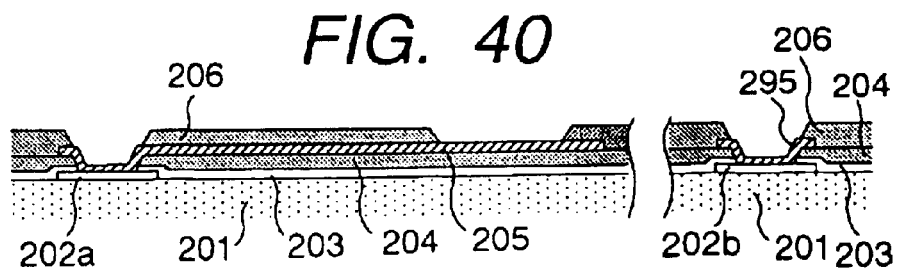
FIG. 40 is a vertical cross-sectional view depicting a manufacturing process step following FIG. 39.

As shown in FIG. 40, a surface insulting layer 206 is formed, and immediate upper portions of the bonding pads 202 (202a and 202b) of the relocation wiring layers 205 and 295 and a portion for forming each bump electrode are exposed.

Further, as shown in FIG. 41, an under bump metal or metallurgy 207 is formed in the bump electrode forming portion, and under bump metallurgy layers 297 are simultaneously formed over the bonding pads 202 (202a and 202b).

The under bump metallurgy layers 297 just or directly over the bonding pads 202 (202a and 202b) formed in the above-described manner result in a testing pad 209a corresponding to each power or signal input/output bonding pad 202a, and a testing pad 209b corresponding to each test-dedicated bonding pad 202b.

Next, as shown in FIG. 42, the leading ends of probes 211 are brought into contact with their corresponding testing pads 209a and 209b to perform a probe test, whereby the relief of each defective product by use of the redundancy of a circuit, the selection of functions, the sorting of non-defective products and defective products, etc. are executed.

Next, as shown in FIG. 43, a bump electrode 208 is formed on the under bump metallurgy 207 by solder, and the completed wafer is cut so as to be separated into each individual chips (dicing), thereby obtaining flip-chip type DRAMs.

While aluminum or an aluminum alloy is used as a material for the bonding pad 202 or its surface, copper or another metal may be used according to the type of a wiring material used inside a semiconductor elemental device.

In addition to inorganic films such as a silicon oxide film, a silicon nitride film, etc., an organic film like polyimide, and a combination of these are used as the material for the protective layer 203.

The material for the lower insulating layer 204 may preferably use organic materials or substances having low elastic modulus (low modulus of elasticity) and low permittivity, like polyimide, a fluorocarbon resin, various elastomer materials to relax a stress (state of stress/distortion) which acts on the bump electrode 208 due to the difference in thermal expansion between a semiconductor device and a printed circuit board after the implementation of the substrate, and reduce the capacitance of the relocation wiring 205. Here, as the elastomer materials, may be mentioned, for example, silicon and acrylic rubber materials, a polymeric material having low elastic modulus, which has blended these rubber materials.

The lower insulating layer 204 is formed by spin coating using varnish, printing or film bonding. The thickness of the lower insulating layer 204 may preferably be about 3 μm or more from the viewpoint of the stress and the reduction in capacitance. However, when the organic film is used for the protective layer 203, the lower insulating layer 204 is made thinner than it or may be omitted.

A three-layer wiring structure wherein a chromium, titanium, nickel, a nickel alloy or the like having a thickness of from about 0.1 μm to about 0.5 μm is stacked or layered on the upper and lower surfaces of copper or a copper alloy having a thickness of about 1 μm to about 5 μm, for example, is used for the relocation wiring 205. Further, aluminum and its alloy may be used therefor.

Organic materials having low elastic modulus, like polyimide, an epoxy resin, a fluorocarbon resin, and various elastomer materials may preferably be used as the material for the surface insulating layer 206 to relax the stress which acts on the bump electrode 208.

A flexible one may be used as the insulating film (further insulating film) below the relocation wiring to absorb the stress that acts on the bump electrode. The upper insulating film 206 may select a material relatively harder than the lower insulating film 204 from the viewpoint of its protection. Described specifically, the upper insulating film 206 and the lower insulating film 204 are respectively formed of a photosensitive polyimide resin film. The amount of a solvent, molecular weight, the content of a filler, etc. prior to heat treatment (cure) are changed to thereby make it possible to change the final hardness (elastic modulus) of the film thereof. Further, the upper and lower insulating films may be formed of materials different from each other. In this case, the upper insulating film 206 and the lower insulating film 204 are considered to be formed of, for example, an epoxy resin and a polyimide resin respectively.

As the under bump metallurgy 207, a metal having a high solder barrier property, such as chromium, nickel, nickel/tungsten, nickel/copper or the like may preferably be formed with a thickness of about 0.3 μm to about 3 μm. Further, a golden thin-film layer having a thickness of about 0.1 μm may preferably be formed on the surface thereof to ensure wettability of solder and electrical connectability to each probe.

The solder bump electrode 208 can be formed by printing solder paste on the under solder bump metallurgy 207 or transferring a solder ball molded to a predetermined size in advance and thereafter effecting reflow on it.

The testing pads 209 are provided just or directly over both of the power-supply or signal input/output bonding pad 202a and the bonding pad 202b for probe testing, thereby making it possible to execute the probe test after the relocation wiring process. It is therefore possible to prevent degradation in connection reliability due to damage of each bonding pad 202 prior to the relocation wiring process.

Since an inspection is done without applying the probe 211 to the already-formed solder bump electrode 208, the solder bump electrode 208 can be prevented from deforming. It is also possible to prevent damage of the probe 211 due to the application of the probe decentered to a curved surface of the solder bump electrode 208 to the solder bump electrode 208.

Further, since it is not necessary to apply the probe 211 to the under solder bump metallurgy 207 antecedent to the formation of the solder bump electrode 208, there is no fear that the layer for enhancing solder wettability, such as gold or the like formed on the surface of the under solder bump metallurgy 207, and the solder barrier metal layer placed below the layer are endamaged, thus making it possible to prevent degradation in connection reliability to solder.

Further, according to the present example, since the testing pads 209 are arranged in a row as shown in FIG. 36, an inexpensive cantilever type probe can be used as the probe 211 as shown in FIG. 42. Further, since the bonding pads 202 on the normal wire-bonding wafer with no relocation wirings applied thereto, and the testing pads 209 described herein are identical to one another in position within a chip plane, the normal wire-bonding wafer and the probe 211 can also be shared therebetween.

Since the testing pads 209 enter into projected areas of the bonding pads 202 in the aforementioned flip-chip type DRAM, an increase in capacitance due to the addition of the testing pads 209 is next to nothing.

<<Function Selection Using Testing Pads>>

An example of a breakdown of the number of bonding pads employed in a 64 Mbit synchronous DRAM chip and the number of external terminals employed in a conventional TSOP (Thin Small Out-line Package corresponding to a kind of surface-mounted package) equipped with the chip is shown in FIG. 44. Leads corresponding to the external terminals of the TSOP type package and the bonding pads of the chip are respectively connected to one another by wire bonding using golden thin lines.

Signal input/output bonding pads are all connected to their corresponding external terminals of the package in one-to-one relationship. The number of power bonding pads is greater than the external terminals of the package. A plurality of power bonding pads are commonly wire-bonded to the same external terminals.

Function-selecting bonding pads are individually connected to a source voltage upon wire bonding or disconnected therefrom to thereby operate the same chips in different systems. They select the number of input/output bits (4 bits, 8 bits or 16 bits), the number of banks (2 banks or 4 banks), etc.

Bonding pads dedicated for probe testing are used only upon probe testing and ones for observing internal operating conditions of the synchronous DRAM chip. They are not connected to the external terminals of the package.

Electrically unnecessary external terminals are provided in the package external terminals to set an outer shape in common with another semiconductor device, for example. They are not connected to the bonding pads of the chip.

When relocation wirings are given to the chip like the synchronous DRAM having the terminal configuration of FIG. 44 to form it as a flip chip, the number of solder bump electrodes increases when the solder bump electrodes are provided in the completed flip-chip's product in association with all the bonding pads. Therefore, if these many bump electrodes are laid out within a limited chip area, then the interval between the adjacent bump electrodes becomes narrow, the positioning at substrate mounting becomes difficult, and an expensive substrate is required.

The provision of only the testing pads 202b with respect to some bonding pads 202b without providing the bump electrodes as described in FIG. 36 makes it possible to execute the probe test after the relocation wiring process without an increase in the number of solder bumps.

In the case of the flip-chip type semiconductor integrated circuit provided with the relocation wirings 205, the connections of the function-selecting bonding pads can be performed by any of the following three methods.

The first is a method of providing the solder bump electrodes 208 corresponding to all the function-selecting bonding pads and selecting each function according to wire connections on the side of the substrate on which the flip-chip type semiconductor integrated circuit is mounted. This method has an advantage in that since the same semiconductor integrated circuit can be shared between respective specifications, the number of types is reduced, the management on the semiconductor maker side becomes easy, and a user is capable of selecting functions. However, the number of the bump electrodes increases and the interval between the adjacent bumps incurs narrowing. Further, a user who needs to have a peculiar function alone is also requested to add substrate wirings.

The second is a method for changing connected patterns of the relocation wirings 205 every individual functions. The method needs to prepare the patterns for the relocation wirings 205 by the number of types for function selection. This method has a problem in that since each function is fixed in a wafer wiring stage, it is hard to flexibly cope with a change in inter-type demand.

The third is a method using an electrical fuse like the antifuse 1. According to this method, all the types for function selection can be formed by the same relocation wiring patterns, and the number of solder bump electrodes does not increase. The function selection, i.e., the setting of each antifuse 1 is carried out by applying a probe to a wafer subsequent to the formation of the under bump electrode metallurgy 207 in a manner similar to the probe test. Terminals used for setting the antifuse 1 may share the use of the signal input/output and power bonding pads 202*a* connected to the solder bump electrodes 208. Alternatively, they may be provided as dedicated pads like testing pads disconnected from the solder bump electrodes 208. The latter needs such a circuit as being comprised of the transistors T9 through T11 shown in FIG. 22. Namely, according to the example shown in FIG. 22, the negative voltage Vbb' must be supplied to the terminal CGND upon programming of each antifuse. However, the terminal CGND can be kept floating after its programming has been completed, and the terminal CGND is automatically supplied with the ground voltage Vss without being connected to the ground voltage Vss.

Since the function selection can also be performed simultaneously with the conventional probe test when it is carried out by each antifuse, bonding pads dedicated for antifuse setting can be regarded as the broad bonding pads 202*b* dedicated for probe testing. Further, pads for applying a probe thereto upon antifuse setting can be regarded as the broad testing pads 209*a* and 209*b*.

Only the testing pads 202*b* are provided for some bonding pads 202*b* without providing the bump electrodes and used for function selection as described in FIG. 36. Consequently, the function selection can be carried out after the relocation wiring process without increasing the number of solder bumps.

<<Relocation Wiring and Another Structure of Testing Pad>>

Figure 45:
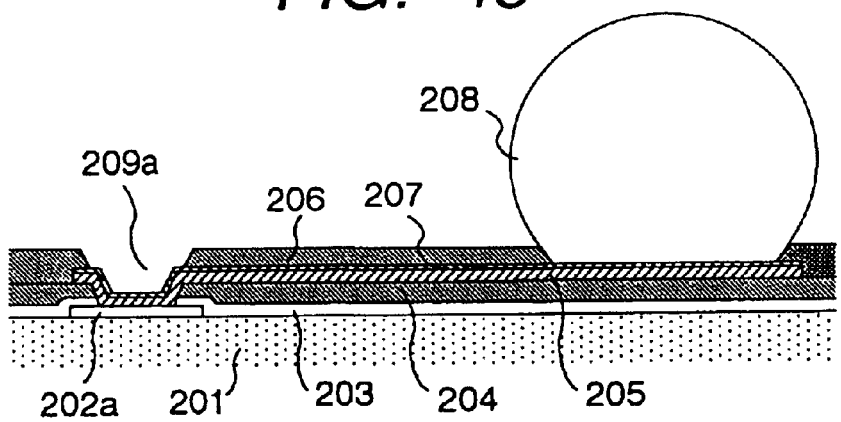
FIG. 45 is a cross-sectional view showing another structure of a relocated wiring portion in the flip-chip type DRAM.

Another structure of a relocation wiring portion is shown in FIG. 45 in the form of a cross-sectional view. In the structure shown in FIG. 43, the under solder bump metallurgy 207 is formed after the opening of the surface insulating layer 206, whereas in the structure shown in FIG. 45, an under solder bump metallurgy 207 is formed on a relocation wiring 205 in advance and thereafter a surface insulating layer 206 is formed thereon, and a portion directly above each bonding pad 202 and a portion for forming a solder bump electrode 208 are made open or exposed.

Even in the case of this structure, an effect similar to the structure shown in FIG. 43 can be obtained. Since the mask necessary to form the contour of the under solder bump metallurgy 207 by etching processing in the structure shown in FIG. 43 becomes unnecessary for the structure shown in FIG. 45, the processing cost can be reduced. However, both the lower insulating layer 204 and the surface insulating layer 206 exist directly below the outer peripheral portion of the solder bump electrode 208 at the base thereof in the structure shown in FIG. 43, whereas only the lower insulating layer 204 is provided in FIG. 45. Therefore, the structure shown in FIG. 43 is excellent in terms of the effect of relaxing the stress that acts on the bump electrode 208 due to, for example, the difference in thermal expansion between the semiconductor device and the printed circuit board after the substrate mounting. Further, the reliability of connections of the solder bump electrodes with respect to the repetition of a change in temperature, the repetition of substrate deformation due to an external force, etc. is enhanced.

Figure 46:
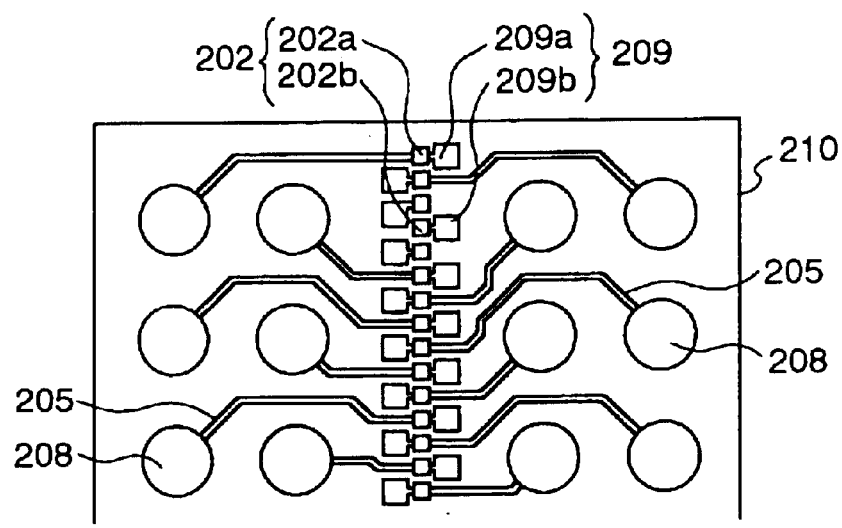
FIG. 46 is a plan view illustrating another example of a layout configuration of testing pads.
Figure 47:
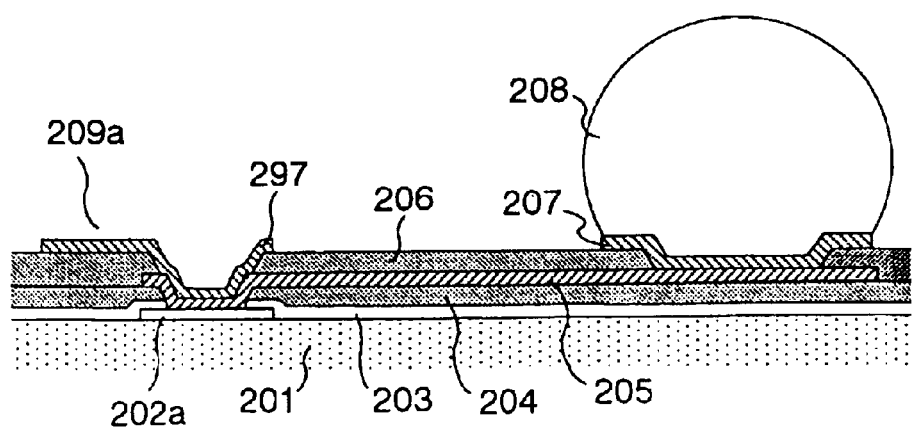
FIG. 47 is a vertical cross-sectional view depicting one example of a section structure in the layout configuration shown in FIG. 46.

Another example of a layout configuration of testing pads is shown in FIG. 46, and its sectional structure is shown in FIG. 47 as an example. Testing pads 209*a* are formed by an under bump metallurgy layer 297 on a surface insulating layer 206 on the side opposite to each solder bump electrode 208 with bonding pads 202*a* interposed therebetween.

Even with respect to bonding pads 202*b* dedicated for probe testing, testing pads 209*b* are formed by the under bump metallurgy layer 297 at its adjoining portion on the surface insulating layer 206.

Since the testing pads 209*a* are respectively shifted from just above the bonding pads 202*a* and are formed of the under bump metallurgy 297, the bonding pads 202*a* and relocation wirings 205 are not exposed even if the testing pads 209*a* are endamaged upon probe testing. Thus, there is no fear that the electrical connections between the bonding pads 202*a* and the under bump metallurgy 207 would be cut due to corrosion or the like developed by moisture. As compared with the structures shown in FIGS. 43 and 45 provided with the testing pads 209 at the portions directly above the boding pads 202, the flat testing pads 209 can be obtained.

In the flip-chip type semiconductor integrated circuit having the structure wherein the bonding pads 202 are arranged on the center line of the chip or in the neighborhood thereof, and the solder bump electrodes 208 are disposed on both sides of their row as shown in FIG. 46, the relocation wirings 205 are respectively drawn on the opposite sides alternately or at intervals of several pads on both sides of the bonding pad row. Therefore, the placement of the testing pads 209 on both sides of the bonding pad row in divided form makes it possible to provide testing pads 209 larger in size than those provided just above the bonding pad row or on the same side thereof.

Since the testing pads 209 are formed on the laminated lower insulating layer 204 and surface insulating layer 206, the distance extending from each lower semiconductor circuit element can be increased, and an increase in capacitance due to the addition of the testing pads 209 can be reduced.

Further, if an organic insulating film such as polyimide is used for either one of the lower insulating layer 204 and the surface insulating layer 206, then the effect of reducing capacitance becomes great since it is lower than the normal inorganic insulating film in specific inductive capacity. If it is used for both, then the maximum effect can be obtained.

When the organic insulating film such as polyimide or the like is used for the surface insulating layer 204 used as a bed for each testing pad 209, it is low in elastic modulus as compared with the normal inorganic insulating film. Therefore, even when the testing pads 209 are formed of a hard under solder bump metallurgy 207 such as chromium, nickel, the surfaces of the testing pads 209 are easy to deform. Therefore, the area brought into contact with the tip of each probe 211 increases and an electrical connectability is improved. This effect is more pronouncedly developed by using the organic insulating film for both the lower insulating layer 204 and the surface insulating layer 206.

Figure 48:
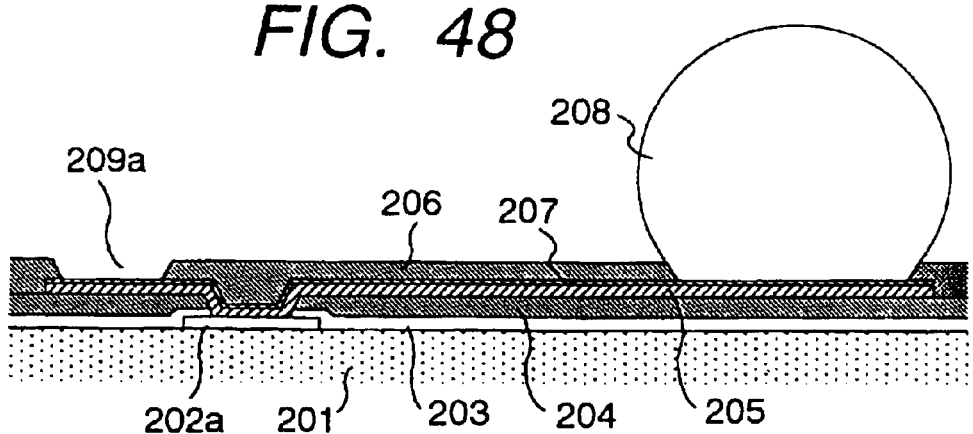
FIG. 48 is a vertical cross-sectional view showing a further example of a section structure of a testing pad.

A further example of a section structure of a testing pad is shown in FIG. 48. FIG. 48 is different from FIG. 47 in that a mask for forming an under bump metallurgy 207 is omitted in a manner similar to the relationship of FIG. 45 relative to FIG. 43 to thereby allow a reduction in cost. Namely, there is a possibility that since the relocation wiring layer 205 exists in contact with the underlying portion of the under solder bump metallurgy layer 297 on the surface of the testing pad 209a in FIG. 47, the relocation wiring layer 205 will be exposed upon endamaging of the under solder bump metallurgy layer 297. Thus, even if corrosion or the like is developed in the relocation wiring layer 205 at each testing pad 209a portion by the placement of the testing pads 209a and solder bump electrodes 208 on the sides of the bonding pads 202a, which are opposite to one another, it does not influence the electrical connections between the bonding pads 202a and the solder bump electrodes 208, whereby high connection reliability can be obtained.

Since each testing pad 209a is formed on a lower insulating layer 204 in the structure shown in FIG. 48, the effect of reducing capacitance is low as compared with the embodiment shown in FIG. 47. However, it can be manufactured at low cost as compared with FIG. 47. Forming the lower insulating layer 204 by an organic insulating film yields the effect of reducing an increase in capacitance due to the addition of each testing pad 209 as compared with the technology described in Unexamined Patent Publication No. Hei 8(1996)-29451 wherein the testing pads are formed on the inorganic insulating film. Even in the case of the structure shown in FIG. 48, since the surface of each testing pad 209 formed over the lower insulating layer 204 is apt to deform by the formation of the lower insulating layer 204 with the organic insulating film, contactability with each probe 211 is improved.

Figure 49:
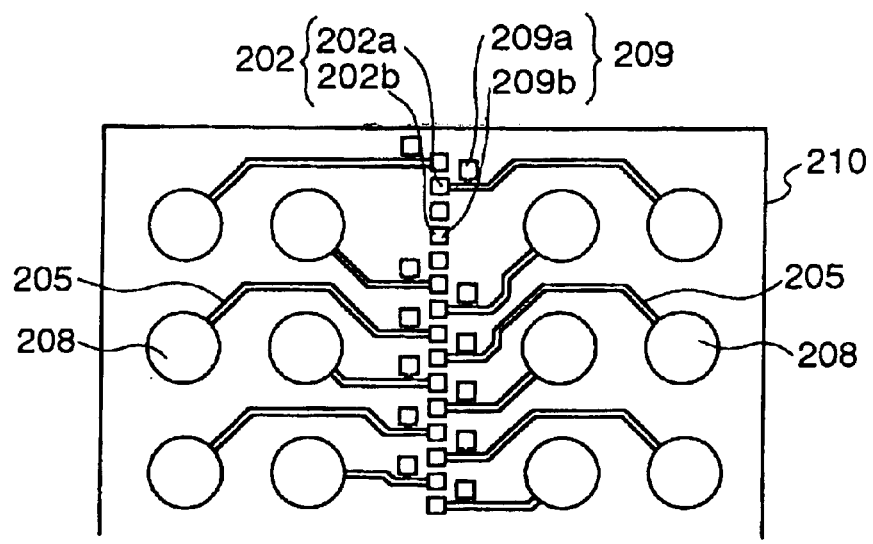
FIG. 49 is a plan view illustrating a further example of a layout configuration of testing pads.
Figure 50:
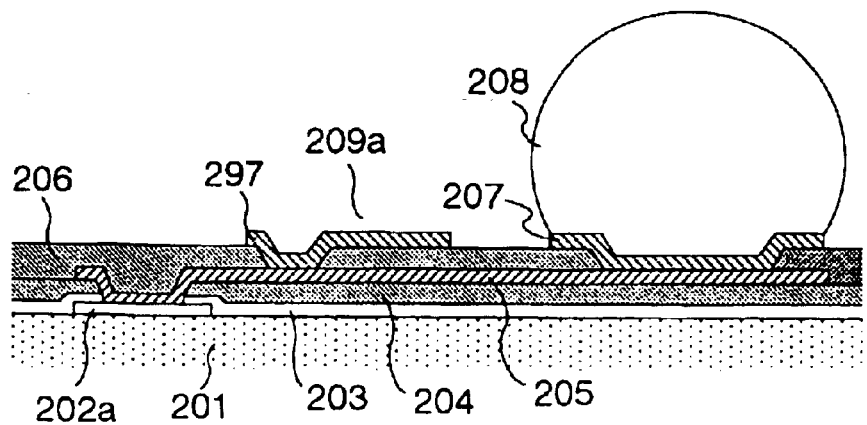
FIG. 50 is a vertical cross-sectional view showing one example of a section structure in the layout configuration shown in FIG. 49.

A further example of a layout configuration of testing pads is shown in FIG. 49, and its sectional structure is shown in FIG. 50 as an example. Testing pads 290a corresponding to power or signal input/output bonding pads 202a are formed on a surface insulating layer 206 at positions which branch off from the course or midstream of relocation wirings 205 for respectively connecting the bonding pads 202a and an under solder bump metallurgy 207. In regard to bonding pads 202b dedicated for probe testing, testing pads 209b are provided at portions just above their corresponding pads 202b. Even if the testing pads 209a are provided at such positions, the flat testing pads can be obtained as compared with the case where they are provided at the portions just above the bonding pads 202a. The effect of reducing capacitance is similar to FIG. 47.

The testing pads 209a are formed so as to branch off from the relocation wirings 205. Therefore, even if the testing pads 209a are endamaged upon probe testing, it does not influence the reliability of electrical connections between the bonding pads 202a and the under solder bump metallurgy 207.

Since the bonding pad 202b dedicated for probe testing is regardless of a solder bump electrode 208 in terms of the reliability of connection to the solder bump electrode 208, it is not necessary to take into consideration the influence of damage of the testing pad 209b in particular. No problem arises even when the testing pad is provided at a portion just above the bonding pad 202b or at an arbitrary position. An improvement in contactability between each testing pad 202 and a probe 211 by use of an organic insulating film for the surface insulating layer 206 or both the surface insulating layer 206 and a lower insulating film 204 is similar to the structure shown in FIG. 47.

Figure 51:
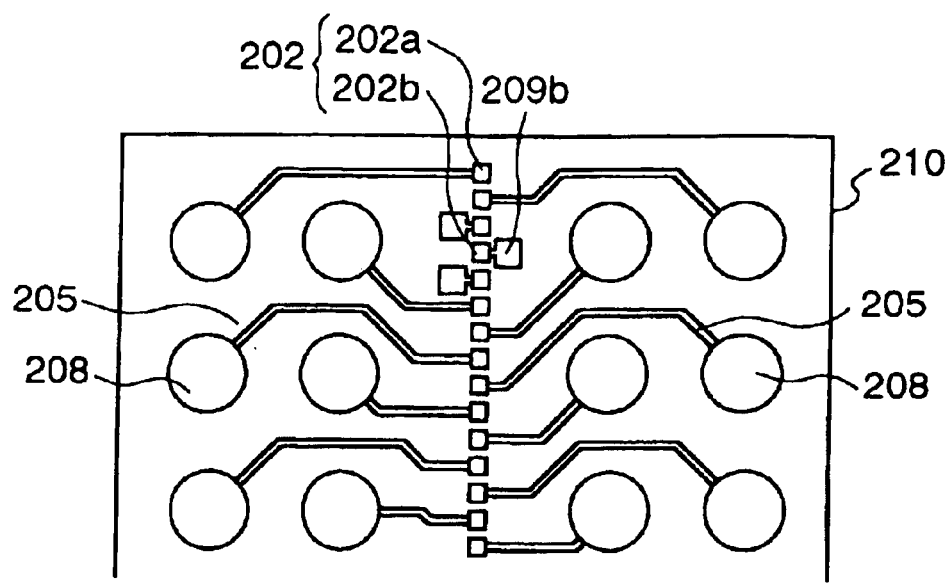
FIG. 51 is a plan view illustrating a layout configuration in which testing pads are provided only for bonding pads dedicated for probe inspection.

FIG. 51 shows an example in which testing pads 209b are provided only for bonding pads 202b dedicated for probe testing. The testing pads 209b respectively formed so as to be greater than the bonding pads 202b are provided for the bonding pads 202b dedicated for probe testing. As to power and signal input/output bonding pads 202a, an under solder bump metallurgy 207 antecedent to the formation of each solder bump electrode 208 is used to perform a probe test.

The provision of the testing pads 209b only for the bonding pads 202b dedicated for probe testing, to which the testing pads 209b are essential and which is out of relation to an electrical characteristic, allows the prevention of an increase in capacitance of another bonding pad, particularly, each signal input/output wiring. Further, since the number of testing pads may be low and the influence on the electrical characteristic is not produced either, the size of each testing pad 209b and the interval between the testing pads 209b can sufficiently be increased.

Figure 52:
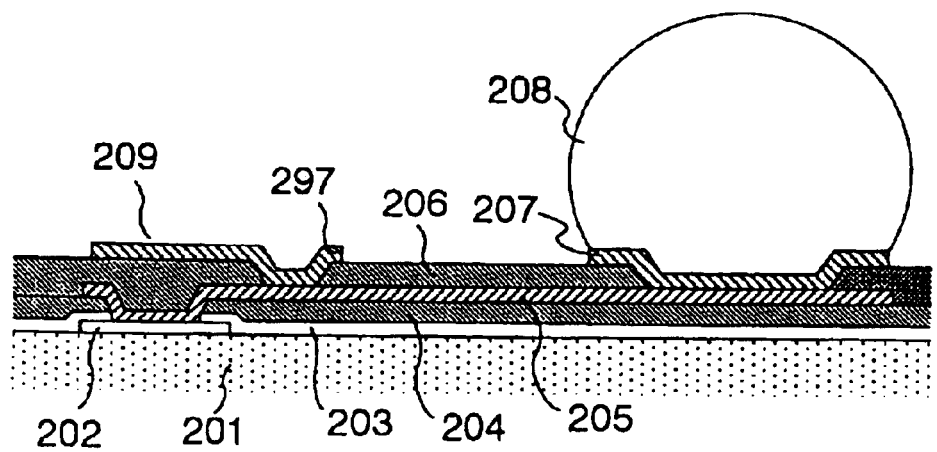
FIG. 52 is a vertical cross-sectional view showing a still further structure of a testing pad.

FIG. 52 is a cross-sectional view showing an example in which each of testing pads 209 is caused to extend from a relocation wiring 205 located on the lateral side of a bonding pad 202 to a portion just above the bonding pad 202. Through the use of the portion just above each bonding pad 202, the corresponding testing pad 209 flat and large in size can be formed without an increase in capacitance. Further, the damage of the testing pad 209 does not influence the reliability of electrical connections. Even in the case of this structure, the formation of a surface insulating layer 206 by an organic insulating film allows an improvement in contactability between the testing pad 202 and its corresponding probe 211.

<<Method of Manufacturing Flip-chip Type Semiconductor Integrated Circuit>>

Processes for manufacturing a flip-chip type semiconductor integrated circuit are shown in FIGS. 53 through 57 every stages in the form of perspective views.

FIG. 53 shows a completed stage of a conventional wire bonding connecting wafer. Namely, FIG. 53 is a view showing the whole span of a wafer 220 placed in the state shown in FIG. 37. The bonding pads 202 are respectively formed in respective chips 210.

In order to manufacture the flip-chip type semiconductor integrated circuit, lower insulating layers 204, relocation wirings 205, surface insulating layers 206 and under bump metals or metallurgies 207, etc. are formed on the wafer 220 shown in FIG. 54 as illustrated in FIGS. 38 through 41 by way of example. Thus, such a wafer 220 as shown in FIG. 54 placed in a state in which the under bump metallurgies 207 are formed, is obtained. The state of FIG. 54 is equivalent to the state of FIG. 41 as viewed in the form of a cross-section.

Next, probe tests are carried out through the use of a probe card 221 wherein a plurality of probes 211 are positioned and fixed so that their leading ends or tips are simultaneously brought into contact with a plurality of testing pads 209 (unillustrated in FIG. 55) on the wafer 220 as shown in FIG. 55.

The plurality of probes 211 are simultaneously brought into contact with the plurality of testing pads 209 to thereby simultaneously test or inspect the testing pads 209 corresponding to one chip 210 or plural chips 210 and inspect them while their contact positions are being shifted successively, whereby the probe tests are carried out on all the chips 210 on the wafer 220. At this time, the selection of functions and the relief of defects can be performed simultaneously or successively by using the same or similar another probe card 221.

A process for forming solder bump electrodes will next be explained by reference to FIG. 56 with a solder paste printing system as an example. A solder printing mask 222 in which openings 223 are defined in association with the layouts of under bump metallurgies 207 on the surface of a wafer 220 as shown in the drawing, is superimposed on the wafer 220 in alignment with it, and solder paste 225 is printed thereon by a squeegee 224. In a state placed immediately after the printing, the solder paste 225 is evenly printed on an area slightly wider than the under bump metallurgies 207 as shown by a cross-sectional view in the drawing. When this wafer is reflow-heated to melt the solder paste 225, solder is aggregated spherically to form solder bump electrodes 208.

Figure 57:
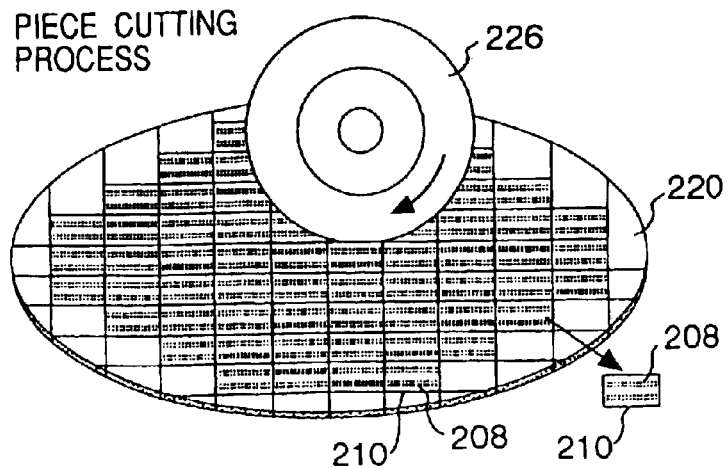
FIG. 57 is a perspective view showing a piece cutting process following FIG. 56.

The wafer 220 subsequent to the formation of the bump electrodes 208 is cut and separated into pieces of chips 210 by a dicing blade 226 as shown in FIG. 57, whereby completed products each corresponding to the flip-chip type semiconductor integrated circuit can be obtained. The completed products are further subjected to a burn-in inspection and various final inspections for their performance, external appearance, etc. as needed. After they are subjected to predetermined markings and packaged, they are shipmented.

<<Manufacturing Processes Subsequent to Relocation Wiring Forming Process>>

Figure 58:
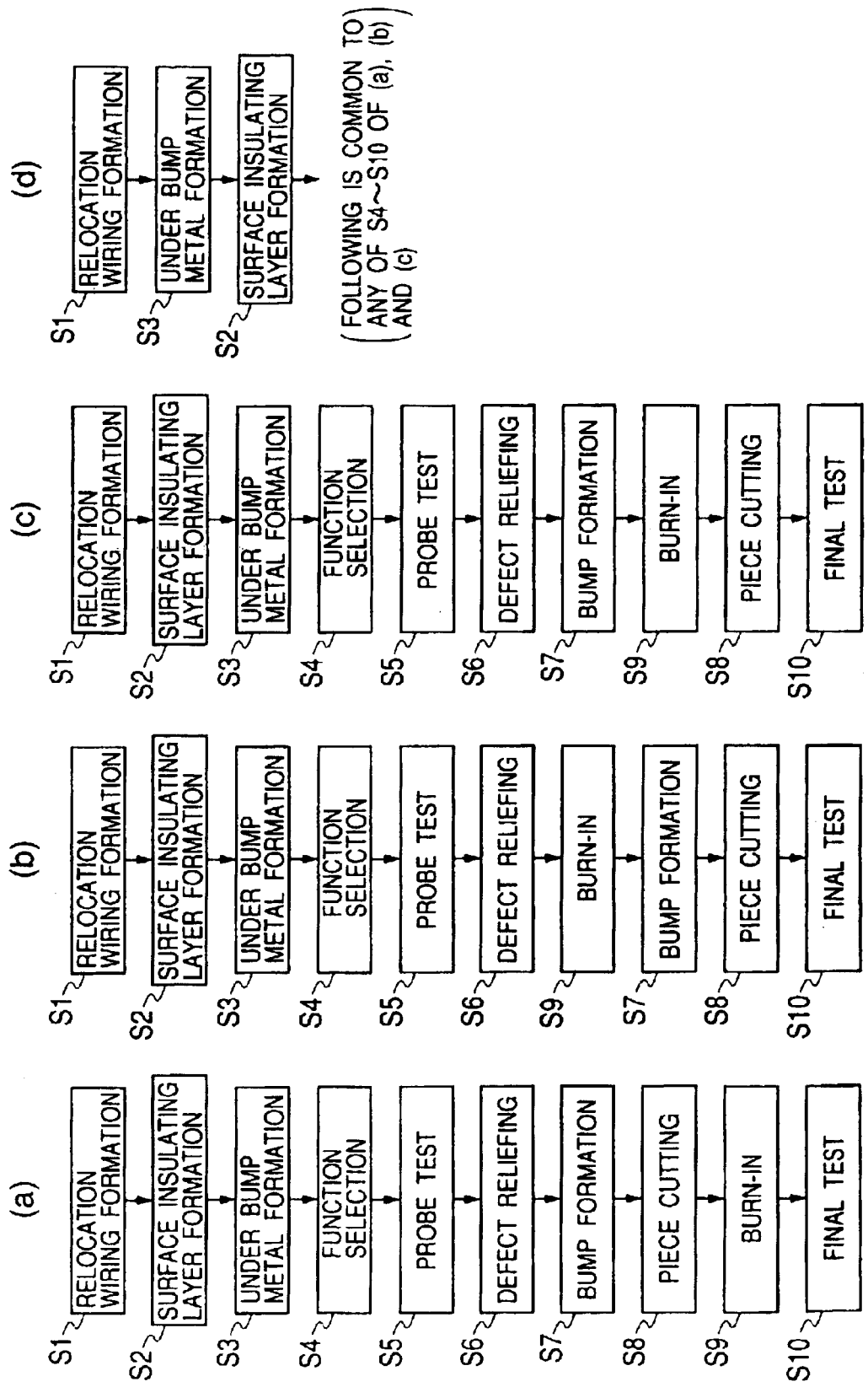
FIG. 58 is a flowchart illustrating manufacturing process flows subsequent to a relocation wring forming process of a flip-chip type semiconductor integrated circuit according to the present invention in the form of four types of (a), (b), (c) and (d)

FIG. 58 shows manufacturing process flows subsequent to a relocation wring forming process of a flip-chip type semiconductor integrated circuit according to the present invention in the form of four types of (a), (b), (c) and (d). If the structure shown in FIG. 43 is taken as one example, then the manufacturing flows shown in the same drawing include respective process steps: a relocation wiring forming S1 for forming each relocation wiring 205 on an insulating layer 204, a surface insulating layer forming S2 for forming such an insulating layer as designated at numeral 206, an under bump metallurgy forming S3 for forming such an under bump metallurgy as designated at numeral 207 and an under metallurgy 297 for each testing pad 209, etc., a function selecting S4 like mode stetting based on the program for the antifuse 1, a probe testing S5, a defect relieving S6 like defective-bit replacement based on the program for the antifuse 1, a bump forming S7 for forming each bump electrode, a piece cutting (dicing) S8 for cutting out chips from a wafer, a burn-in S9, and a final testing S10.

The manufacturing flow shown in FIG. 58(a) corresponds to the burn-in S9, i.e., a manufacturing flow for performing a continuous operation test at a high temperature in chip units after the completion of the piece cutting S8. Since the interval between solder bump electrodes is made wider than the interval (of about 60 μm to about 150 μm) between bonding pads by each relocation wiring in the flip-chip type semiconductor integrated circuit (about 0.5 mm to about 1.0 mm), the burn-in in each chip unit can easily be carried out through the use of each burn-in socket employed in a BGA (Ball Grid Array) type CSP (Chip Size Package). Namely, the bump electrodes are formed on the chip in advance prior to the burn-in step, and arrangement patterns for the bump electrodes are respectively associated with electrode arrangement patterns for the burn-in sockets. Thus it is not necessary to newly prepare custom-engineered burn-in sockets. Therefore, the cost for the assembly of the flip-chip type semiconductor integrated circuit can be reduced. Even when the burn-in sockets with the bump electrodes used as connecting terminals are not used, electrical connections for burn-in can be preformed by use of the testing pads 209. In this case, narrow-pitch type expensive burn-in probes capable of probing are necessary for the testing pads placed between the bump electrodes, whereas the deformation of each solder bump electrode 208 due to socket contact at a high temperature can be prevented.

In the manufacturing flows shown in FIGS. 58(b) and 58(c), the burn-in S9 are carried out in a wafer stage before the piece cutting S8. In particular, FIG. 58(b) is a manufacturing flow for performing burn-in before the formation of the solder bump electrodes by use of the testing pads 209 or the under bump metallurgies 207 antecedent to the formation of the solder bump electrodes 208. Since the electrical connections for burn-in are performed without having to use the bump electrodes, it is possible to prevent the deformation of each solder bump electrode due to the contact of each burn-in socket under a high-temperature environment. Further, since the burn-in is performed in a flat stage antecedent to the formation of each solder bump electrode, a burn-in probe like a socket can easily be applied to each testing pad 209 without bringing the solder bump electrodes 208 into obstacles. Since the burn-in is done in the wafer stage, a plurality of chips can be burnt in a lump and throughput for testing can be improved.

FIG. 58(c) shows a manufacturing flow for performing burn-in after the formation of the solder bump electrodes. The burn-in probe is brought into contact with each solder bump electrode 208. When the burn-in probe is brought into contact with the solder bump electrode 208, the solder bump electrode 208 is easy to deform upon burn-in. However, there is in no danger of endamaging each under bump metallurgy 207 or developing a surface deterioration in the under bump metallurgy 207. It is also possible to form high-reliable under bump metallurgies and relocation wirings. Since the burn-in is performed in the wafer stage in the same manner as FIG. 58(b) even in this case, throughput for testing can be improved.

The manufacturing flow shown in FIG. 58(d) is a manufacturing flow in which the steps corresponding to the surface insulating layer forming S2 in the respective flows shown in FIGS. 58(a) through 58(c) are replaced by a step corresponding to an under bump metallurgy forming S3. Process steps subsequent to a function selecting step are common to any of the manufacturing flows shown in FIGS. 58(a) through 58(c). The relationship between FIGS. 58(a) through 58(c) and FIG. 58(d) corresponds to the relationship between the structures shown in FIGS. 43 and 47 and the structures shown in FIGS. 45 and 48. In the manufacturing flow shown in FIG. 58(d), the relocation wirings 205 and the under bump metallurgy 207 are formed in the same step. Therefore, the forming cost of each under bump metallurgy can be reduced as compared with the manufacturing flows shown in FIGS. 58(a) through 58(c).

Incidentally, when semiconductor integrated circuit elements are manufactured in a fully-established process and percent defective is low, the burn-in might be omitted. In this case, the respective manufacturing flows shown in FIGS. 58(a) through 58(c) are precisely identical to one another and hence there is no difference.

FIG. 59 collectively shows chip contact points of a probe, a socket, etc. in respective testing processes of probe inspections S5, burn-in S9 and final tests S10 in the above respective manufacturing process flows. In FIG. 59, terminals (pads) dedicated for probe testing are used only upon probe tests (including function selection, defect relief in a broad sense), and the probes are respectively brought into contact with the testing pads described in the present invention.

In regard to power-supply and signal input/output terminals, the contact points at probe testing and burn-in differ according to the adoption of any of the flows shown in FIGS. 58(a) through 58(c). However, any of the final tests is carried out by use of the solder bump electrodes as completed products.

In any of the respective manufacturing process flows shown in FIG. 58, the function selecting S4, the probe testing S5 and the defect relieving S6 are carried out in succession. When an antifuse is used in the function selecting S4 and the defect relieving S6, any of these three steps can be performed by bringing each probe into contact with the wafer and thereby performing electrical processing (unaccompanied by fuse cut-out by laser and a change in relocation wiring). Therefore, the three steps can be processed in a batch with one probing (i.e., without performing probing again after probing on other chips), and hence the processes can be simplified. In this case, the function selection and the defect relief can also be considered with being included in a broad probe test.

Figure 56:
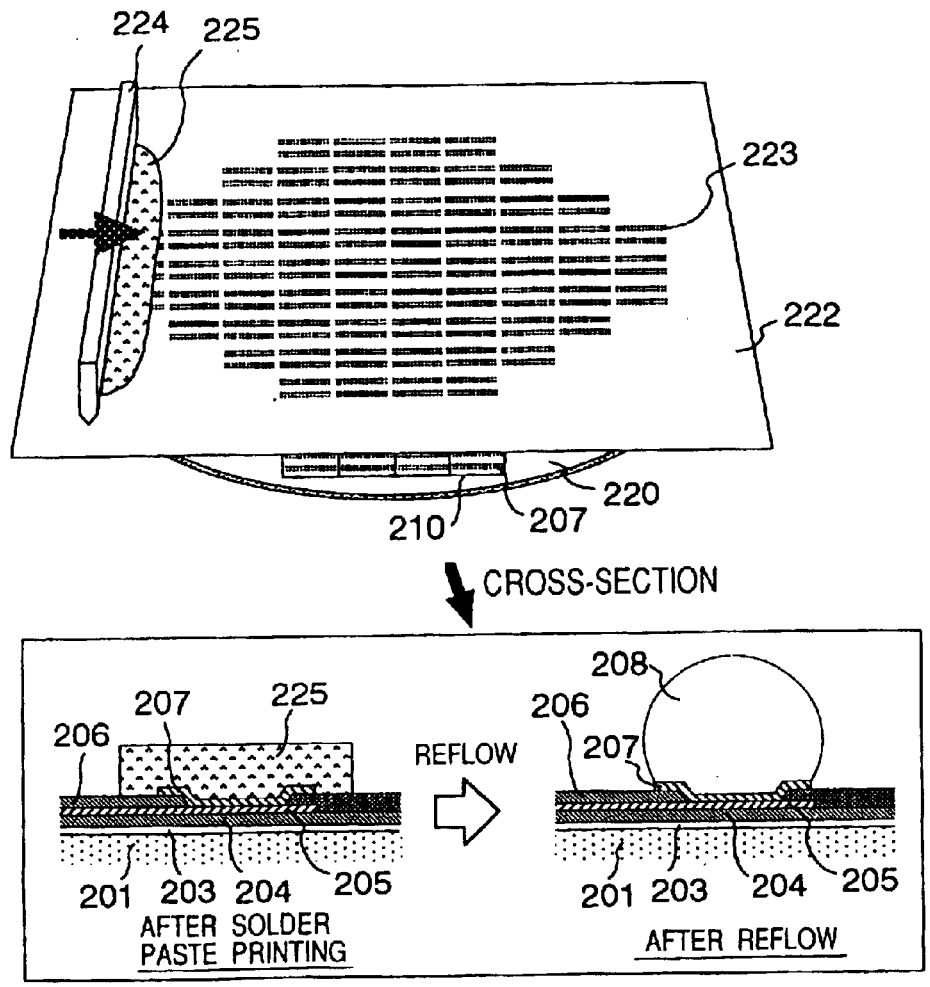
FIG. 56 is a perspective view illustrating a solder bump electrode forming process following FIG. 55.

In any of the respective manufacturing process flows shown in FIG. 58, the solder bump electrode forming S9 are collectively carried out in the wafer stage antecedent to the piece cutting S8 by the method or the like shown in FIG. 56. Thus, the solder bump electrodes can be formed efficiently as compared with the conventional BGA and CSP manufacturing processes for forming the solder bump electrodes every piece chips.

Further, the execution of the three steps of the function selecting S4, probe testing S5 and defect relieving S6 prior to the solder bump electrode forming S7 makes it possible to easily perform probing without protrusions from the solder bumps being taken as obstacles.

The function selecting S4 can also be carried out after the probe testing S5 and the defect relieving S6. However, if the function selecting S4 is executed prior to the probe testing S5, then only a pre-selected function may be tested upon the probe testing S5. It is therefore possible to reduce inspection items and improve inspection efficiency.

The rate of demand between respective types obtained according to the function selecting S4 always changes according to the market situation. Thus, it is desirable to prepare stock in a state prior to the function selection for the purpose of performing flexible support for the demand change and minimizing the amount of stock every types. It is also desirable to cope with a step subsequent to the function selection in as short periods as possible. Owing to the use of an antifuse for function selection, the same relocation wiring patterns can be taken over all the types and the stock can be kept in a state placed immediately before the formation of each bump electrode. Thus, the required types can be manufactured in a short period according to the change in demand, and the amount of the stock can be reduced.

In regard to the manufacturing flows described in FIG. 58, the function selecting S4 based on the program element can be performed after the bump electrode forming S7 contrary to the above. In this case, it is necessary to expose electrodes for respectively applying voltages to program elements on the surface of a semiconductor integrated circuit for the purpose of the function selection in a manner similar to projecting or protruding electrodes. However, since each individual semiconductor integrated circuits can be stocked in a state in which the wafer process has virtually been finished, except for a process attendant on the function selection, stock management is easy.

According to the flip-chip type semiconductor integrated circuit and its manufacturing method described above, the following operations and effects can be obtained.

[1] Since program elements like antifuses 1 are adopted for flip-chip type semiconductor integrated circuits 80 and 100, elicited degradation in reliability is not developed at all owing to the use of laser-fusible fuses as the program elements.

If insulating films 204 and 206 are placed above and below a conductive layer like the relocation wiring 205 where the conductive layer like the relocation wiring 205 is used as a relocation wiring for protruding electrodes 208 with respect to an arrangement of terminals like the pads 202a and 202b, then the state of stress and distortion applied to a semiconductor substrate through each protruding electrode can be relaxed.

In the flip-chip type semiconductor integrated circuit, pad electrodes 209a and 209b capable of being used for testing pads or the like for probe tests can be exposed on the surface thereof. Some pad electrodes 209b lying in the pad electrodes can be used to apply voltages for developing a predetermined potential difference in each program element. In the case of a circuit configuration (corresponding to the circuit comprised of the transistors T9 through T11 shown in FIG. 22) in which the pad electrodes may be kept floating after the program element has been programmed, the protruding electrodes 208 may not be assigned to the pad electrodes 209b. In doing so, the electrodes required to electrically change the state of each program element employed in the flip-chip type semiconductor integrated circuit do not limit the number of protruding electrodes for other applications. On the other hand, in the case of a circuit configuration in which after the a program element has been programmed, pad electrodes must forcedly be set to a ground potential Vss or a source voltage Vcc, protruding electrodes 208 are assigned to pad electrodes 209b, and the protruding electrodes may be connected to power wrings on a wiring board upon substrate implementation.

If the electrode for applying the program voltage is shared between a plurality of program elements where the voltages for developing the predetermined potential difference in the program element like the antifuse 1 are voltages different form normal operating source voltages Vss and Vcc employed in a circuit other than the program element as in the case of Vbb' and VDD, then the number of such external terminals can be reduced.

Since a positive voltage VDD and a negative voltage Vbb' are used to break down an insulating film for the antifuse 1, an absolute value-based voltage with a circuit's ground voltage Vss as the reference can be limited to a substantially normal operating voltage when a breakdown potential difference for the antifuse 1 is obtained.

The program element like the antifuse 1 can be used for defective relief. Further, the program element can be used for function selection of the semiconductor integrated circuit. Thus, the flip-chip type semiconductor integrated circuit can easily obtain versatility equivalent to a bonding option in terms of the function selection or operation mode selection even after the formation of the protruding electrodes. The program element like the antifuse can also be adopted as means for storing trimming information used for selecting a circuit's characteristic.

[2] A method of manufacturing a semiconductor integrated circuit wherein program elements like antifuses 1 are adopted for a flip-chip type semiconductor integrated circuit, includes, in addition to a first step for completing a wafer or the like having conventional bonding-wire connecting bonding pads 202, for example, a second step S7 for forming a plurality of bump electrodes 208 for mounting connections, corresponding to some of the bonding pads 202, a third step S5 for testing or inspecting each circuit formed on the wafer, a fourth step S6 for replacing a defective or faulty portion with a relieving circuit according to the result of inspection by the third step, a fifth step S9 for performing burn-in, and a sixth step S8 for dicing the wafer. Further, the method includes a seventh step S4 for irreversibly changing the state of each of the antifuses 1 to thereby select the function of the circuit. According to the above, the function selection of the semiconductor integrated circuit is allowed without using a by-laser fusible fuse as a program element. Thus, this can contribute to yield enhancement of a flip-chip type semiconductor integrated circuit subjected to the function selection and manufactured, and an improvement in reliability thereof.

The function selection based on the program element can be carried out before the formation of the bump electrodes 208. Namely, the second step S7 is carried out after the seventh step S4. After the formation of the bump electrodes 208, irregularities are formed on the wafer to no small extent. If the function selection is done before the formation of the bump electrodes 208, then the contact of a probe with each pad or terminal for the application of a voltage to the antifuse 1 for function selection is easy and the working efficiency of the function selection can be improved.

Contrary to the above, the function selecting S4 based on the antifuse 1 can be performed after the formation of the bump electrodes 208 (S7). In this case, it is necessary to expose electrodes for respectively applying voltages to antifuses 1 on the surface of a semiconductor integrated circuit for the purpose of the function selection in a manner similar to the bump electrodes 208. However, since each individual semiconductor integrated circuits can be stocked in a state in which the wafer process has virtually been finished, except for a process attendant on the function selection, stock management is easy.

In the fourth step S6 for replacing the defective portion by its corresponding relieving circuit, the replacement can be performed while the state of each antifuse 1 is being irreversibly changed. At this time, the respective steps corresponding to the function selecting S4, inspecting S5 and relieving S6 can be carried out by one circuit probing processing. Namely, the third step, fourth step and seventh step are sequentially performed and respectively include probing processing on the terminals or bump electrodes 208 as needed. If the bump electrodes 208 are formed after the respective steps corresponding to the function selecting S4, inspecting S5 and relieving S6 (S7), then the contact of a probe with each pad or terminal for the application of a voltage to each antifuse is easy and the working efficiency of the inspection and relief can also be improved as well as that of the function selection.

If the bump electrodes 208 are formed according to the second step after the fifth step S9 for performing the burn-in (S7), it is then unnecessary to consider the deformation of each protruding electrode under a high-temperature environment, and hence the burn-in can easily be carried out from its standpoint.

[3] When attention is given to the replacement of a defective portion with a relieving circuit in a flip-chip type semiconductor integrated circuit, a method of manufacturing a semiconductor integrated circuit includes, in addition to a first step for completing a wafer or the like having conventional bonding-wire connecting bonding pads 202, for example, a second step S7 for forming a plurality of bump electrodes 208 for mounting connections, corresponding to some of the bonding pads 202, a third step S5 for testing or inspecting each circuit formed on the wafer, a fourth step S6 for replacing a defective or faulty portion with a relieving circuit according to the result of inspection by the third step, a fifth step S9 for performing burn-in, and a sixth step S8 for dicing the wafer. The fourth step S6 is provided as a step for irreversibly changing the state of each of the antifuses 1 to thereby perform the replacement. In the fourth step, a voltage for developing a predetermined potential difference is applied to the antifuse 1 through a predetermined terminal connected to the antifuse 1, of the plurality of bonding pads 202. According to the above, the defective relief of the semiconductor integrated circuit is allowed without using a by-laser fusible fuse as a program element. Thus, this can contribute to yield enhancement of a flip-chip type semiconductor integrated circuit manufactured under the relief, and an improvement in reliability thereof.

[4] When attention is given to a probe test for a flip-chip type semiconductor integrated circuit, testing pads 209*b* each using a conductive layer such as a relocation wiring layer 205 or an under bump metallurgy layer 297 or the like are provided just above or in the neighborhood of terminals 202*b* like bonding pads, which are not provided with bump electrodes thereat and are used only for probe testing. Namely, the testing pads 209*b* are provided exclusively to the bump electrodes 208. Thus, the layout of the bump electrodes at practical intervals can be facilitated to the fullest extent from the meaning of the mounting thereof to a circuit substrate.

Similar testing pads 209*a* may be provided even with respect to terminals like bonding pads 202*a* at which the bump electrodes 208 are provided.

The probe test is executed by using these testing pads 209*a* and 209*b* or under the combined use of under bump metallurgies 207 antecedent to the formation of the bump electrodes together with the testing pads 209*b*. According to the above, bump electrodes for pads dedicated for probe testing may not be added owing to the use of the testing pads 209*b*. Owing to the addition of the testing pads 209*a* even to the terminals having the bump electrodes 208, a wafer probe test can easily be performed by using the testing pads 209*a* and 209*b* alone.

Further, the use of testing pads 209*a* and 209*b* provided in the neighborhood of the terminals like the bonding pads and smaller in size than the under bump metallurgies enables a probe test to be executed after a relocation wiring process.

Conductive layers like relocation wirings 205, and testing pads are formed on an organic insulating layer 204 such as polyimide or the like. Owing to the provision of the testing pads on the organic insulating layer low in dielectric constant and easy to increase its thickness, the capacitance between each of the testing pads and a semiconductor circuit placed therebelow can be reduced. Since the modulus of elasticity of the organic insulating layer is relatively low, the surface of each testing pad is easy to deform and hence contactability of each probe is enhanced.

Further, an insulating layer 206 is formed on the relocation wiring. An under bump metallurgy 207 and testing pads 209*b* are formed thereon. Thus, the provision of each testing pad on the layered insulating layers 204 and 206 corresponding to the two layers placed above and below the relocation wiring makes it possible to reduce the capacitance between each testing pad and the semiconductor circuit placed therebelow.

[5] In a method of manufacturing a semiconductor integrated circuit having a structure provided with the testing pads, burn-in is performed after the execution of dicing posterior to the formation of bump electrodes. Alternatively, the bump electrodes are formed after burn-in in reverse and dicing may be carried out. In the former, burn-in sockets prepared for a BGA (Ball Grid Array) type semiconductor chip in which external connecting electrodes are mapped in area array form, can be used appropriately in a manner similar to the flip-chip type semiconductor integrated circuit. Alternatively, the arrangement of bump electrodes in area array form is matched with the arrangement of the terminals for the existing burn-in sockets, whereby custom-engineered burn-in sockets may not be prepared newly and burn-in in each chip unit can easily be performed. This also contributes even to a reduction in test cost. In the latter, the burn-in can also be carried out by using testing pads 209a and 209b or testing pads 209b and an under bump metallurgy 207 as well as a probe test. Thus, contacting with each socket under a high temperature makes it possible to prevent the deformation of protruding electrodes like solder bump electrodes.

While the invention made above by the present inventors has been described specifically by the embodiments, the present invention is not limited to the embodiments. It is needless to say that various changes can made thereto within the scope not departing from the substance thereof.

For example, means such as defective relief, function selection, trimming, etc. can be applied even to various memories such as an SRAM, an EEPROM, a flash memory, a programmable logic array using non-volatile storage elements, etc. in addition to a DRAM and a synchronous DRAM, and various logic LSI such as a microcomputer, a microprocessor, etc.

A program element is not limited to an antifuse which undergoes an electrical breakdown by a potential difference. Another electric fuse may be used which is molten by a potential difference so as to fall into a high-resistance state. While the configuration using the selector 3 or the like for the purpose of making an access decision to each relief address for defective relief is shown as one example, various circuit configurations may be adopted. Similarly, the configuration of the antifuse circuit and the configuration of the address comparator can also be changed in various ways. The function selection and the trimming used as an alternative to the bonding option can also be applied to other applications.

The potential difference applied to the program element like the antifuse is not limited to the use of both a negative-polarity voltage and a positive-polarity voltage. Only the voltage having one polarity may be used with a circuit's ground voltage as the reference.

Further, the terminal for inputting the negative voltage like Vbb' is not limited to the terminal dedicated for the fuse program. The input terminal may share the use of a specific external terminal such as an address input terminal. As the shared terminal, the terminal function like the CGND is selected in a program mode, for example.

In the above description, the flip-chip type semiconductor integrated circuit has been configured through the manufacturing process in which the relocation wirings, testing pads and bump electrodes are added to the wire-bonding connecting wafer. The present invention is not limited to such an idea and can undergo a process in which the manufacture of the flip-chip type semiconductor integrated circuit has been planned from the beginning. In this case, bump electrodes like bonding pads may not be provided. Terminals connected to conductive layers like relocation wirings may be laid out.

As the electric fuse, the following ones may be used in addition to a configuration in which a resistance value at both ends (current path or channel) of an electric fuse increases according to the application of a predetermined voltage to both ends thereof and a configuration in which it decreases in reverse. Namely, the electric fuse may be comprised of an element capable of reversibly holding information. For example, an EEPROM, an FRAM, a flash memory or the like may constitute the electric fuse. Alternatively, the electric fuse may be comprised of a one-time writable ROM or EEPROM.

INDUSTRIAL APPLICABILITY

The present invention can widely be applied to various semiconductor integrated circuits such as a DRAM or system LSI wherein a semiconductor substrate is provided with protruding electrodes such as solder bumps for the implementation of a circuit substrate.

What is claimed is:

1. A semiconductor integrated circuit device comprising:

a semiconductor substrate;

a plurality of circuit elements formed in an element forming layer on said semiconductor substrate;

a plurality of first and second terminals formed on the surface of said element forming layer and connected to predetermined ones of said circuit elements;

a plurality of conductive layers which are respectively connected to said first terminals and extending on said element forming layer;

protruding electrodes respectively connected to said conductive layers;

testing pads respectively connected to said second terminals, said testing pads being not coupled to any protruding electrode; and an insulating film which covers the surfaces of said protruding electrodes and said testing pads so as to expose said protruding electrodes and said testing pads.

2. A semiconductor integrated circuit device comprising:

a semiconductor substrate;

a plurality of circuit elements formed in an element forming layer on said semiconductor substrate;

first and second terminals formed on the surface of said element forming layer and connected to predetermined ones of said circuit elements;

a conductive layer which is connected to said first terminal;

a protruding electrode connected to said conductive layer;

a testing pad connected to said second terminal, said testing pad being not coupled to any protruding electrode; and an insulating film which covers the surfaces of said protruding electrode and said testing pad so as to expose said protruding electrode and said testing pad.

3. The semiconductor integrated circuit device according to claim 1, wherein said conductive layers are metal wirings, said insulating film is formed on said each metal wiring, and an insulating film is further formed below said each metal wiring.

4. The semiconductor integrated circuit device according to claim 3, wherein said insulating film and said further insulating film are respectively formed of different materials, and said insulating film is formed of a material higher in elastic modulus than said further insulating film.

5. The semiconductor integrated circuit device according to claim 3, wherein said insulating film is a film which contains an organic substance.

6. The semiconductor integrated circuit device according to claim 5, wherein the film containing the organic substance is a polyimide film, a fluorocarbon resin film, or an elastomer film which contains a silicon or acrylic rubber material.

7. The semiconductor integrated circuit device according to claim 1, wherein said testing pads are placed just above said terminals corresponding thereto.

8. The semiconductor integrated circuit device according to claim 7, wherein said testing pads are regularly placed in the central portion of said semiconductor substrate, and said protruding electrodes are regularly placed outside said testing pads respectively.

9. The semiconductor integrated circuit device according to claim 3, wherein said testing pads extend on said further insulating film.

10. A semiconductor integrated circuit device comprising:
a semiconductor substrate;
a first circuit element and a second circuit element formed on said semiconductor substrate;
a wiring formed over said semiconductor substrate and connected to said first circuit element;
a bump formed over said wiring and connected thereto; and
a conductive layer, which is formed over said semiconductor substrate and connected to said second circuit element and which constitutes a testing pad,
wherein said conductive layer is electrically isolated from any bump.

11. A semiconductor integrated circuit device comprising:
a semiconductor substrate;
a semiconductor integrated circuit element formed in said semiconductor substrate;
a wiring formed on said semiconductor substrate and connected to said semiconductor integrated circuit element;
a bump formed on said wiring and connected thereto; and
a conductive layer, which is formed on said semiconductor substrate and connected to said semiconductor integrated circuit element and which constitutes a testing pad which is electrically isolated from any bump,
wherein when said semiconductor integrated circuit element is tested, said testing pad is electrically connected to the outside of said semiconductor integrated circuit device, and
when said semiconductor integrated circuit element is in normal operation, said testing pad is electrically disconnected from the outside of said semiconductor integrated circuit device.

12. A semiconductor integrated circuit device comprising:
a semiconductor substrate;
integrated circuit elements formed on said semiconductor substrate;
a plurality of wirings formed on said semiconductor substrate and connected to said integrated circuit elements;
a plurality of bumps formed on said plurality of wirings and provided in association with said plurality of wirings;

a conductive layer, which is formed on said semiconductor substrate and connected to said integrated circuit elements and which is formed as a testing pad which is electrically isolated from any bump; and
an organic film placed on said semiconductor substrate and formed below said plurality of wirings,
wherein when said each integrated circuit element is tested, each said testing pad is electrically connected to the outside of said semiconductor integrated circuit device, and
when each said integrated circuit element is in normal operation, each said testing pad is electrically disconnected from the outside of said semiconductor integrated circuit device.

13. A semiconductor integrated circuit device comprising:
a semiconductor substrate;
a first circuit element and a second circuit element formed on said semiconductor substrate;
a wiring formed on said semiconductor substrate and connected to said first circuit element;
a bump formed on said wiring and connected thereto;
a first conductive material, which is formed on said semiconductor substrate and connected to said first circuit element and which constitutes a first testing pad; and
a second conductive material, which is formed on said semiconductor substrate and connected to said second circuit element and which constitutes a second testing pad which is not connected to any bump,
wherein when said first circuit element and said second circuit element are tested, said first testing pad and said second testing pad are electrically connected to the outside of said semiconductor integrated circuit device, and
when said first circuit element and said second circuit element are in normal operation, said first testing pad is electrically connected to the outside of said semiconductor integrated circuit device through said bump, and said second testing pad is electrically disconnected from the outside of said semiconductor integrated circuit device.

14. A semiconductor integrated circuit device comprising:
a semiconductor substrate;
an integrated circuit formed on said semiconductor substrate;
a wiring formed on said semiconductor substrate and connected to said integrated circuit;
a bump formed on said wiring and connected thereto;
a first conductive layer, which is formed on said semiconductor substrate and connected to said integrated circuit and which constitutes a first testing pad; and
a second conductive layer, which is formed on said semiconductor substrate and connected to said integrated circuit and which constitutes a second testing pad which is not connected to any bump,
wherein said first conductive layer and said wiring are connected to each other, and
when said integrated circuit is tested, said first testing pad and said second testing pad are electrically connected to the outside of said semiconductor integrated circuit device and
when said integrated circuit is in normal operation, said first testing pad is electrically connected to the outside of said semiconductor integrated circuit device and said second testing pad is electrically isolated from the outside of said semiconductor integrated circuit device.

15. A semiconductor integrated circuit device comprising:

a semiconductor substrate;

integrated circuit elements formed on said semiconductor substrate;

a plurality of wirings formed over said semiconductor substrate and connected to at least one of said integrated circuit elements;

a plurality of bumps formed over said plurality of wirings and provided in association with said plurality of wirings;

a conductive layer, which is formed over said semiconductor substrate and connected to at least one of said integrated circuit elements and which constitutes a test pad which is not connected to any bump; and a film containing an organic material formed between said semiconductor substrate and said plurality of wirings and between said semiconductor substrate and said conductive layer, wherein when said integrated circuit element is tested, said test pad is electrically connected to the outside of said semiconductor integrated circuit device, and when said integrated circuit element is in normal operation, said test pad is electrically disconnected from the outside of said semiconductor integrated circuit device.

* * * * *